United States Patent
Eto et al.

(10) Patent No.: US 6,377,101 B1
(45) Date of Patent: *Apr. 23, 2002

(54) VARIABLE DELAY CIRCUIT AND SEMICONDUCTOR INTEGRATED CIRCUIT DEVICE

(75) Inventors: Satoshi Eto; Masao Taguchi; Masato Matsumiya; Toshikazu Nakamura; Masato Takita, all of Kawasaki; Mitsuhiro Higashiho, Kasugai; Toru Koga, Kawasaki; Hideki Kano, Kawasaki; Ayako Kitamoto, Kawasaki; Kuninori Kawabata, Kawasaki; Koichi Nishimura, Kawasaki; Yoshinori Okajima, Kawasaki, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/510,299

(22) Filed: Feb. 22, 2000

Related U.S. Application Data

(62) Division of application No. 08/934,783, filed on Sep. 22, 1997, now Pat. No. 6,049,239.

(30) Foreign Application Priority Data

| Dec. 27, 1996 | (JP) | 8-349286 |
| Jan. 20, 1997 | (JP) | 9-008012 |
| Jan. 31, 1997 | (JP) | 9-019213 |
| May 16, 1997 | (JP) | 9-127586 |

(51) Int. Cl.$^7$ ................................. H03H 11/26
(52) U.S. Cl. ................. 327/270; 327/269; 327/272
(58) Field of Search ................. 327/269, 270, 327/271, 272, 276, 277, 278, 284, 285

(56) References Cited

U.S. PATENT DOCUMENTS

| 5,552,726 A | 9/1996 | Wichman et al. | 327/149 |
| 5,570,054 A | 10/1996 | Takla | 327/158 |
| 5,670,903 A | 9/1997 | Mizuno | 327/158 |
| 5,699,033 A | * 12/1997 | Saeki | 327/261 |
| 5,901,190 A | * 5/1999 | Lee | 5/373 |

FOREIGN PATENT DOCUMENTS

| KR | 97-51253 | 7/1997 |

OTHER PUBLICATIONS

"Skew Minimization Techniques for 256M–bit Synchronous DRAM and beyond", Han et al, 1996 Symposium on VLSI Circuits Digest of Technical Papers, pp. 192–193.

* cited by examiner

Primary Examiner—My-Trang Nu Ton
Assistant Examiner—Hiep Nguyen
(74) Attorney, Agent, or Firm—Arent Fox Kintner Plotkin & Kahn, PLLC

(57) ABSTRACT

A variable delay circuit includes a first gate having a first delay amount, and a second gate having a second delay amount greater than the first delay amount. A difference between the first delay amount and the second delay time is less than the first delay amount.

9 Claims, 42 Drawing Sheets

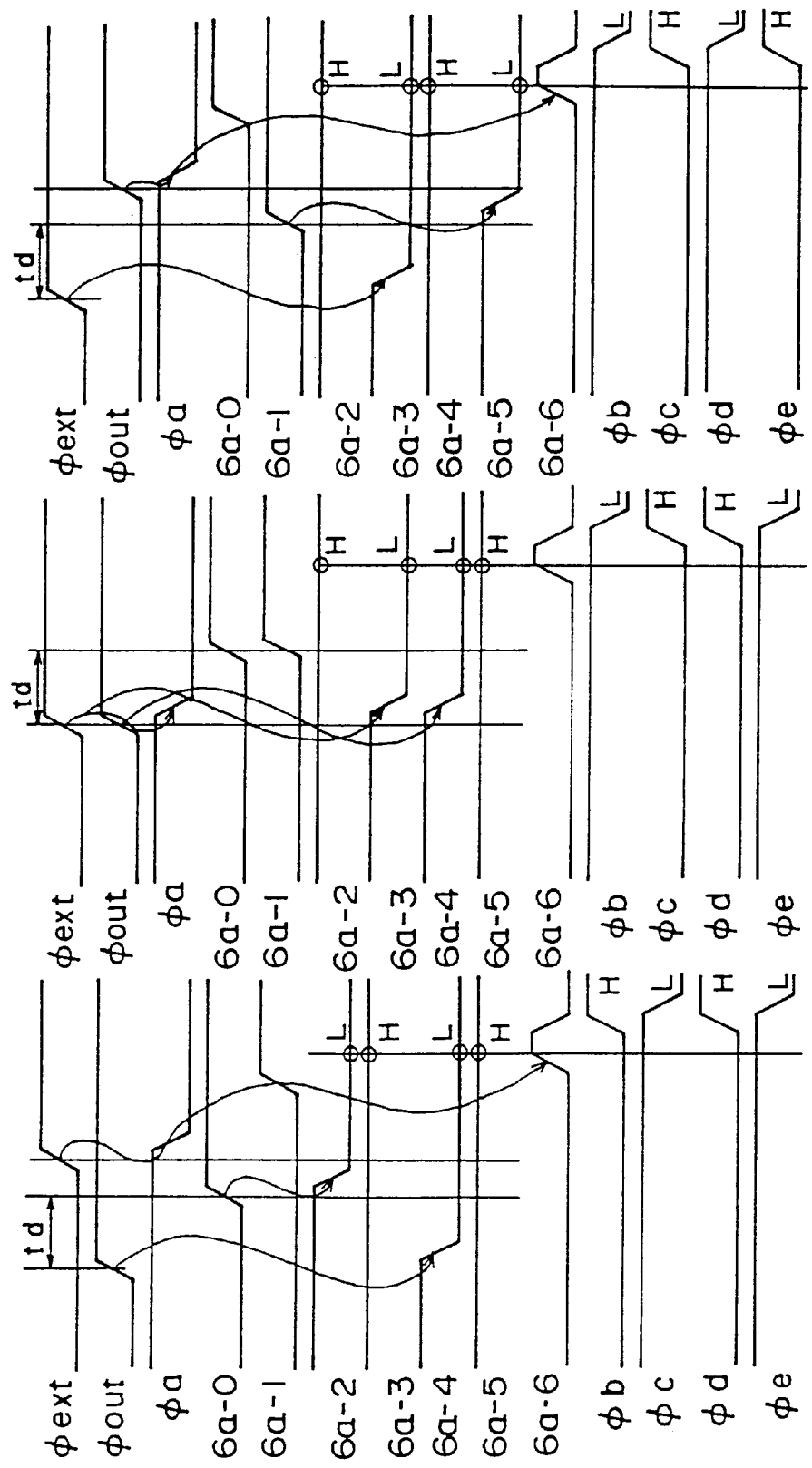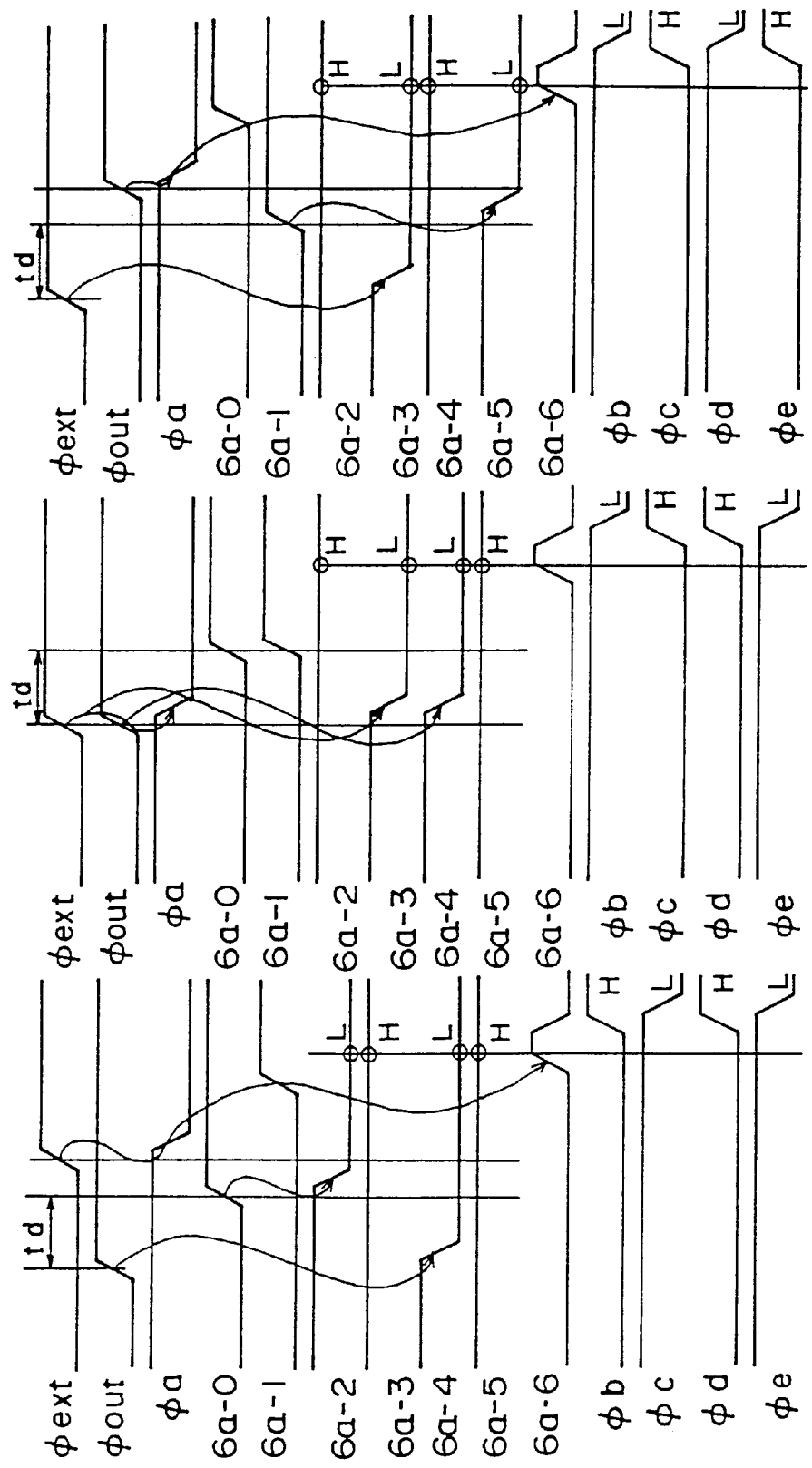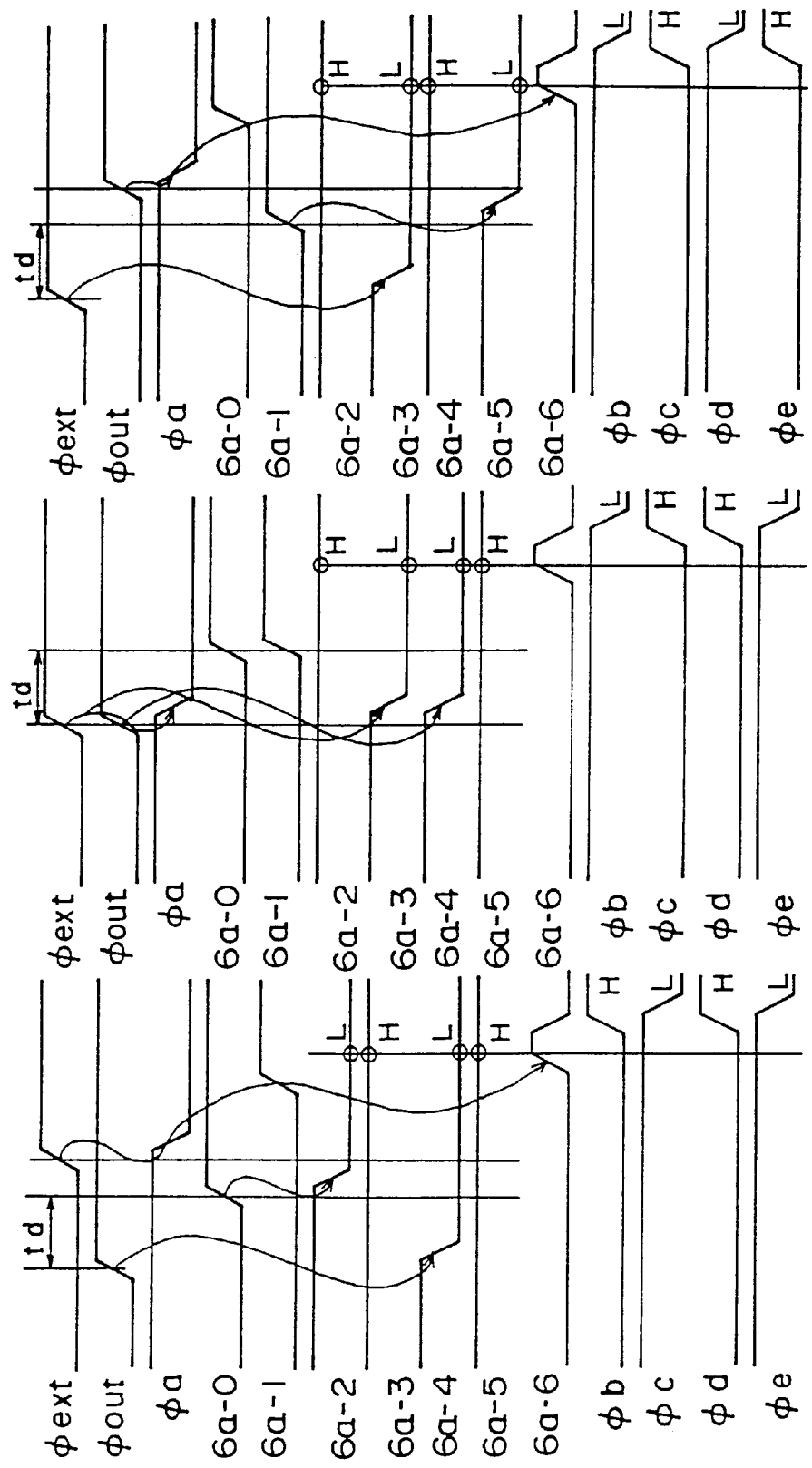

VARIABLE DELAY CIRCUIT AND SEMICONDUCTOR INTEGRATED CIRCUIT DEVICE

This application is a division application filed under 37 CFR §1.53(b) of parent application Ser. No. 08/934,783, filed Sep. 22, 1997, now U.S. Pat. No. 6,049,239.

BACKGROUND OF THE INVENTION

1. Field of the Invention

The present invention relates to a variable delay circuit such as a digital DLL (Delayed Locked Loop) circuit, and a semiconductor integrated circuit device equipped with such as a DLL circuit.

Recently, there has been considerable advance of the operation speed and integration density of semiconductor integrated circuit devices. Under the above situation, it is required to provide a clock signal synchronized with an external clock signal to a given circuit. More particularly, a synchronous DRAM device (hereinafter simply referred to as an SDRAM device) is required to supply a clock signal synchronized with an external clock signal to output buffer circuits. Such a clock signal can be obtained through a DLL circuit, which receives the external clock signal. As the frequency of the DLL circuit is increased, the DLL circuit is required to be configured with higher precision. In order to meet the above requirement, the DLL circuit should be equipped with a variable delay circuit having high precision.

2. Description of the Related Art

FIG. 1 is a block diagram of a conventional variable delay circuit. The circuit shown in FIG. 1 includes a plurality of delay elements, for example, 10 delay elements G1 through G10, which are connected in series. Hereinafter, the delay elements G1 through G10 are referred to as gates. Each of the gates G1 through G10 has a unit delay time td. The inputs of the gates G1 through G10 are operably connected to an input node IN through switches SW1 through SW10, respectively. The output of the gate G10 is connected to an output node OUT.

The ON/OFF of the switches SW1 through SW10 are controlled by a control circuit, which is not shown in FIG. 1. The control circuit closes one of the switches SW1 through SW10 in accordance to a necessary delay time. In FIG. 1, only the switch SW7 is closed. A signal applied to the input node IN passes through four gates G7 through G10 and is thus delayed by 4 td. That is, the output signal obtained at the output node OUT lags behind the input signal applied to the input node IN by 4 td. The variable delay circuit is capable of defining the delay time between td and 10 td by selecting one of the switches SW1 through SW10.

It should be noted that the variable delay circuit shown in FIG. 1 can provide the delay times equal to an integer multiple of the unit delay time td. In other words, the variable delay circuit shown in FIG. 1 cannot define the delay time at a precision (step) less than the unit delay time td. For example, the circuit cannot define a delay time of 2.5 td.

If a semiconductor integrated circuit device such as an SDRAM device operates at a relatively low operation frequency, the conventional delay circuit shown in FIG. 1 can be equipped with the device. The digital DLL circuit built in the SDRAM device produces an internal clock signal synchronized the external clock signal. Hence, an influence of a clock signal line formed on the SDRAM device can be eliminated from the internal clock signal, and data can be output to the outside of the device in synchronism with the external clock signal. However, if the SDRAM device is required to operate at a frequency as high as 100 MHz, the DLL circuit which should be mounted on the SDRAM device is required to have a capability of finer delay control.

As has been described previously, the digital DLL circuit has a delay circuit made up of a plurality of gates (unit delay circuits) connected in series, the gates being formed of logic gates. Usually, the unit delay circuit has a minimum delay time approximately equal to 200 ps. In order to realize the SDRAM device which operates at an operation frequency equal to or higher than 100 MHz, the digital DLL circuit is required to realize a fine delay control in which a delay time less than 200 ps can be controlled. In principle, the precision of the delay control can be improved by using a unit delay circuit having a delay time less than 200 ps.

However, the DLL circuit employing such a fine unit delay circuit requires a large number of unit delay elements in order to ensure a certain delay time. In this case, an increased circuit scale should be realized on the chip.

SUMMARY OF THE INVENTION

It is an object of the present invention to provide a novel and useful variable delay circuit capable of controlling the delay time with a high precision.

Another object of the present invention is to provide a compact variable delay circuit which can be configured without an increase in the circuit scale.

A further object of the present invention is to provide a semiconductor integrated circuit device equipped with a variable delay circuit as described above.

The above objects of the present invention are achieved by a variable delay circuit comprising: a first gate having a first delay amount; and a second gate having a second delay amount greater than the first delay amount, a difference between the first delay amount and the second delay time being less than the first delay amount.

The above objects of the present invention are also achieved by a variable delay circuit comprising: a first gate line which has first gates cascaded via intermediate nodes and receives an input signal; a second gate line which has second gates cascaded via intermediate nodes, the second gates having a delay amount different from that of the first gates; and switches respectively connecting the intermediate nodes of the first gate line and those of the second gate line. One of the switches is closed to connect the first gate line and the second gate line together so that the input signal applied to the first gate line passes through a part of the first gate line, the one of the switches, and a part of the second gate line.

The above variable delay circuit may be configured so that: the first gate line includes n first gates; and each of the second gates has the following delay amount:

$$[(n+1)/n]td$$

where td denotes the delay time of each of the first gates.

The above objects of the present invention are also achieved by a variable delay circuit comprising: a first gate line which has first gates cascaded via intermediate nodes and receives an input signal; a second gate line which has second gates cascaded via intermediate nodes; and switches respectively connecting the intermediate nodes of the first gate line and those of the second gate line. One of the switches is closed to connect the first gate line and the second gate line together so that the input signal applied to the first gate line passes through a part of the first gate line, the one of the switches, and a part of the second gate line, the intermediate nodes of the first gate line having a wiring load different from that of the intermediate nodes of the second gate line.

The above objects of the present invention are also achieved by a variable delay circuit comprising: a first gate line which has first gates cascaded via intermediate nodes and receives an input signal; a second gate line which has second gates cascaded via intermediate nodes, the second gates having a delay amount different from that of the first gates; switches respectively connecting the intermediate nodes of the first gate line and those of the second gate line; and a control circuit which turns ON one of the switches being closed to connect the first gate line and the second gate line together so that an output signal obtained by causing the input signal applied to the first gate line to pass through a part of the first gate line, the one of the switches, and a part of the second gate line and the input signal have a given phase difference.

The above objects of the present invention are also achieved by a variable delay circuit comprising: a first gate line which has first gates cascaded via intermediate nodes and receives an input signal; a second gate line which has second gates cascaded via intermediate nodes, the intermediate nodes of the first gate line having a wiring load different from that of the intermediate nodes of the second gate line; switches respectively connecting the intermediate nodes of the first gate line and those of the second gate line; and a control circuit which turns ON one of the switches being closed to connect the first gate line and the second gate line together so that an output signal obtained by causing the input signal applied to the first gate line to pass through a part of the first gate line, the one of the switches, and a part of the second gate line and the input signal have a given phase difference.

The above variable delay circuit may be configured so that the control circuit comprises: a third gate line which has third gates cascaded and receives the input signal; a fourth gate line which has fourth gates cascaded and receives the output signal; phase comparators which are provided between the intermediate nodes of the third gate line and those of the fourth gate line and compare the phases of the input signal and the output signal with each other at the intermediate nodes; and logic gates each receiving output signals of two adjacent phase comparators among the phase comparators. The switches are controlled by respective output signals of the logic gates.

The above variable delay circuit may be configured so that each of the phase comparators comprises: a first flip-flop connected to one of the intermediate nodes of the third gate line and one of the intermediate nodes of the fourth gate line; a second flip-flop which outputs the output signal of the phase comparator to the corresponding one of the logic gates; and a gate circuit which is provided between the first and second flip-flops and supplies output signals of the first flip-flop to the second flip-flop with a delay.

The above variable delay circuit may be configured so that the control circuit comprises: a third gate line which has third gates cascaded and receives the input signal; a fourth gate line which has fourth gates cascaded and receives the output signal; phase comparators which are provided between the intermediate nodes of the third gate line and those of the fourth gate line and compare the phases of the input signal and the output signal with each other at the intermediate nodes; and logic gates each receiving output signals of two adjacent phase comparators among the phase comparators. The switches are controlled by respective output signals of the logic gates.

The above variable delay circuit may be configured so that each of the phase comparators comprises: a first flip-flop connected to one of the intermediate nodes of the third gate line and one of the intermediate nodes of the fourth gate line; a second flip-flop which outputs the output signal of the phase comparator to the corresponding one of the logic gates; and a gate circuit which is provided between the first and second flip-flops and supplies output signals of the first flip-flop to the second flip-flop with a delay.

The above objects of the present invention are also achieved by a semiconductor integrated circuit device comprising: a first DLL (Delayed Locked Loop) circuit which delays an input signal; and a second DLL circuit which has a precision higher than that of the first DLL circuit, the first DLL circuit performing a phase control operation independently of that of the second DLL circuit, a delay amount control of the second DLL circuit depending on that of the first DLL circuit, and the input signal being delayed by the first and second DLL circuits so that an output signal thus obtained has a given phase relationship with the input signal.

The above semiconductor integrated circuit device may be configured so that: the second DLL circuit is in a reset state when the first DLL circuit performs the delay amount control; and the second DLL circuit performs the delay amount control when the input signal and the output signal are pulled in phase by the first DLL circuit.

The above semiconductor integrated circuit device may be configured so that: when the first DLL circuit has a precision td, the second DLL circuit can control a delay amount including a range of ±td; and when the input signal and the output signal have a phase difference exceeding the range ±td in the first DLL, the first DLL circuit outputs a reset signal to the second DLL circuit so that the second DLL circuit is caused to have a predetermined delay amount.

The above semiconductor integrated circuit device may be configured so that the predetermined delay amount of the second DLL circuit is equal to half of a variable delay amount range of the second DLL circuit.

The above semiconductor integrated circuit device may be configured so that: each of the first and second DLL circuits has first and second routes through which the input signal passes; and the second routes of the first and second DLL circuits are dummy delay circuits which provide the same delay amounts as those of the first routes of the first and second DLL circuits.

The above semiconductor integrated circuit device may be configured so that: the second DLL circuit includes first and second delay elements having mutually different delay amounts; and a difference between the delay amounts of the first and second delay elements corresponds to a precision of the second DLL circuit.

The above semiconductor integrated circuit device may be configured so that: the first DLL circuit includes first and second flip-flops; the first flip-flop has a set terminal which receives a delayed version of a first clock signal related to the input signal obtained through a first delay element and a reset terminal which receives a second clock signal related to the output signal; the second flip-flop has a set terminal which receives a delayed version of the second clock signal obtained through a second delay element and a reset terminal which receives the first clock signal; and output signals of the first and second flip-flops indicating a result of a phase comparing operation for the phase control operation.

The above semiconductor integrated circuit device may be configured so that: each of the first and second flip-flops has first and second NAND gates; the first NAND gate has a first input terminal which serves as the set terminal, a second input terminal, and an output terminal; and the second NAND gate has a first input terminal which serves as the reset terminal, a second input terminal which is connected to the output terminal of the first NAND gate and forms an output terminal Q, and an output terminal which is connected to the second input terminal of the first NAND gate and forms an output terminal /Q.

The above semiconductor integrated circuit device may be configured so that: each of the first and second flip-flops has first and second NAND gates; the first NAND gate has a first input terminal, a second input terminal which serves as the set terminal, and an output terminal; and the second NAND gate has a first input terminal which is connected to the output terminal of the first NAND gate and forms an output terminal /Q, a second input terminal which serves as the reset terminal, and an output terminal which is connected to the first input terminal of the first NAND gate and forms an output terminal Q.

The above semiconductor integrated circuit device may be configured so that: each of the first and second NAND gates has first and second P-channel transistors and first and second N-channel transistors; the first P-channel transistor has a source connected to a first power source, a gate connected to a first input terminal, and a drain connected to an output terminal; the second P-channel transistor has a source connected to the first power source, a gate connected to a second input terminal, and a drain connected to the output terminal; the first N-channel transistor has a source connected to a drain of the second N-channel transistor, a gate connected to the first input terminal, and a drain connected to the output terminal; and the second N-channel transistor has a source connected to the second power source, a gate connected to the second input terminal, and the drain.

The above semiconductor integrated circuit device may be configured so that: each of the first and second NAND gates has first and second P-channel transistors and first and second N-channel transistors; the first P-channel transistor has a source connected to a first power source, a gate connected to a first input terminal, and a drain connected to an output terminal; the second P-channel transistor has a source connected to the first power source, a gate connected to a second input terminal, and a drain connected to the output terminal; the first N-channel transistor has a source connected to a drain of the second N-channel transistor, a gate connected to the first input terminal, and a drain connected to the output terminal; and the second N-channel transistor has a source connected to the second power source, a gate connected to the second input terminal, and the drain.

The above semiconductor integrated circuit device may be configured so that the first and second delay elements have a circuit configuration identical to that of one stage of the first DLL circuit.

The above semiconductor integrated circuit device may be configured so that the first and second DLL circuits have respective delay circuits which are formed by a combination of logic elements.

The above semiconductor integrated circuit device may be configured so that: the first and second delay elements are formed by logic elements; and the first delay element has a fan-out different from that of the second delay element.

The above semiconductor integrated circuit device may be configured so that: the first and second delay elements are formed by logic elements; and the first delay element is supplied with a power supply voltage different from that supplied to the second delay element.

The above semiconductor integrated circuit device may be configured so that the second DLL circuit comprises a delay circuit which includes at least one of a capacitance and a resistance.

The above semiconductor integrated circuit device may be configured so that the second DLL circuit comprises a delay circuit which includes a variable capacitance which is controlled so that the given phase relationship can be obtained.

The above semiconductor integrated circuit device may be configured so that the second DLL circuit comprises a delay circuit which includes a variable resistance which is controlled so that the given phase relationship can be obtained.

The above semiconductor integrated circuit device may be configured so that the second DLL circuit comprises a delay circuit which includes a capacitance and resistance which are controlled so that the given phase relationship can be obtained.

The above semiconductor integrated circuit device may be configured so that: the second DLL circuit includes a delay circuit having a shift register; and the predetermined delay amount of the second DLL circuit corresponds to a center position of the shift register.

The above semiconductor integrated circuit device may be configured so that the first and second delay elements include at least one of a capacitance and a resistance.

The above semiconductor integrated circuit device may be configured so that the first and second delay elements comprise a variable capacitance which is controlled so that the given phase relationship can be obtained.

The above semiconductor integrated circuit device may be configured so that the first and second delay elements comprise a delay circuit which includes a variable resistance which is controlled so that the given phase relationship can be obtained.

The above semiconductor integrated circuit device may be configured so that the first and second delay elements comprise a delay circuit which includes a capacitance and resistance which are controlled so that the given phase relationship can be obtained.

The above semiconductor integrated circuit device may be configured so that: the first and second DLL circuits comprise respective delay circuits; and the delay circuit of the second DLL circuit has a variable range exceeding that defined by the precision of the delay circuit of the first DLL circuit.

The aforementioned objects of the present invention are achieved by a semiconductor integrated circuit device comprising: a first DLL (Delayed Locked Loop) circuit which delays an input signal; and a second DLL circuit which has a precision higher than that of the first DLL circuit, the second DLL circuit operating independently of the first DLL circuit, the input signal being delayed by the first and second DLL circuits so that an output signal thus obtained has a given phase relationship with the input signal.

The above semiconductor integrated circuit device may be configured so that: the first DLL circuit comprises a first controller which performs a delay control so that the input and output signals have the given phase relationship with the precision of the first DLL circuit; and the second DLL circuit comprises a second controller which performs a delay control so that the input and output signals have the given phase relationship with the precision of the second DLL circuit.

The above semiconductor integrated circuit device may be configured so that the second DLL circuit comprises: a comparator which determines whether the phase difference between the input signal and the output signal corresponds to one of n predetermined phase differences where n is an integer; and a delay circuit which has a delay amount corresponding to the one of the n predetermined phase differences.

The above semiconductor integrated circuit device may be configured so that the delay circuit comprises a circuit which provides delay amounts which respectively correspond to the n predetermined phase differences.

The above semiconductor integrated circuit device may be configured so that: the comparator comprises n delay circuits which have respective delay amounts corresponding to the n phase differences; and the input signal is compared with output signals of the n delay circuits.

The above semiconductor integrated circuit device may be configured so that the second DLL circuit is provided at an output side of the first DLL circuit.

The above semiconductor integrated circuit device may be configured so that the delay circuit comprises delay parts having different delay amounts, each of the delay parts having at least one of a capacitance and a resistance.

The above semiconductor integrated circuit device may be configured so that the delay circuit comprises delay parts having different delay amounts, the delay parts including respective logic elements having mutually different delay amounts.

The above semiconductor integrated circuit device may further comprise a memory array, wherein data read from the memory array can be output to an external circuit in synchronism with the output signal.

The above semiconductor integrated circuit device may further comprise a memory array, wherein data read from the memory array can be output to an external circuit in synchronism with the output signal.

It is another object of the present invention to provide a phase comparator circuit comprising: a first flip-flop which is supplied with first and second signals and makes a decision whether the first signal leads to the second signal; a first delay circuit which delays the first signal by a first delay amount; a second delay circuit which delays the second signal by a second delay amount different from the first delay amount; and a second flip-flop which is supplied with an output signal of the first delay circuit and an output signal of the second delay circuit and makes a decision whether the output signal of the first delay circuit leads to the output signal of the second delay circuit.

BRIEF DESCRIPTION OF THE DRAWINGS

Another objects, features and advantages of the present invention will become more apparent from the following detailed description when read in conjunction with the accompanying drawings, in which:

FIGS. 17A, 17B and 17C are diagrams of an operation of the phase comparator part shown in FIG. 16;

DESCRIPTION OF THE PREFERRED EMBODIMENTS

Figure 2:
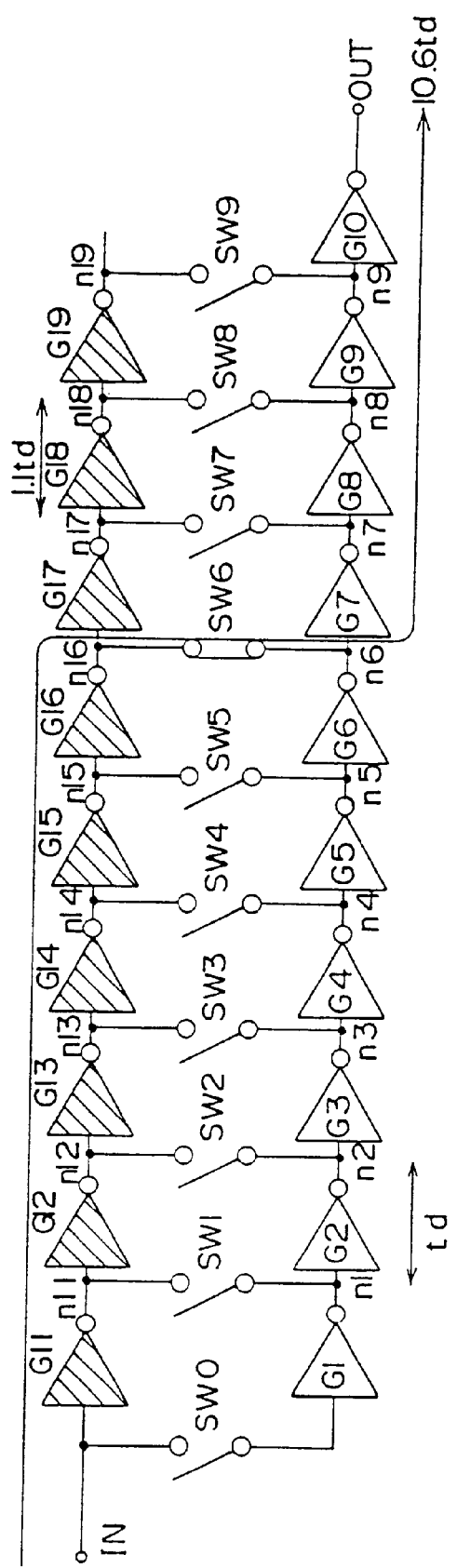
FIG. 2 is a block diagram of a variable delay circuit configured according to the principle of the present invention.

FIG. 2 is a block diagram of a variable delay circuit which is configured in accordance with the present invention. The variable delay circuit shown in FIG. 2 includes 10 gates (unit delay elements or circuits) G1 through G10, each having the unit delay time td. Further, the variable delay circuit shown in FIG. 2 includes 9 gates G11 through G19 connected in series. Each of the gates G11 through G11 has a delay time loner than the delay time td of the gates G1 through G10. The delay time of the gates G11 through G19 is equal to, for example, 1.1 td. The difference between the delay time of the gates G1–G5 and that of the gates G11–G15 is less than the shorter delay time, that is, the delay time of the gates G1–G5.

Further, the variable delay circuit shown in FIG. 2 has 10 switches SW0 through SW9. The switch SW0 is provided between the input node IN and the gate G1. The switches SW1 through SW9 are provided intermediate nodes n11–n19 and intermediate nodes n1–n9, respectively. The gates G1 through G10 connected in series form a first gate line, and the gates G11 through G19 connected in serial form a second gate line. The gates G1 through G19 can be formed of logic elements such as inverters.

An input signal is applied to the input node IN, and is delayed by a selected delay time. An output signal thus delayed is obtained via the output node OUT.

The ON/OFF control of the 10 switches SW0 through SW9 is carried out by a control circuit, which is not shown in FIG. 2 for the sake of simplicity. The control circuit closes one of the switches SW0 through SW9 in accordance with the requited delay time.

In FIG. 2, only the switch SW6 is closed. In this case, the input signal applied to the input node IN passes through gates G11, G12, G13, G14, G16, G16, G7, G8, G9 and G10 in this sequence, and is applied to the output node OUT. Hence, a delay time of 10.6 td can be obtained as follows:

6×1.1 td+4×td=10.6 td.

Figure 1:
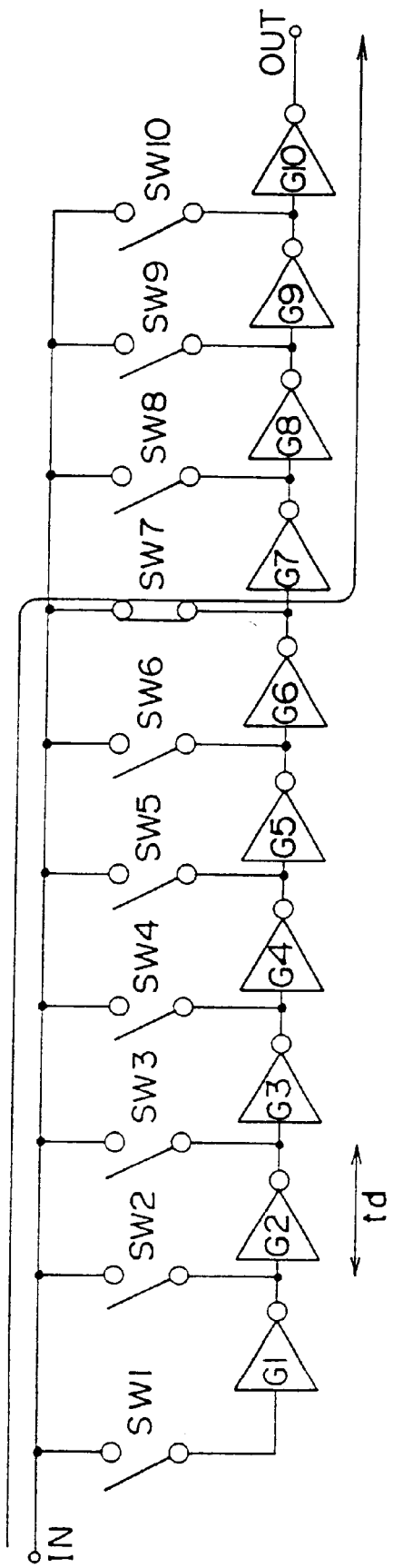
FIG. 1 is a block diagram of a conventional variable delay circuit.

If only the switch SW0 is closed, a delay time of 10 td can be obtained. If only the switch SW1 is closed, a delay time of 10.1 td can be obtained. In this manner, the variable delay circuit shown in FIG. 2 can define the variable delay time between 10 td and 10.9 td with a precision of 0.1 td, and thus has a precision that is ten times that of the circuit shown in FIG. 1.

The first gate line is not limited to 10 gates, but is equipped with an arbitrary number of gates. In general, when the first gate line is made up of n gates (n is an integer), the second gate line is equipped with gates, each having a delay time equal to (n+1)/n·td.

Various modifications of the circuit shown in FIG. 2 can be made. For example, four gates each having a delay time 2.2 td can be employed instead of the gates G11 through G19. Switches are provided to the outputs of the four gates. In this case, the variable delay circuit has the variable delay between 10 td and 10.8 td with a precision of 0.2 td.

As has been described, the gate G11 has a longer delay time than the gate G1, and has 1.1 times the delay time of the gate G1. The delay time of each gate can be adjusted in various manners. For example, if the gates G1–G19 have a CMOS structure, the P-channel MOS transistor and the N-channel MOS transistor are formed so as to have a mutually different size (one of the channel length and the channel width). In another manner, a capacitor or a resistor is coupled to the output of each gate so that a longer unit delay time can be obtained.

The switches SW0 through SW9 can be formed of MOS transistors. In this case, the transistors can be turned ON and OFF by controlling the gate potentials thereof.

A description will now be given of an embodiment of the present invention in which the variable delay circuit shown in FIG. 2 is applied to a phase synchronizing circuit which can produce an internal clock signal synchronized with the external clock signal.

Figure 3:
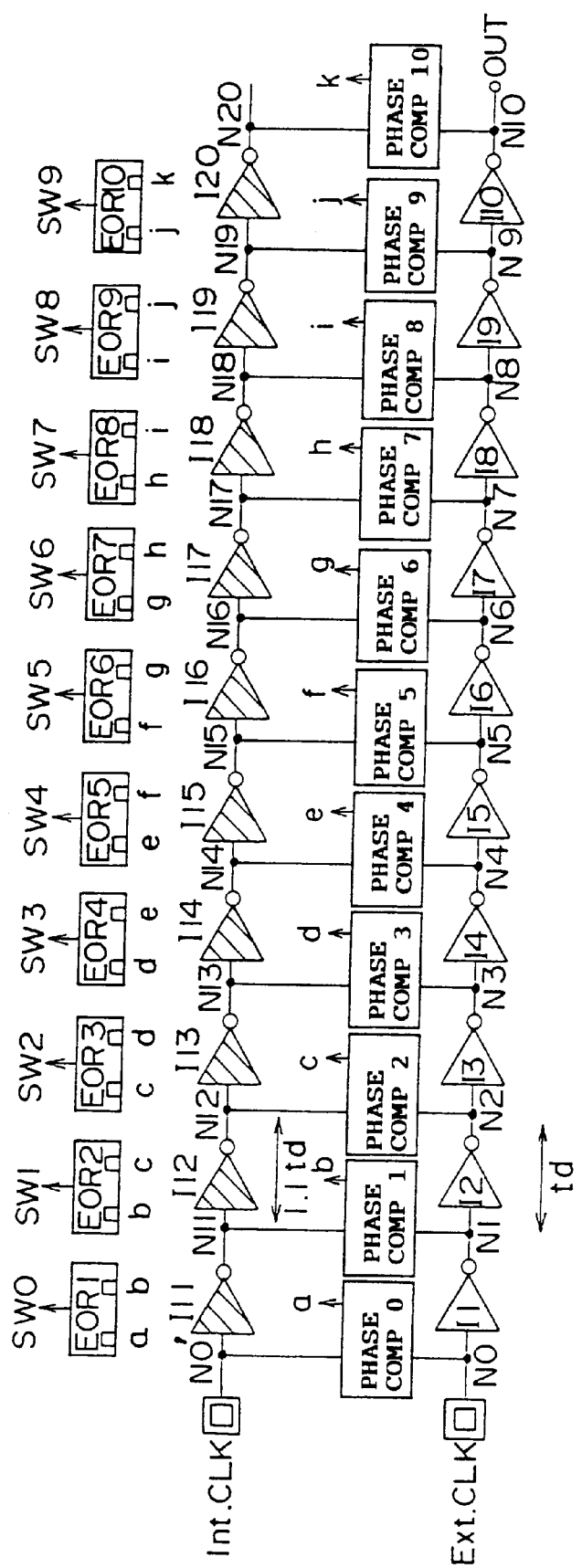
FIG. 3 is a block diagram of a phase comparator circuit configured according to the principle of the present invention.

The above phase synchronizing circuit includes the variable delay circuit shown in FIG. 2 and a phase comparator circuit shown in FIG. 3. An internal clock signal Int.CLK which should be synchronized with an external clock signal Ext.CLK is applied to the input node IN of the variable delay circuit shown in FIG. 2. The variable delay circuit shown in FIG. 2 can delay the internal clock signal Int.CLK with the delay time between 10 td and 10.9 td with a precision of 0.1 td. The delay time of the internal clock signal Int.CLK can be selected by the phase comparator circuit shown in FIG. 3.

Referring to FIG. 3, the phase comparator circuit includes a first gate line having gates I1 through I10 and a second gate line having gates I11 through I20. The gates I1 through I10 have a delay time td, and the gates I11 through I20 have a delay time 1.1 td. The gates I1 through I20 can be formed of inverters. The first gate line has 11 nodes N0 through N10, and the second gate line has 11 nodes N0' through N20, as shown in FIG. 3.

The phase comparator circuit includes 11 phase comparators 0 through 10. The phase comparator 0 is connected between the nodes N0 and N0'. The phase comparators 1 through 10 are connected between the nodes N1–N10 and N11–N20, respectively.

The first gate line is supplied with the external clock signal Ext.CLK, which is delayed by the delay time 10 td. The delayed external clock signal Ext.CLK is output via the output node OUT. The second gate line is supplied with the internal clock signal Int.CLK, which is delayed by the gates I11 through I20. The internal clock signal Int.CLK is also applied to the input node IN of the variable delay circuit shown in FIG. 2. At the nodes Nli (i=1, 2, . . . , 10) of the second gate line, delayed internal clock signals having delay times equal to i×1.1 td can be obtained. The phase comparators 0 through 10 compare the signals obtained at the nodes N0–N10 with the signals obtained at the nodes N0'–N20. For example, the comparator 1 compares the signal obtained at the node N1 with the signal obtained at the node N11. If the phase of the signal obtained at the node N11 leads to the phase of the signal obtained at the node N1, the phase comparator 1 outputs a binary logic 1 signal to its node a. If the phase of the signal obtained at the node N11 lags behind the phase of the signal obtained at the node N1, the phase comparator 1 outputs a binary logic 0 signal to the node a.

The phase comparator circuit shown in FIG. 3 further includes exclusive-OR gates EOR1 through EOR10. Each of the exclusive-OR gates EOR1 through EOR10 receives the output signals of the two adjacent phase comparators, and makes a decision as to whether the two signals indicate the same logic level as each other. The decision results of the exclusive-OR gates EOR1 to EOR10 are applied to the switches SW0 to SW9 shown in FIG. 2. For example, the exclusive-OR gate EOR2 receives the output signals of the phase comparators 1 and 2, and compares the logic levels thereof with each other. If the logic levels of the signals are the same as each other, the switch SW1 is supplied with one of the output signals of the comparators 1 and 2. If the logic levels of the signals are not the same as each other,the switch SW1 is supplied with the other output signal.

A description will now be given of the operation of the phase synchronizing circuit made up of the circuits shown in FIGS. 2 and 3.

The phase synchronizing circuit operates as follows, when the external clock signal Ext.CLK and the internal clock signal Int.CLK have almost the same phase as each other. In this case, the phase of the internal clock signal obtained at the node N0' slightly leads to the phase of the external clock signal obtained at the node N0. Hence, the phase comparator 0 outputs the output signal indicative of logic 1. The remaining phase comparators 1–9 output the output signals indicative of logic 0 because the phase of the external clock signal leads to the phase of the internal clock signal at the respective nodes.

Only the exclusive-OR gate EOR1 among the gates EOR1–EOR10 outputs the logic level different from the logic levels of the other gates EOR2–EOR10. Hence, only the switch SW0 is closed while the switches SW1–SW9 are maintained in the open state. Hence, the internal clock signal Int.CLK applied to the input node IN shown in FIG. 2 is delayed by the delay time equal to 10 td, and is then output to the output node OUT. In the phase comparator circuit shown in FIG. 3, the external clock signal Ext.CLK is delayed by the delay time equal to 10 td, and is then output to the output node OUT. Originally, the internal clock signal and the external clock signal are in phase. Hence, the delayed internal clock signal obtained at the output node OUT shown in FIG. 2 has the same phase as that of the delayed external clock signal obtained at the output node OUT shown in FIG. 3.

The phase synchronizing circuit operates as follows if the phase of the internal clock signal Int.CLK leads to that of the external clock signal Ext.CLK. It will now be assumed that the phase of the internal clock signal Int.CLK leads to that of the external clock signal Ext.CLK by a time of 0.1 td. In this case, the phase comparators 0 and 1 output the logic 1 signals, while the other phase comparators 2–10 output the logic 0 signals. Hence, only the exclusive-OR gate EOR2 turns ON the corresponding switch SW1, while the other exclusive-OR gates EOR1 and EOR3–EOR10 maintain the corresponding switches in the open state. Hence, the internal clock signal Int.CLK is delayed by the delay time 10.1 td and is then output to the output node OUT shown in FIG. 2. The external clock signal Ext.CLK is delayed by the delay time 10 td, and is then output to the output node OUT shown in FIG. 3. Originally, the internal clock signal leads to the external clock signal by the time 0.1 td. Hence, the phase of the internal clock signal obtained at the output node OUT shown in FIG. 2 coincides with that of the internal clock signal obtained at the output node OUT shown in FIG. 3.

Figure 4:
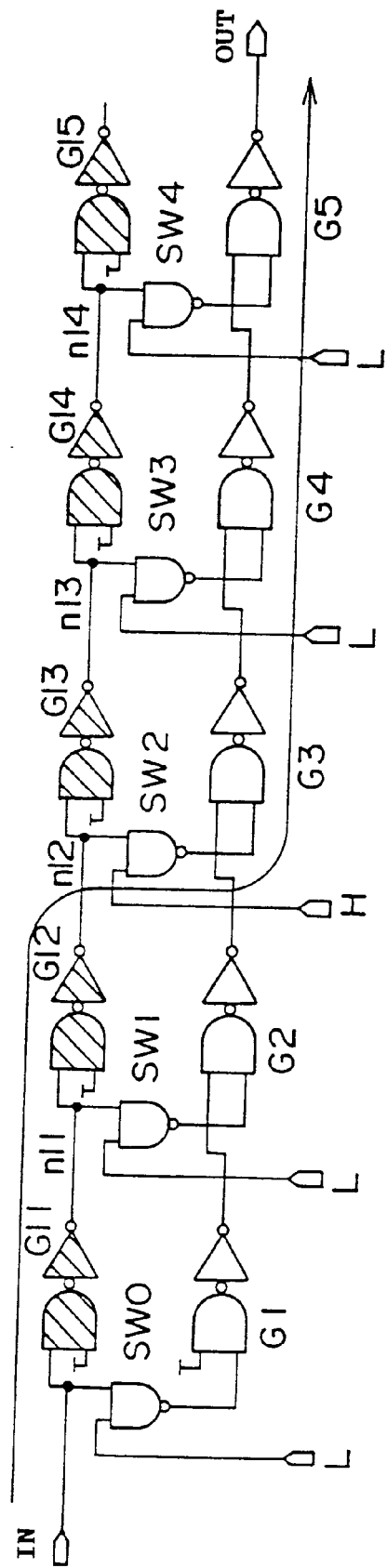
FIG. 4 is a circuit diagram of a variable delay circuit.

FIG. 4 is a circuit diagram of a detailed configuration of the variable delay circuit shown in FIG. 2. FIG. 2 shows 10 stages of gates G1–G10, while FIG. 4 shows 5 stages of gates G1–G5 for the sake of simplicity.

Each of the gates G1 through G5 shown in FIG. 4 is made up of a NAND gate and an inverter. Each of the gates G1–G10 has the same structure as shown in FIG. 4. Similarly, each of the gates G11–G15 is made up of a NAND gate and an inverter. Each of the gates G11–G19 shown in FIG. 2 has the same structure as shown in FIG. 4. Each of the switches SW0 to SW4 is formed of a NAND gate. When the output signal of the corresponding exclusive-OR gate is low, the output signals of the switches SW0–SW4 is fixed at the high level irrespective of the logic levels of the signals supplied thereto from the second gate line. Hence, the signals from the gates of the second gate line are not applied to the first gate line including the gates G1–G5. Each of the gates G1–G5 of the first gate line functions as a two-stage inverter, and similarly each of the gates G11–G15 of the second gate line functions as a two-stage inverter.

Each of the switches SW0–SW4 supplies the corresponding one of the gates G1–G5 of the first gate line with the inverted version of the signal from the corresponding one of the gates G11–G15 of the second gate line, when the output signal of the corresponding exclusive-OR gate is high. In this case, each of the gates G1–G5 of the first gate line functions as a two-stage inverter, and similarly each of the gates G11–G15 of the second gate line functions as a two-stage inverter.

In FIG. 4, only the switch SW2 is closed, and the signal applied to the input node IN passes through the gates G11, G12, the switch SW2, and the gates G3–G5.

It should be noted that the gates G11–G15 of the second gate line have the same circuit configuration and transistor size as those of the gates G1–G5 of the first gate line. That is, the delay time of the gates G1–G5 is the same as that of the gates G11–G15. However, the NAND gates respectively serving as the switches SW0–SW4 are connected to intermediate nodes n11–n14. Hence, the wiring loads between the adjacent gates of the second gate line are greater than those between the adjacent gates of the first gate line. The difference between the wiring loads of the first and second gate lines makes the delay time of each of the gates G11–G15 longer than longer than that of each of the gates G1–G5.

Figure 5:
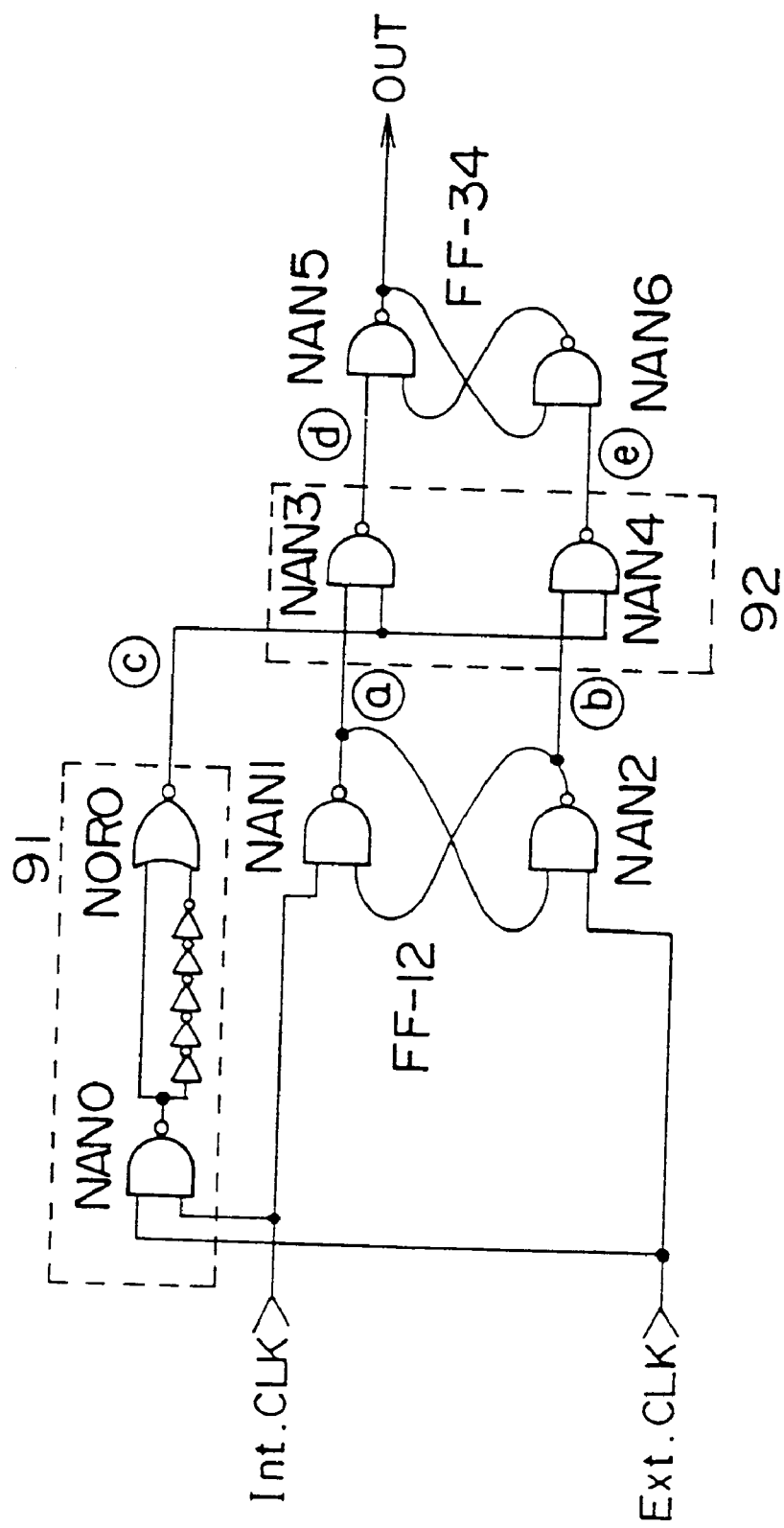
FIG. 5 is a circuit diagram of a configuration of phase comparators shown in FIG. 3.

FIG. 5 is a circuit diagram of another configuration of the phase comparator circuit. The circuit shown in FIG. 5 includes a first flip-flop circuit FF-12, a pulse signal generating circuit 91, a second flip-flop circuit FF-34, and a gate circuit 92. The first flip-flop circuit FF-12 receives the internal clock signal Int.CLK and the external clock signal Ext.CLK. The pulse signal generating circuit 91 detects a state in which both the internal and external clock signals are high, and generates a pulse signal having a given constant width from the time that the above state is detected. The second flip-flop circuit FF-34 receives the two output signals of the first flip-flop circuit FF-12. The gate circuit 92 inverts the output signals of the flip-flop circuit FF-12 in accordance with the pulse signal produced by the pulse signal generating circuit 91, and supplies the inverted versions of the output signals of the first flip-flop circuit FF-12 to the second flip-flop circuit FF-34.

A description will now be given of an operation of the phase comparator circuit shown in FIG. 5. In the initial state, the internal clock signal Int.CLK and the external clock signal Ext.CLK are both low, and the output nodes a and b of the first flip-flop circuit FF-12 are both high. The first flip-flop circuit FF-12 inverts the output node from the high level to the low level, at which output node either the internal clock signal Int.CLK or the external clock signal Ext.CLK rises in advance of the other. For example, the internal clock signal Int.CLK rises earlier than the external clock signal Ext.CLK, the output node a is changed from the high level to the low level, while the output node b is maintained at the high level.

Then, the internal clock signal Int.CLK and the external clock signal Ext.CLK both switch to the high level. When the output state of the first flip-flop circuit FF-12 is settled, the pulse signal generating circuit 91 outputs the pulse signal to the gate circuit 92. The gate circuit 92 is opened by the above pulse signal, and the output signals of the nodes a and b of the first flip-flop circuit FF-12 are inverted by the gate circuit 92, and are then supplied to the second flip-flop circuit FF-34. The circuit FF-34 latches the output signals of the gate circuit 92, and supplies the output node OUT with the signal which is equivalent to the inverted version of the signal obtained at the node d shown in FIG. 5.

As described above, the phase comparator circuit shown in FIG. 5 outputs the low-level signal to the output node OUT when the internal clock signal Int.CLK rises in advance of that of the external clock signal Ext. CLK, and outputs the high-level signal to the output node OUT when the internal clock signal Int.CLK rise after the external clock signal Ext.CLK rises.

A description will now be given of an application of the above-mentioned variable delay circuit to the digital DLL circuit. In short, the DLL circuit of the present invention is characterized not only by the variable delay circuit but also unique configurations. Examples of the unique configurations are use of two DLL lines having different precision values, use of a frequency divider, a delay control of the variable delay circuit, and the configuration of the phase comparator circuit.

Figure 6:
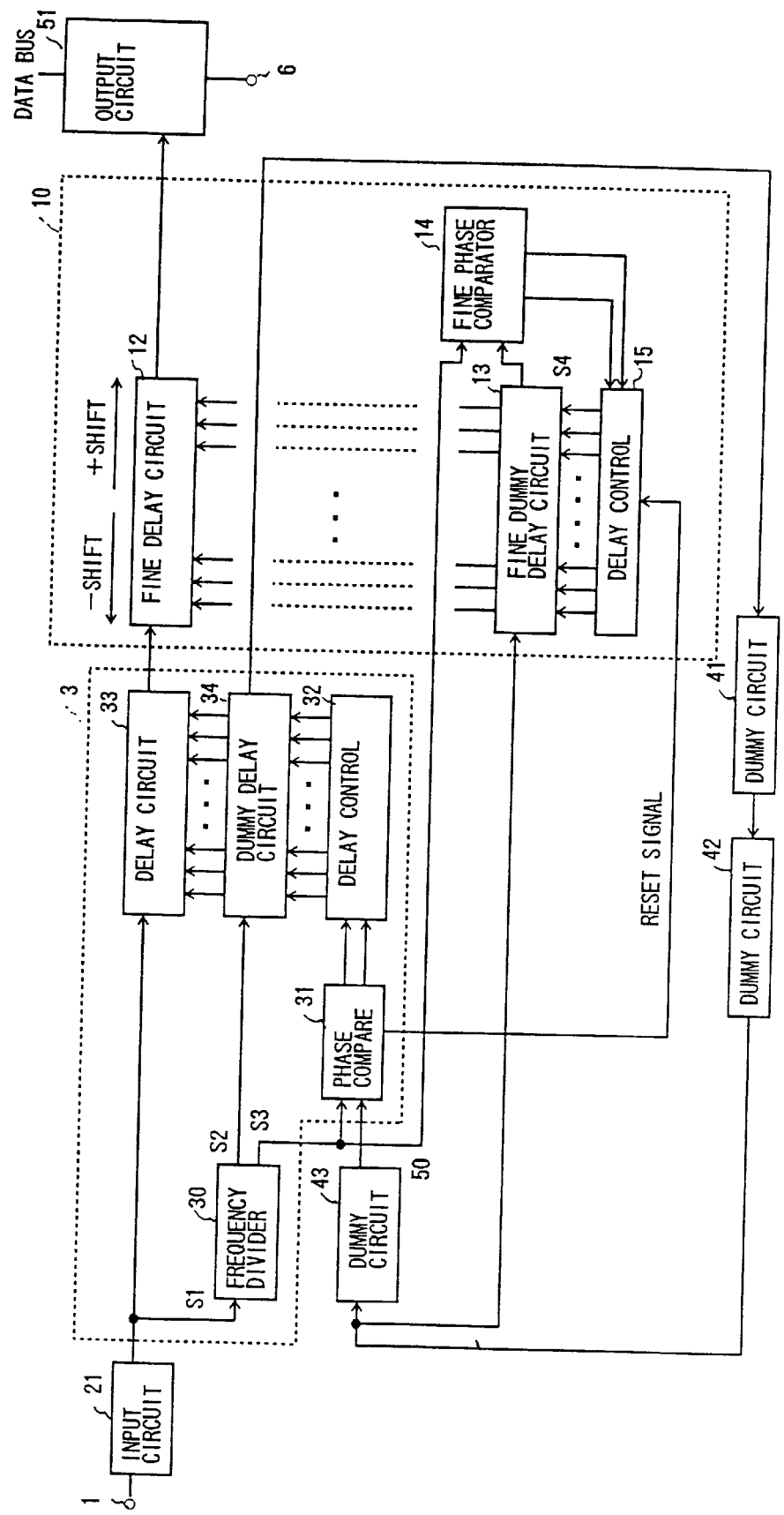
FIG. 6 is a block diagram of a semiconductor integrated circuit device (digital DLL circuit device) according to an embodiment of the present invention.

FIG. 6 is a block diagram of a digital DLL circuit device according to an embodiment of the present invention. The configuration shown in FIG. 6 can be formed by a semiconductor integrated circuit technique. The device shown in FIG. 6 includes a first DLL circuit 3 and a second DLL circuit 10. The second DLL circuit 10 is located at the output side of the first DLL circuit 3, and a precision higher than that of the first DLL circuit 3. An input clock signal is externally supplied to a clock input pad 1 and an input circuit 21 functioning as a clocked buffer, and is subjected to a delay control by the first DLL circuit 3. The delayed clock signal that is output by the first DLL circuit 3 is delayed by the second DLL circuit 10 with a precision higher than of the first DLL circuit 3. Hence, an output (internal) clock signal having a given phase relationship with the input clock signal applied to the pad 1 can be produced. The output signal of the second DLL circuit 10 is applied, through a clock signal line, to an output circuit 51 connected to a data bus. The output circuit 51 buffers data on the data bus in synchronism with the output clock signal supplied from the second DLL circuit 10, and outputs the buffered data to a data output pad 6.

The DLL circuit shown in FIG. 6 includes a dummy output circuit 41, a dummy input circuit 42 and a dummy circuit 43. The dummy output circuit 41 has a delay amount (time) equal to the sum of the delay amount of the clock signal line from the second DLL circuit 3 to the output circuit 51 and the delay amount within the output circuit 51. The dummy circuit 42 has the same delay amount as that of the input circuit 21. The dummy circuit 43 has a given delay amount, which will be described later.

The first DLL circuit 3 and the second DLL circuit 10 operate separately. In other words, the phase comparing operation of the first DLL circuit 3 is carried out independently of that of the second DLL circuit 10. More particularly, the clock signal obtained from the dummy output circuit 41 via the dumpy input circuit 42 is independently phase-compared with the input clock signal from the input circuit 21, so that a given phase difference can be obtained. The given phase difference corresponds to k periods (k is an integer equal to or greater than 1) by which the clock signal on the dummy circuit side lags behind the input clock signal. In this case, the input clock signal on the dummy circuit side can be handled so that it is substantially in phase with the input clock signal, although the former clock signal actually lags behind the later clock signal by the k periods. Hence, data output by the output circuit 51 can be synchronized with the input clock signal applied to the clock input pad 1.

The control of the delay amount of the second DLL circuit 10 is followed by the control of the delay amount of the first DLL circuit 3. More particularly, the second DLL circuit 10 is in a reset state in response to a reset signal from the first DLL circuit 3 when the first DLL circuit 3 is executing the delay control. The second DLL circuit 10 is in a state in which the delay control can be executed when a signal S0 is in phase with a signal S3 in the first DLL circuit 3 (that is, when the external clock signal applied to the input pad 1 is in phase with the data output via the data output pad 6 with the precision of the first DLL circuit 3). Hence, if a large amount of delay is required, the two-stage delay control can be realized. More particularly, the first stage of the delay control is carried out by the first DLL circuit 3 and pulls the signals S0 and S3 in phase with the precision of the first DLL circuit 3. Then, the second state of the delay control is carried out by the second DLL circuit 10 and pulls the signals S0 and S3 in phase with the precision of the second DLL circuit 10 that is higher than the precision of the first DLL circuit 3.

The use of the DLL circuits having the different control precision levels means that the phase control is carried out in a hierarchical formation. In the structure shown in FIG. 6 is made up of two hierarchical phase control levels. It will now be assumed that two hierarchical levels correspond to two digits. In this case, the lower digit is controlled by the second DLL circuit 10, and the upper digit is controlled by the first DLL circuit 3. Hence, a carry-up operation and a carry-down operation are required between the first DLL circuit 3 and the second DLL circuit 10. For example, when the first DLL circuit 3 has a precision of td, the second DLL circuit 10 is required to control the delay amount within a range including ±td. When the result of the phase comparing operation by the first DLL circuit 3 is out of the range ±td, the first DLL circuit 3 outputs the reset signal to the second DLL circuit 10 to set the delay amount of the second DLL circuit 10 to a predetermined value. The above reset signal corresponds to the carry-up or carry-down operation. When the result of the phase comparing operation is out of the range ±td, the second DLL circuit 10 no longer provides a sufficient delay amount. In this case, the delay amount should be controlled (varied) by the first DLL circuit 3. The control of the delay amount by the first DLL circuit 3 means that the carry-up or carry-down occurs between the first DLL circuit 3 and the second DLL circuit 10.

When the result of the phase comparing operation by the first DLL circuit 3 is out of the range ±td, the second DLL circuit 10 is set to the predetermined delay amount, which is equal to, for example, half the delay amount which can be varied by the second DLL circuit 10. That is, when the second DLL circuit 10 is reset, the delay amount equal to half the variable range ±td of the second DLL circuit 10 is set to the second DLL circuit 10. Hereinafter, the delay amount equal to half the variable range ±td of the second DLL circuit 10 is referred to as a reference delay amount. In the case where the second DLL circuit 10 is in the operable state, the delay amount of the second DLL circuit 10 can be varied by increasing or decreasing the reference delay amount. As will be described later, the dummy circuit 43 provides the same delay amount as the reference delay amount.

The detail structures of the first DLL circuit 3 and the second DLL circuit 10 will be described with reference to FIG. 6.

The first DLL circuit 3 includes a frequency divider 30, a phase comparator circuit 31 serving as a digital phase comparator, a delay control circuit 32, a delay circuit 33 and the dummy delay circuit 34. The frequency divider 30 divides the frequency of the external clock signal S1 supplied thereto via the input circuit 21, and thus produces signals S2 and S3 having an identical frequency lower than that of the external clock signal S1. The signal S2 is output to the dummy delay circuit 34, and the signal S3 is supplied to a first input of the phase comparator circuit 31. A second input of the phase comparator circuit 31 is supplied with the output signal of the dummy delay circuit 34 via the dummy output circuit 41, the dummy input circuit 42 and the dummy circuit 43. The output signal of the dummy circuit 43 is labeled S0.

The phase comparator circuit 31 compares the phases of the signals S0 and S3 with each other, and controls the delay control circuit 32 on the basis of the results of the above comparing operation. More particularly, the phase comparator circuit 31 determines the phase difference between the signals S0 and D3 falls within the range ±td. When it is determined that the phase difference is out of the range ±td, the phase comparator circuit 31 is required to greatly vary the delay amount and varies the respective delay amounts of the delay circuit 33 and the dummy delay circuit 34 by one step (which corresponds to the minimum variable delay amount and the precision of the first DLL circuit 3). The delay circuit 33 and the dummy delay circuit 34 always have an identical delay amount. In this case, the phase comparator circuit 31 outputs a reset signal to the second DLL circuit 10 in order to reset a fine delay circuit 12 and a fine dummy delay circuit 13, which circuits will be described later. In response to the reset signal, the fine delay circuit 12 and the fine dummy delay circuit 13 are set to a delay amount equal to half the variable range. The output signal of the delay circuit 33 is applied to the fine delay circuit 12 of the second DLL circuit 10.

The second DLL circuit 10 includes, in addition to the fine delay circuit 12 and the fine dummy delay circuit 13, a fine phase comparator circuit 14 and a delay control circuit 15. The fine delay circuit 12 is capable of controlling the delay amount with a precision higher than that of the delay circuit 33. Similarly, the fine dummy delay circuit 13 is capable of controlling the delay amount with a precision higher than that of the dummy delay circuit 34. The fine phase comparator circuit 14 compares the phases of the signal S3 output by the frequency divider 30 and the output signal of the fine dummy delay circuit 13 with each other, and control the delay control circuit 15 so that the fine delay circuit 12 and the fine dummy delay circuit 13 have an identical delay amount. When the fine delay circuit 12 and the fine dummy delay circuit 13 have a precision td', the fine phase comparator circuit 14 determines whether the phase difference falls within the range between 0 and td'. If it is determined that the phase difference is out of the above range, the fine delay circuit 12 and the fine dummy delay circuit 13 are controlled to increase or decrease the delay amount by td'. When the delay control circuit 15 receives the reset signal from the phase comparator circuit 31, the circuit 15 resets the fine delay circuit 12 and the fine dummy delay circuit 13. Hence, the fine delay circuit 12 and the fine dummy delay circuit 13 are set to the aforementioned reference delay amount.

Figure 7:
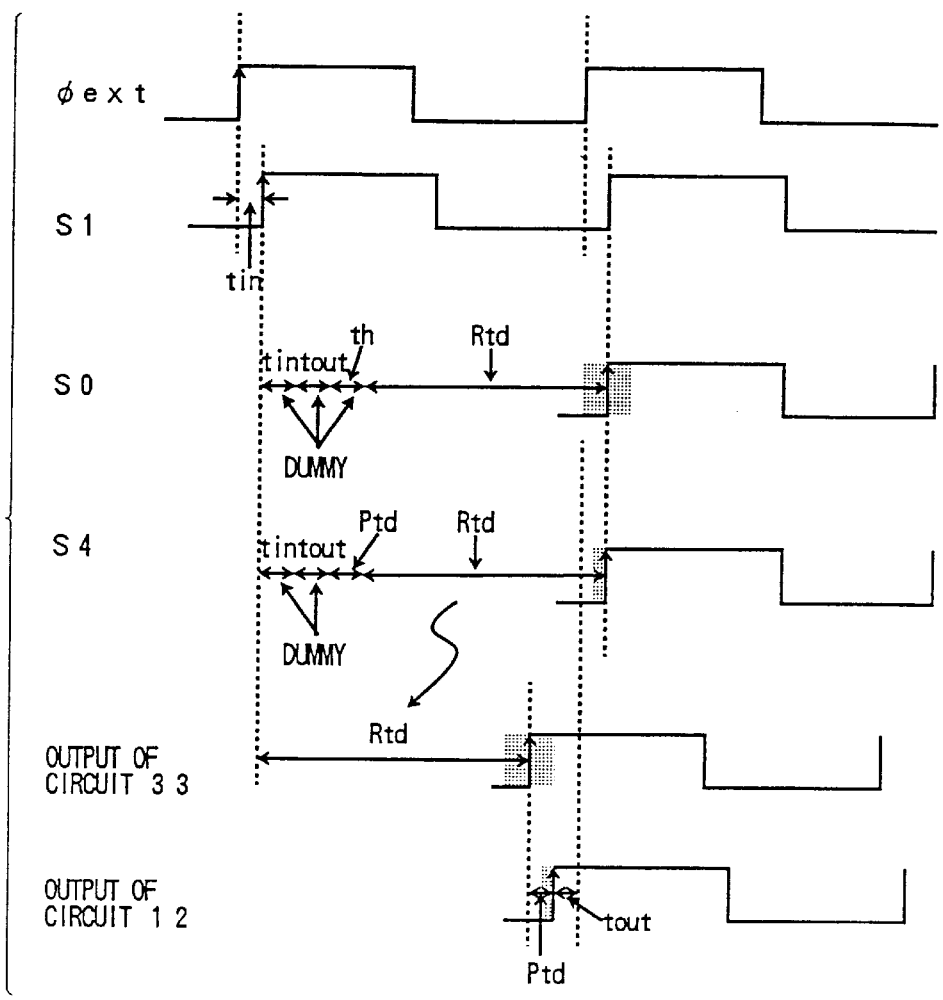
FIG. 7 is a timing chart of an outline of the operations of the device shown in FIG. 6.

A description will now be given, with reference to FIG. 7, of an operation of the device shown in FIG. 6 which is carried out when the internal (output) clock signal is in synchronism with the external clock signal. The external clock signal now labeled φext shown in FIG. 7 is applied to the input terminal 1, and is delayed by tin by the input circuit 20. Then, the delayed input external clock signal is applied to the frequency divider 30 as signal S1. The phase comparator circuit 31 receives the signal S0 from the dummy circuit 43. The signal S0 has a delay amount equal to the sum of the delay amounts given to the signal S1 via the delay circuit 33, the fine delay circuit 12, the output circuit 51 and the input circuit 21. The delay amount of the frequency divider 30 is neglected for the sake of simplicity. Hence, the signal S0 can be handled so that the signal S1 passes through the dummy delay circuit 34, the dummy output circuit 41, the dummy input circuit 42 and the dummy delay circuit 34, and is then output.

Now, the following delay amounts will be defined:

Rtd: delay amount of the dummy delay circuit 34;
tout: delay amount of the dummy output circuit 41;
tin: delay amount of the dummy input circuit 42;
th: delay amount of the dummy circuit 43.

In this case, the signal S0 is as shown in FIG. 7. The delay amount th of the dummy circuit 43 is half the maximum delay amount of the fine delay circuit 12 (also half the maximum delay amount of the fine dummy delay circuit 13). That is, the delay amount th corresponds to the center of the variable delay range. For example, if the fine delay circuit 12 can vary the delay amount within the range between 10 td and 10.8 td, the delay amount th will be equal to 10.4 td. A range depicted by a dotted area on the waveform of the signal S0 corresponds to the aforementioned range ±td.

The fine phase comparator circuit 14 receives the signal S3 from the frequency divider 30 and the signal S4 output by the fine dummy delay circuit 13. The signal S4 corresponds to a signal obtained in such a way that the signal S1 passes through the dummy output circuit 41, the dummy input circuit 42 and the fine dummy delay circuit 13. The fine dummy delay circuit 13 has a delay amount Ptd. If Ptd=th, then the signal S4 rises at the same time as the signal S0. In this case, as shown in FIG. 7, the output signal of the delay circuit 33 lags behind the signal S1 by the delay amount Rtd, and is further delayed by Ptd by the fine delay circuit 12. Since the output signal of the fine delay circuit 12 is delayed by the delay amount tout of the output circuit 51, the internal (output) clock signal finally obtained can be synchronized with the external (input) clock signal φext.

In the device shown in FIG. 6, when the first DLL circuit 3 has a precision of td, the second DLL circuit 10 can control the delay amount including the range ±td, as has been described previously. When the result of the phase comparing operation by the first DLL circuit 3 is out of the range ±td, the first DLL circuit 3 outputs the reset signal to the second DLL circuit 10 so that the second DLL circuit 10 can be set to the given delay amount. A further description will now be given, with reference to FIGS. 8 and 9, of the operations of the first DLL circuit 3 and the second DLL circuit 10 including the carry-up and carry-down operations.

It will now be assumed that the circuit shown in FIG. 6 is in the static state in which the circuit stably operates. In this state, the delay amounts of the first DLL circuit 3 and the second DLL circuit 10 are maintained. If a certain factor (for example, a variation in the power supply voltage or temperature) destroys the phase-synchronized state between the input and output clock signals, the following delay control is carried out.

Figure 8:
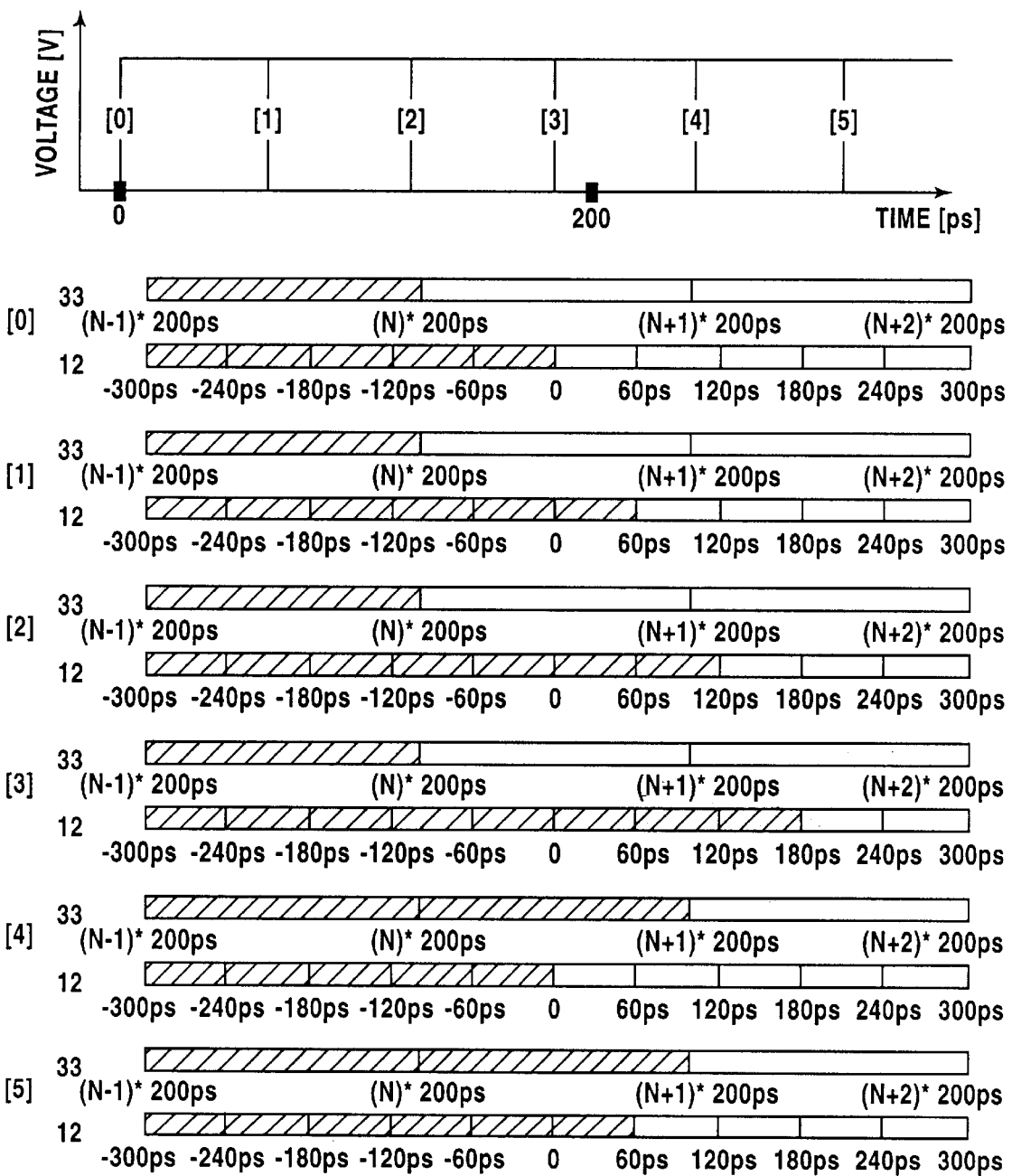
FIG. 8 is a diagram showing a carry-up operation of the device shown in FIG. 6.
Figure 9:
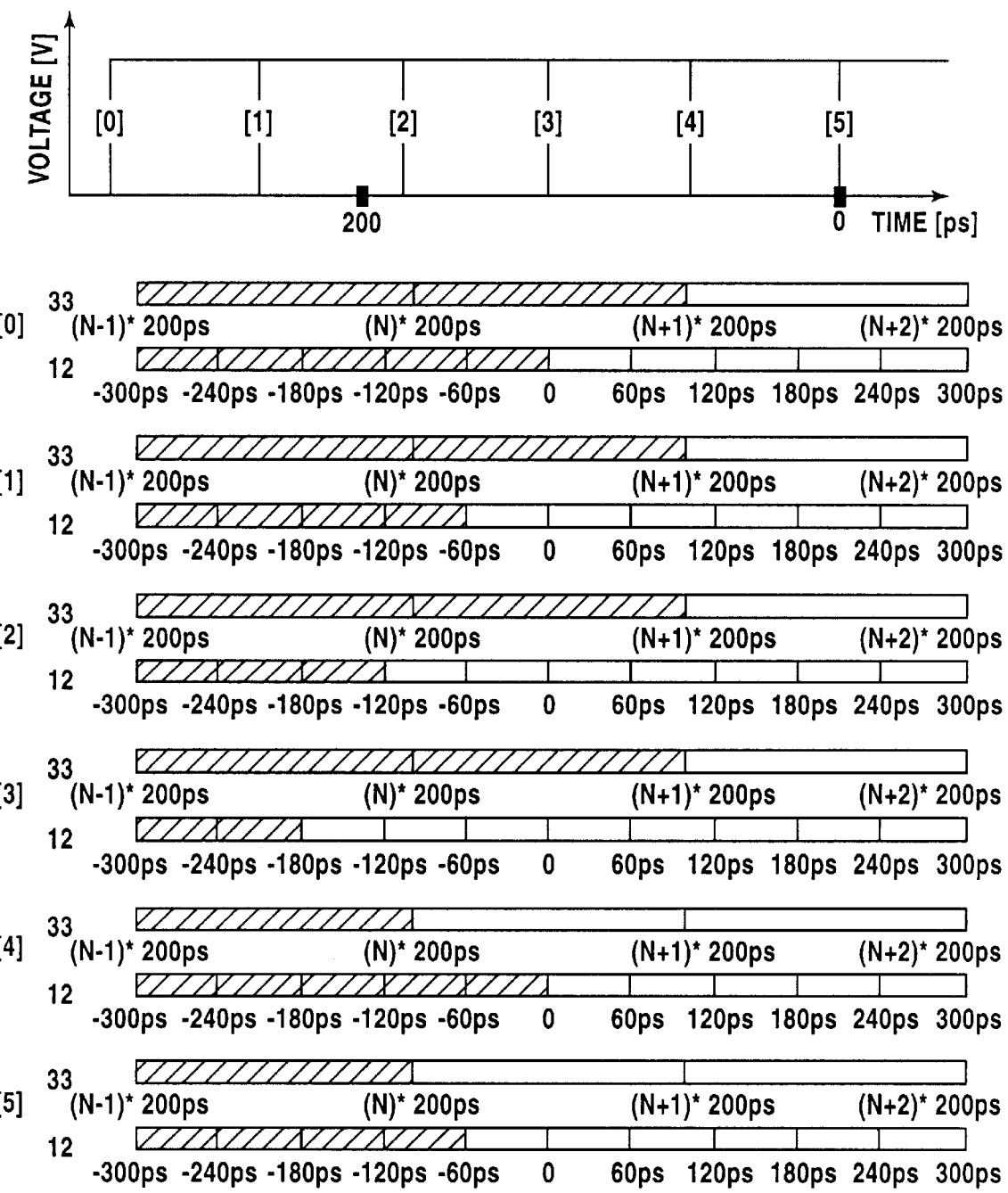
FIG. 9 is a diagram showing a carry-down operation of the device shown in FIG. 6.

In the graphs shown on the uppermost portion of FIGS. 8 and 9, the vertical axes denote the voltage, and the horizontal axes denote the phase difference between the signals S3 and S4 which are compared with each other by the fine phase comparator 14. Further, [1] through [5] indicate timings at which the phase comparing operation is carried out. It is assumed that the delay circuit 33 has a precision (unit delay amount) td of 200 ps, and the fine delay circuit 12 has a precision td' of 60 ps. Bar graphs [0]–[5] shown in FIG. 8 show operations of the delay circuit 33 and the fine delay circuit 12 when the carry-up operation takes place. Similarly, bar graphs [0]–[5] shown in FIG. 9 show operations of the delay circuit 33 and the fine delay circuit 12 when the carry-down operation takes place. More particularly, the bar graphs [0]–[5] show the states of the delay circuits 33 and 12 every 60 ps until the phase difference between the signals S3 and S4 becomes equal to 300 ps from 0 ps. In FIGS. 8 and 9, the delay circuit 33 has stages N when the phase difference is equal to 0 ps, and only stages N−1, N, N+1 and N+2 are shown. In FIGS. 8 and 9, all the stages of the fine delay circuit 12 are illustrated.

First, the carry-up operation will be described with reference to FIG. 8. The delay circuit 33 has the N delay stages and the fine delay circuit 12 has the delay amount equal to half the whole delay amount, when there is no phase difference (0 ps). At this time, the delay circuits 33 and 12 are located in initial state [0] shown in FIG. 8. When the phase difference becomes equal to 60 ps, the fine delay circuit 12 increases the number of stages by 1 (state [1]). When the phase difference becomes equal to 120 ps, the fine delay circuit 12 increases the number of stages by 1 (state [2]). When the phase difference becomes equal to 180 ps, the fine delay circuit 12 increases the number of stages by 1 (state [3]). When the phase difference becomes equal to 240 ps, the delay circuit 33 increases the number of stages by 1 so that it has N+1 stages (state [4]). Further, the fine delay circuit 12 is reset to the center position (state [4]). When the phase difference becomes equal to 300 ps, the fine delay circuit 12 increases the number of stages by 1 (state [5]).

The carry-down operation will be described with reference to FIG. 9. It will now be assumed that the initial state [0] in the carry-down operation corresponds to state {4} shown in FIG. 8. In the above initial state [0], the delay circuit 33 is set to N+1 stages, and the fine delay circuit 12 is reset to the center. When the phase difference becomes equal to −60 ps, the fine delay circuit 12 decreases the number of stages by 1 (state [1]). When the phase difference becomes equal to −120 ps, the fine delay circuit 12 decreases the number of stages by 1 (state [2]). When the phase difference becomes equal to −180 ps, the fine delay circuit 12 decreases the number of stages by 1 (state [3]). When the phase difference becomes equal to −240 ps, the delay circuit 33 decreases the number of stages by 1 so that it has N stages (state [4]). Further, the fine delay circuit 12 is reset to the center (state [4]). When the phase difference becomes equal to −300 ps, the fine delay circuit 12 decreases the number of stages by 1 (state [5]).

In the above operation, the delay circuit 33 operates separately from the fine delay circuit 12, which is reset to the center when the number of stages of the delay circuit 33 is changed. It can be thus said that the fine delay circuit 12 automatically measures the delay amount of one stage of the delay circuit 33. Hence, even if a phase difference is caused by the temperature or the power supply voltage, it can be corrected by the smooth carry-up or carrydown operation between the delay circuit 33 and the fine delay circuit 12. In a case where the fine delay circuit 12 has a variable delay range over 200 ps which is the precision of the delay circuit 33, the smoother carry-up or carry-down operation can be ensured even if the first DLL circuit 3 has a ratio of variation in delay to temperature or power supply voltage different from that of the second DLL circuit 10.

The above description is directed to the basic structure and operation of the digital DLL circuit device using the two DLL circuits 3 and 10. The following description will be directed to the detail of these circuits.

Figure 10:
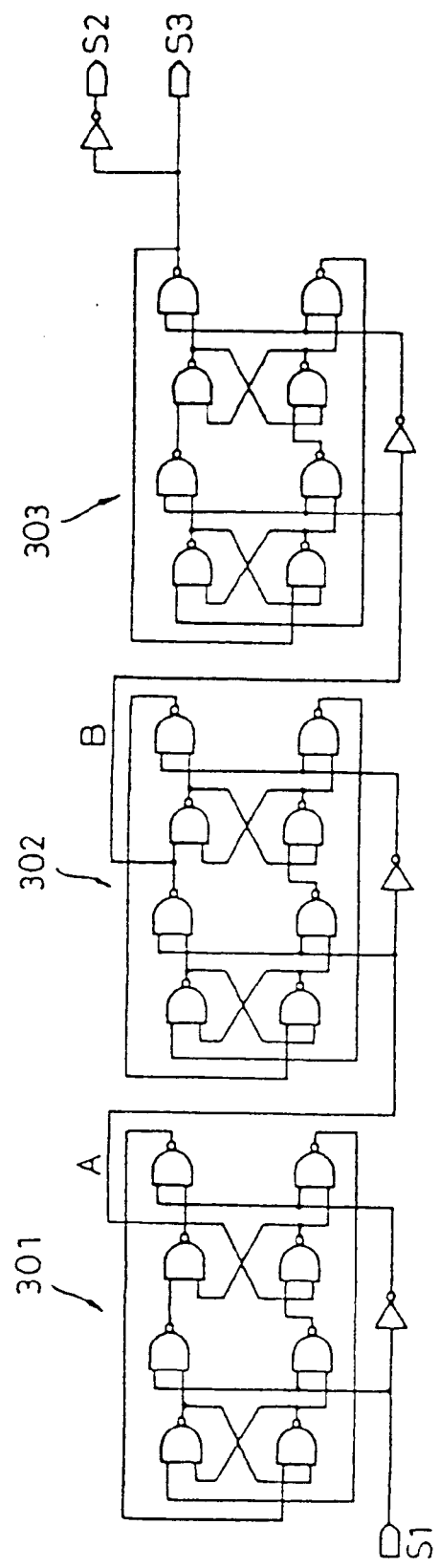
FIG. 10 is a circuit diagram of a frequency divider shown in FIG. 6.
Figure 11:
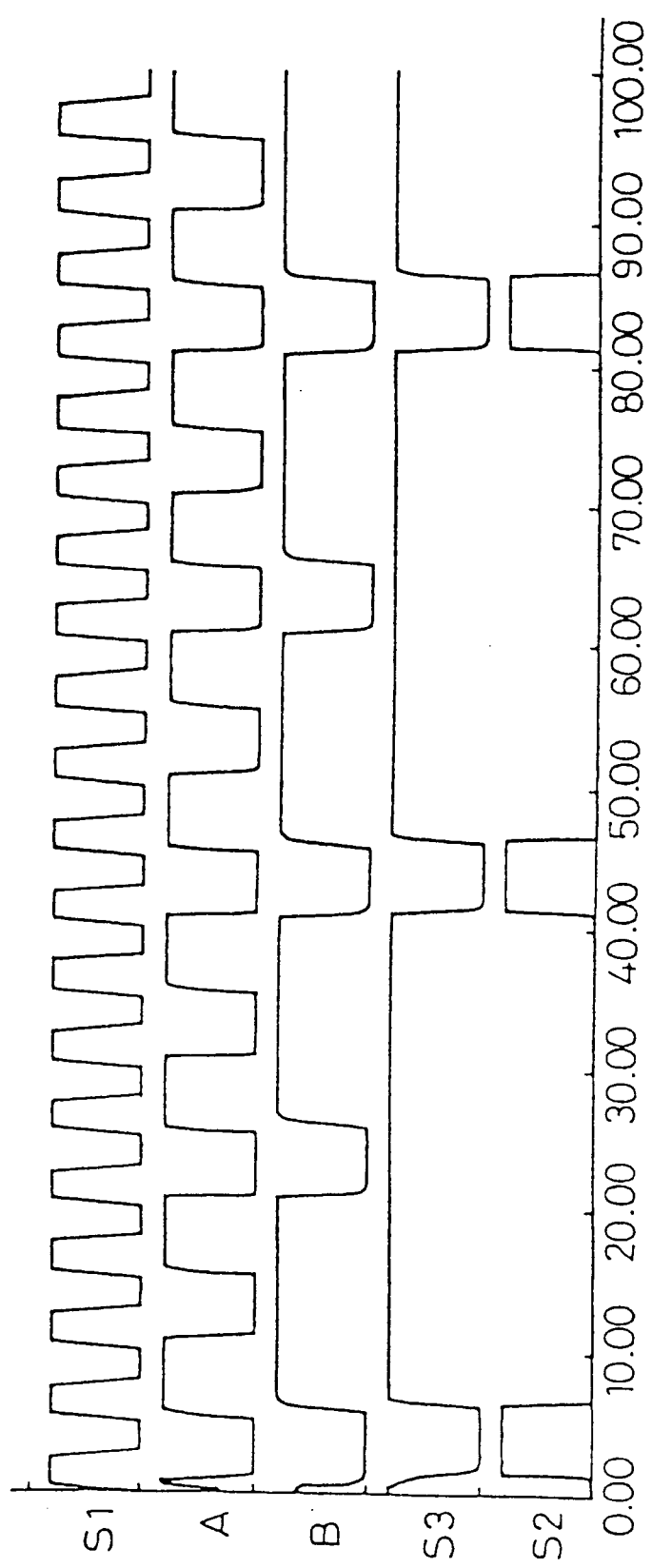
FIG. 11 is a waveform diagram of signals observed at nodes of the frequency divider shown in FIG. 10.

FIG. 10 is a circuit diagram of the frequency divider 30 of the first DLL circuit 3. FIG. 11 is a waveform diagram of nodes of the frequency divider 30. As shown in FIG. 10, the frequency divider 30 is equipped with three stages of counters 301, 302 and 303, each of which counters is equipped with a plurality of NAND gates and an inverter. The frequency divider 30 divides the frequency of the signal S1 (the external clock signal obtained at the output of the input circuit 21) so that the signals S2 and S3 can be produced. In FIG. 10, a reference letter A denotes the output signal of the counter 301, and a reference letter B denotes the output signal of the counter 302. The signals S1, S2, S3, A and B are shown in FIG. 11. The frequency divider 30 is not limited to the circuit shown in FIG. 10 but can be formed by using a combination of various logic gates.

Referring to FIG. 11, the frequency divider 30 divides the input clock signal S1 at a frequency dividing ratio of 1/8 in order to produce the signal S2 having a frequency equal to 1/8 of the frequency of the signal S1. The signal S2 has a high-level section equal to one cycle of the signal S1 and a low-level section equal to seven cycles thereof. The signal S2 and S3 have the complementary relationship.

Figure 12:
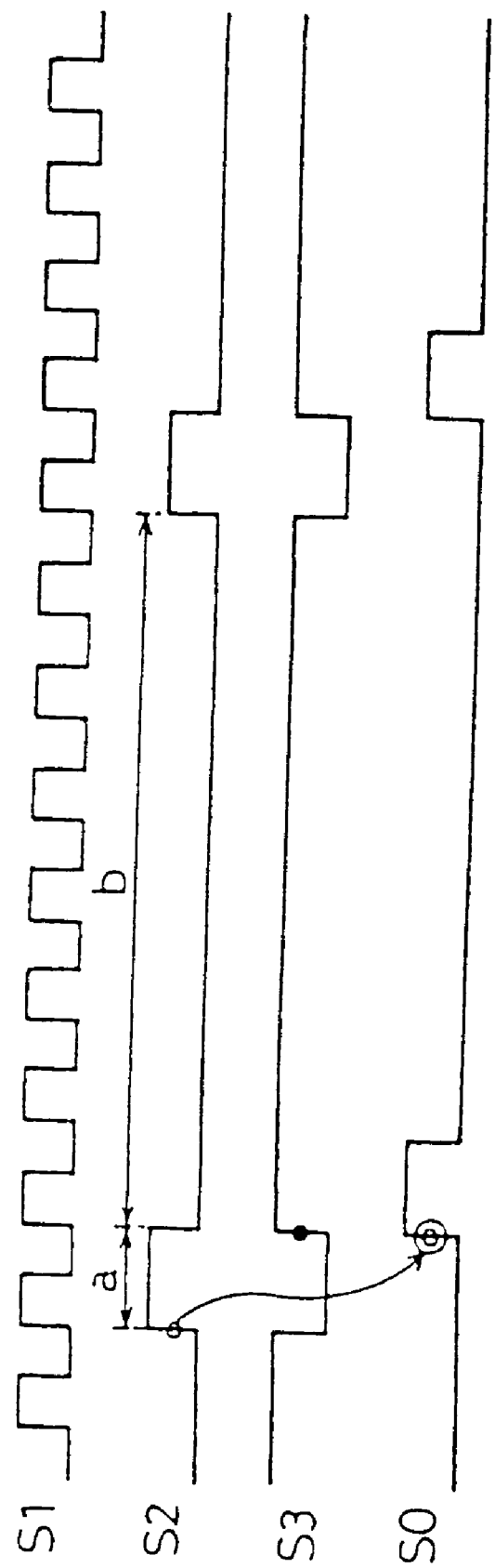
FIG. 12 is a timing chart of an operation of the device related to the operation of the frequency divider.

FIG. 12 shows the complementary relationships among the signals S0–S3. As shown in FIG. 12, the phase comparator circuit 31 performs the phase comparing operation every eight cycles of the signal S1. The signal S0 lags behind the signal S1 by one cycle and is synchronized with the signal S1. Hence, the output clock signal in the output circuit 51 is synchronized with the external clock signal located prior to one cycle.

It is possible to define the preceding cycles of the external clock signal at which the output clock signal is started to be generated by changing the cycle "a" of the signal S2 in the frequency divider 30. For example, when the signal S2 has the period "a" equal to three clocks of the signal S1, the output clock signal synchronized with the external clock signal located prior to the three cycles can be produced. By changing the period "a"+"b" of the signal S2, it is possible to change the timing at which the phase comparing operation is carried out.

If the sum of the delay amount of the input circuit 21, the minimum delay amount of the delay circuit 33, the minimum delay amount of the fine delay circuit 12, the delay amount of the clock line and the delay amount of the output circuit 51 is shorter than one cycle of the external clock signal, it is possible to produce the internal clock signal synchronized with the external clock signal located prior to one cycle. If the above sum exceeds one cycle of the external clock signal, it is necessary to synchronize the internal clock signal with the external clock signal located prior to two or more cycles. In this case, the period "a" is set to 2 cycles or more.

Figure 13A:
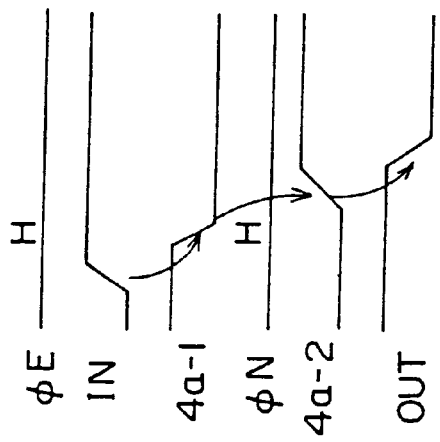
FIGS. 13A, 13B and 13C are diagrams of a delay circuit which can be employed in the device shown in FIG. 6.
Figure 13B:
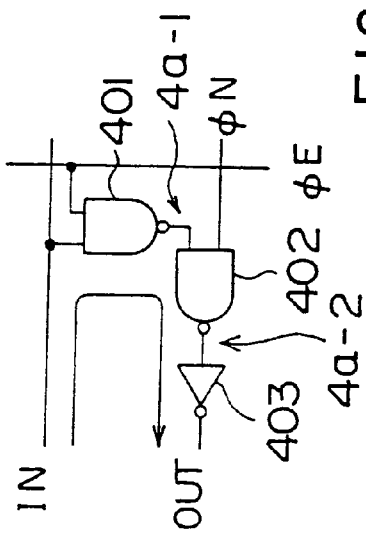
Figure 13C:
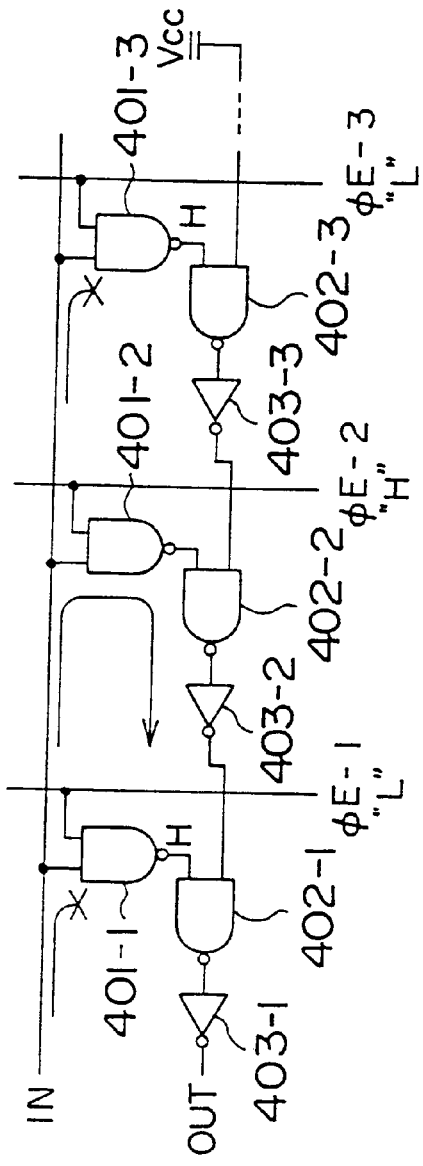

FIGS. 13A, 13B and 13C show an example of the internal structures of the delay circuit 33 of the first DLL circuit 3 and the dummy delay circuit 34. More particularly, FIG. 13A shows a unit delay element (gate) for one bit, and FIG. 13B is a timing chart of an operation of the unit delay element shown in FIG. 13A. FIG. 13C shows a configuration in which a plurality of unit delay elements are cascaded.

As shown in FIG. 13A, the unit delay element is made up of two NAND gates 401 and 402, and an inverter 403. Referring to FIG. 13B, a signal φE is an enable signal. When the enable signal φE is high (H), the unit delay element is activated. FIG. 13B shows the enable signal φE is high and the unit delay element is enabled. A signal IN is an input signal applied to the unit delay element, and a signal φN is transferred from the unit delay element located at the right-hand side of the unit delay element shown in FIG. 13A. Further, a symbol OUT denotes the output signal of the unit delay element shown in FIG. 13A. The output signal OUT is the signal φN for the unit delay element located at the left-hand side of the unit delay element shown in FIG. 13A. Signals 4a-1 and 4a-2 shown in FIG. 13B are obtained at nodes 4a-1 and 4a-2 shown in FIG. 13A.

When the signal φN is low (L), the output signal OUT is low. When the signal φN is high and the signal φE is low, the output signal OUT is high. When the signal φN is high and the signal φE is high, the output signal OUT is high if the input signal IN is low, and is low if the input signal IN is high.

The unit delay element shown in FIG. 13A can be summarized as follows. When the enable signal φE is high and the input signal IN rises, the input signal IN is allowed to pass through the elements 401–403 as indicated by the arrow in FIG. 13A. When the enable signal φE is low, the input signal IN is inhibited to pass through the NAND gate 401.

In FIG. 13C, only three stages of unit delay elements are shown. In practice, a larger number of unit delay elements are cascaded in order to realize the delay circuits 33 and the dummy delay circuit 34. The stages of unit delay elements are supplied with respective enable signals φE-1, φE-2 and φE-3, which are controlled by the delay control circuit 32, as will be described later.

In FIG. 13C, the enable signal φE-2 is high and the unit delay element located at the center is thus activated. Hence, the input signal IN is allowed to pass through the NAND gate 401-2. The enable signals φE-1 and φE-3 are low, and thus the input signal IN cannot pass through the NAND gates 401-1 and 401-3.

The output signal OUT of the unit delay element located at the right-hand side of the central unit delay element is high, and thus the input signal IN can pass through the NAND gate 402-2, and then passes through the inverter 403-2. The output signal OUT of the inverter 403-2 is low and is supplied to the unit delay element located at the left-hand side of the central unit delay element as the output signal OUT. Since the enable signal φE-1 is low, the output signal of the NAND gate 401-1 is high. Hence, the low-level output signal OUT from the central unit delay element can pass through the NAND gate 402-1 and is applied to the next stage via the inverter 403-1.

As described above, the input signal IN is switched back by the activated unit delay element. The delay amount can be varied by selecting one of the unit delay elements to be activated. The delay amount depends on the number of NAND gates and the number of inverters through which the input signal passes.

Figure 14:
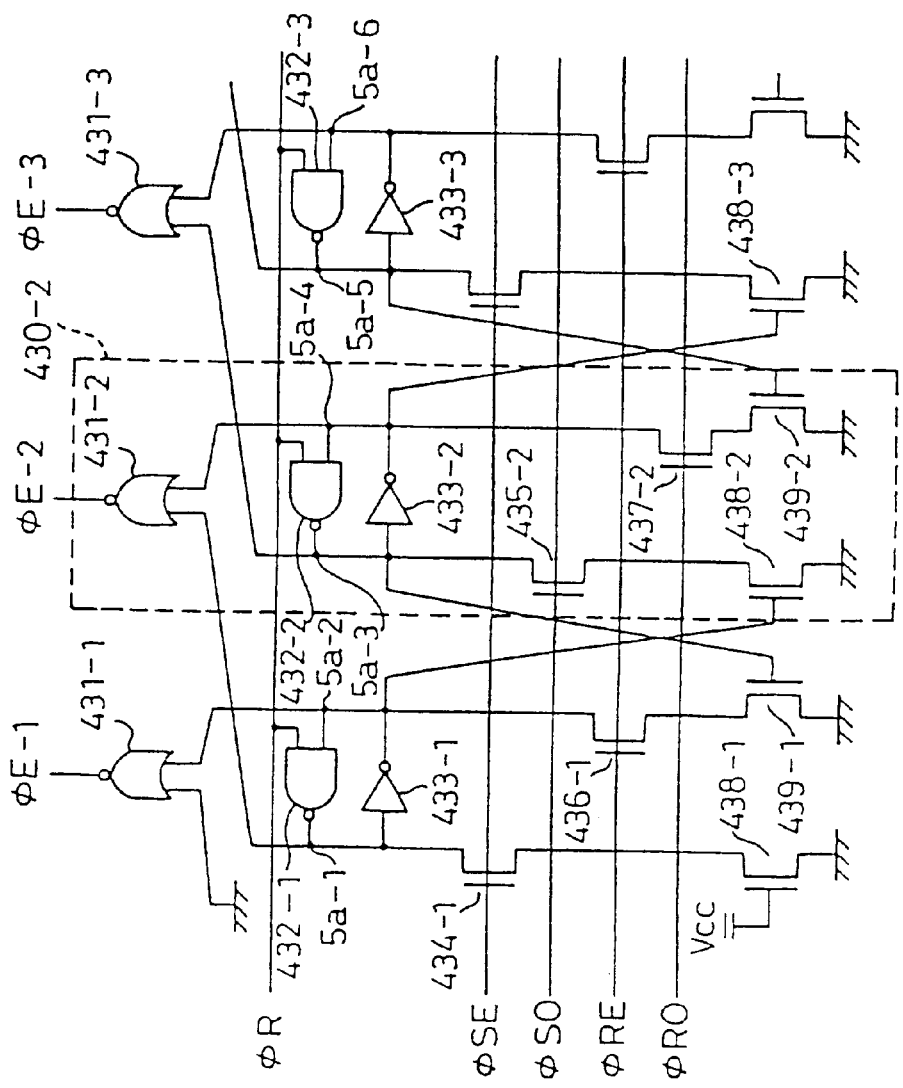
FIG. 14 is a circuit diagram of a delay control circuit used in block 3 of the device shown in FIG. 6.

FIG. 14 is a circuit diagram of an example of the delay control circuit 32 shown in FIG. 6. The delay control circuit 32 has unit delay control circuits 430-2 equal in number to the stages of each of the delay circuit 33 and the dummy delay circuit 34. The output signals of the respective stages of the unit delay control circuits 430-2 serve as the aforementioned enable signals φE applied to the respective stages of each of the delay circuit 33 and the dummy delay circuit 34.

The unit delay control circuit 430-2 includes a flip-flop made up of a NAND gate 432-2 and an inverter 433-2, a NOR gate 431-2, and transistors 435-2, 437-2, 438-2 and 439-2. The transistors 435-2 and 438-3 are connected in series, and are located on one side of the flip-flop. The transistors 437-2 and 439-2 are connected in series, and are located on the other side of the flip-flop. The gate of the transistor 438-2 is connected to a node 5a-2 of the unit delay control circuit located at the previous stage. The gate of the transistor 439-2 is connected to a node 5a-5 of the unit delay element located at the following stage. A set signal φSE used for the count-up operation is applied to the corresponding transistor of each of the even-numbered stages. Another set signal φSO used for the count-up operation is applied to the corresponding transistor of each of the odd-numbered stages. A reset signal φRE used for the count-down operation is applied to the corresponding transistor of each of the even-numbered stages. Another reset signal φRO used for the count-down operation is applied to the corresponding transistor of each of the odd-numbered stages.

As shown in FIG. 14, the set signal φSO is applied to the gate of the transistor 435-2 of the unit delay control circuit 430-2 located at the center and assigned an odd number. The reset signal φRO is applied to the gate of the transistor 437-2 of the unit delay control circuit 430-2. The set signal φSE and the reset signal φRE are applied to the two unit delay control circuits at both sides of the unit delay control circuit 430-2. The NOR gate 431-2 is supplied with a signal obtained at a node 5a-l of the previous stage and a signal obtained at a node 5a-4 of the circuit 430-2. A signal φR is used to reset the unit delay control circuits. The signal φR is temporarily set to the low level, and is then maintained at the high level.

Figure 15:
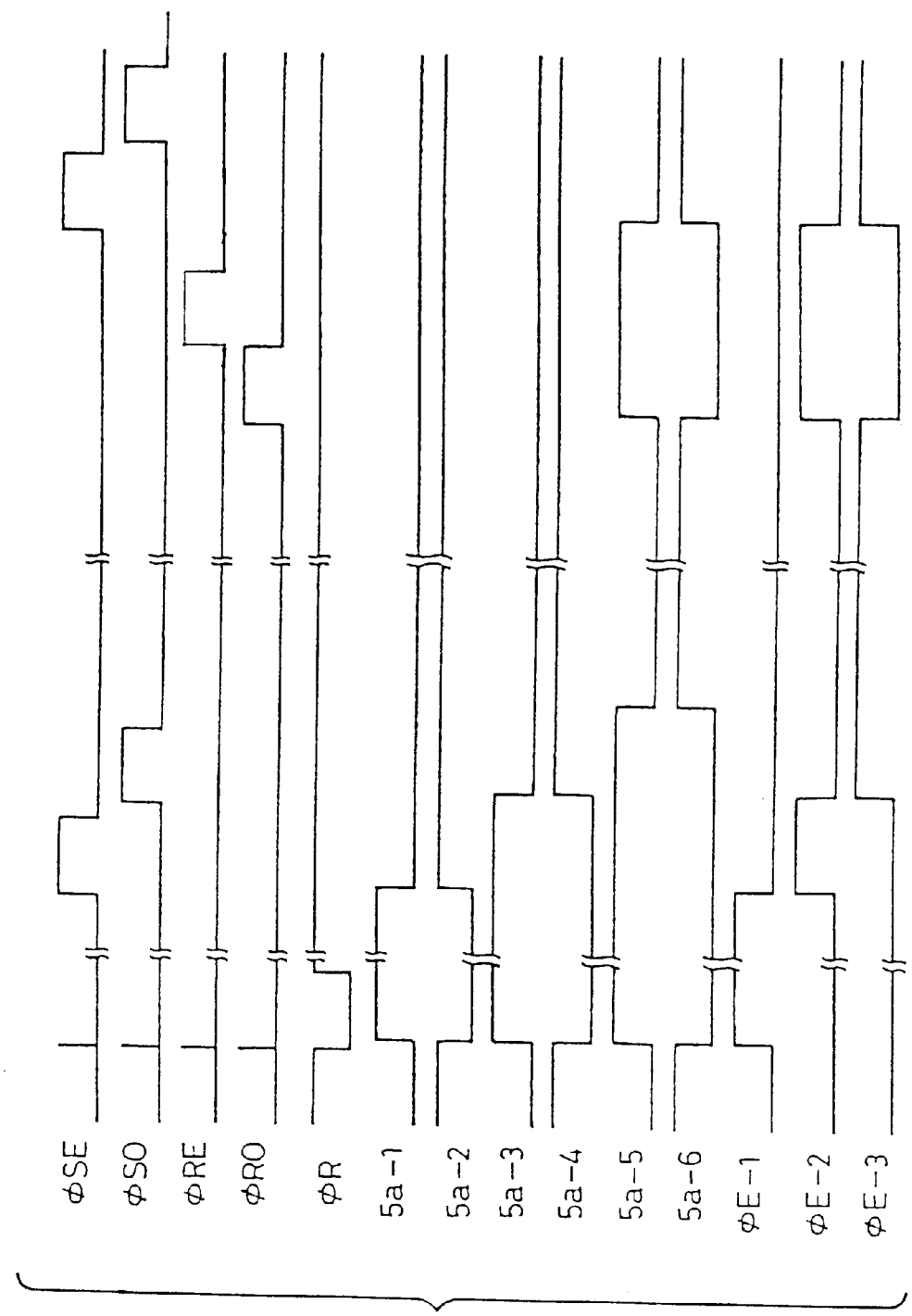
FIG. 15 is a timing chart of an operation of the delay control circuit shown in FIG. 14.

FIG. 15 is a timing chart of an operation of the delay control circuit 32. First, the reset signal φR is temporarily set to the low level. Hence, the nodes 5a-1, 5a-3 and 5a-5 are set to the high level, and the nodes 5a-2, 5a-4 and 5a-6 are set to the low level. When the count-up operation is carried out, the count-up signals (set signals) φE and φO alternatively switch to the high and low levels.

When the set signal φSE switches from the low level to the high level, the node 5a-1 is grounded and becomes low, while the node 5a-2 is switched to the high level. When the node 5a-2 is switched to the high level, the enable signal φE-1 is switched to the low level from the high level. This is latched by the flip-flop. Hence, even if the set signal φSE is returned to the low level, the enable signal φE-1 is maintained at the low level. When the node 5a-1 is switched to the low level, the enable signal φE-2 is switched to the high level from the low level. Since the node 5a-2 is switched to the high level, the transistor 438-2 is turned ON. When the set signal φSO switches from the low level to the high level, the node 5a-3 is grounded and becomes low, while the node 5a-4 is switched to the high level. Hence, the enable signal φE-2 is switched to the low level from the high level. This is latched by the flip-flop. Hence, even if the set signal φSO is returned to the low level, the enable signal φE-2 is maintained at the low level.

When the node 5a-3 is switched to the low level, the enable signal φE-3 is switched to the high level from the low level. When the set signals φSE and φSO alternately switch to the high and low levels, the enable signal φE set to the high level shifts rightwards. Hence, if the comparison result of the phase comparator circuit 31 indicates the delay amount should be increased, the set signals φSE and φSO are alternately switched to the high level.

When the set signals φSE and φSO and the reset signals φRE and φRO are all maintained at the low level, the stage which outputs the high-level enable signal φE is fixed. Hence, if the comparison result of the phase comparator circuit 31 indicates that the current delay amount should be maintained, the set signals φSE and φSO and the reset signals φRE and φRO are all maintained at the low level.

When the count-down operation is carried out, the reset signals φRE and φRO are alternately input. Hence, the high-level enable signal φE shifts leftwards.

In the above manner, the delay control stage circuit which outputs the high-level enable signal φE can be made to shift rightwards or leftwards one by one. The high-level enable signals φE thus generated are applied to the unit delay elements, and one of the signals φE is set to the high level. Hence, the delay control can be performed with the precision of the unit delay time.

A description will now be given of the phase comparator circuit 31 shown in FIG. 6. The phase comparator circuit 31 includes a phase comparator part shown in FIG. 16, and an amplifier part shown in FIG. 18.

Figure 16:
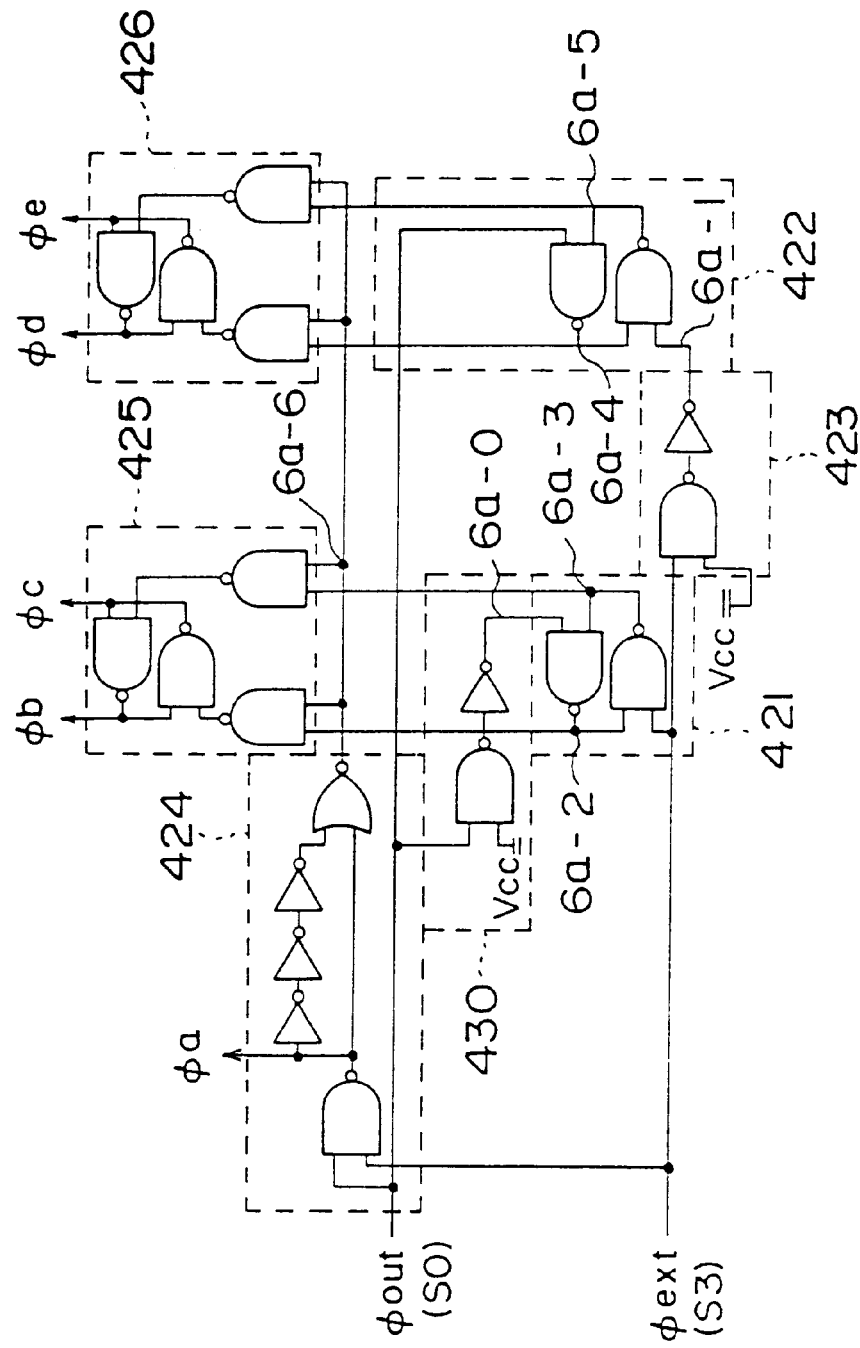
FIG. 16 is a circuit diagram of a phase comparator part of a phase comparator circuit used in block 3 of the device shown in FIG. 6.

In FIG. 16, φout and φext correspond to the output signal (S0) and the external clock signal (S3), respectively. The phase of the signal φout is detected with respect to the signal φext. Symbols φa through φe denote signals shown in FIG. 16, which are supplied to the amplifier part shown in FIG. 18.

As shown in FIG. 16, the phase comparator part of the phase comparator circuit 31 includes flip-flops 421 and 422, latch circuits 425 and 426, a circuit 424, a delay circuit 423, and a delay circuit 430. Each of the flip-flops 421 and 422 is made up of two NAND gates. The latch circuits 425 and 426 latch the states of the flip-flops 421 and 422; respectively. The circuit 424 generates an activating signal which activates the latch circuits 425 and 426. The delay circuit 423 delays the external clock signal φext by the unit delay amount. The delay circuit 430 delays the signal φout by the unit delay amount. The flip-flop 421 performs the phase comparing operation within the range between −td and 0.

The flip-flop 422 performs the phase comparing operation within the range between 0 and +td.

FIG. 17A shows a case where the signal φout leads, over td, to the signal φext serving as the reference for the comparing operation. In this case, the signal φout switches to the high level before the signal φext switches to the high level. When the signals φout and φext are both low, the nodes 6a-2, 6a-3, 6a-4 and 6a-5 of the flip-flops 421 and 422 are all high.

When the signal φout switches from the low level to the high level, the node 6a-4 is switched to the low level, and the node 6a-0 i switched to the high level with the unit delay (td). Hence, the node 6a-2 is switched to the low level. Thereafter, the signal φext switches to the high level, and the node 6a-1 is switched to the high level with the unit delay. At this time, the potentials of the two output terminals of each of the flip-flops 425 and 426 (that is, the potentials of the nodes 6a-2, 6a-3, 6a-4 and 6a-5) have been already settled. Hence, no changes of the states of the flip-flops 425 and 426 take place. Hence, the nodes 6a,-2, 6a-3, 6a-4 and 6a-5 are respectively low, high, low and high.

When the external clock signal φext changes from the low level to the high level, the output signal φa of the circuit 424 is switched to the high level, and the pulse is temporarily applied to the node 6a-6. This node 6a-6 is the input of the latch circuit 425 and the input of the NAND gate 426. Hence, the NAND gate 426 is temporarily activated, and the latch circuits 425 and 426 latch the potentials of the output terminals of the flip-flops 421 and 422. Finally, the output signals φb, φc, φd and φe are respectively high, low, high and low.

FIG. 17B shows a case where the signals φout and φext have almost the same phase (within ±td) as each other and switch to the high level at almost the same times. When the signal φout switches to the high level within the time difference between the rising of the signal φout and the rising of the potential at the node 6a-1, the node 6a-3 of the flip-flop 421 is switched to the high level because the signal φext switches to the high level. The node 6a-1 of the flip-flop 422 is continuously low, and thus the node 6a-4 is switched to the low level. Thereafter, the node 6a-1 is switched to the low level. At this time, the state of the flip-flop 422 has been settled, and no change of the state thereof does not occur. Then, the node 6a-6 is temporarily switched to the high level, and thus the latch circuits 425 and 426 latch the states of the flip-flops 421 and 422. Hence, the output signals φb, φc, φd and φe are respectively low, high, high and low.

FIG. 17C shows a case where the signal φout lags, over td, behind the signal φext, and switches to the high level after the signal φext switches to the high level. In this case, the states of the flip-flops 421 and 422 are changed, and the nodes 6a-3 and 6a-5 are switched to the low level. Finally, the signals φb, φc, φd and φe are respectively low, high, low and high.

In the above-mentioned manner, it is possible to detect three cases shown in FIGS. 17A, 17B and 17C. The three cases are indicated by using the signals φb, φc, φd and φe, which are then used to determine which one of the count-up operation, count-down operation and no-count operation should be carried out in the delay control circuit 32.

Figure 18:
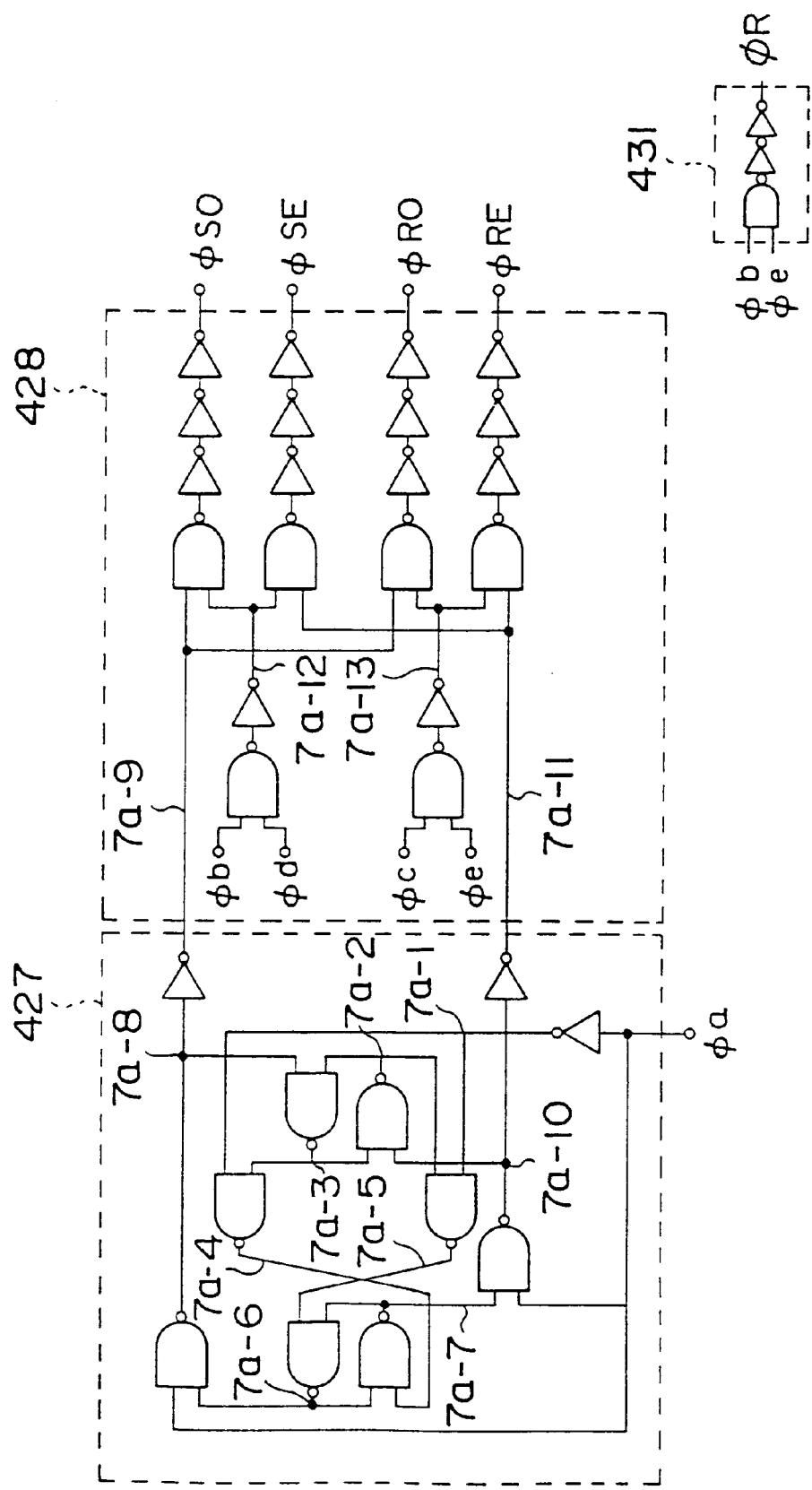
FIG. 18 is a circuit diagram of an amplifier part of the phase comparator circuit used in the device shown in FIG. 6.

Referring to FIG. 18, the amplifier part of the phase comparator circuit 31 includes a JK flip-flop 427, and an amplifier 428 made up of NAND gates and inverters. The JK flip-flop 427 is supplied with the output signal φa from the phase comparator part shown in FIG. 16. The potentials of nodes 7a-9 and 7a-11 depend on the output signal φa. The amplifier 428 receives the two output signals of the JK flip-flop 427 and the output signals φb–φe, and generate the set signals φSE and φO and the reset signals φRE and φRO. The amplifier part shown in FIG. 18 also include a circuit 431, which produces the reset signal φR from the signals φb and φe. If the signal φout leads to or lags behind the signal φext over ±td, the reset signal φR is high. In the other cases, the reset signal OR is low.

Figure 19:
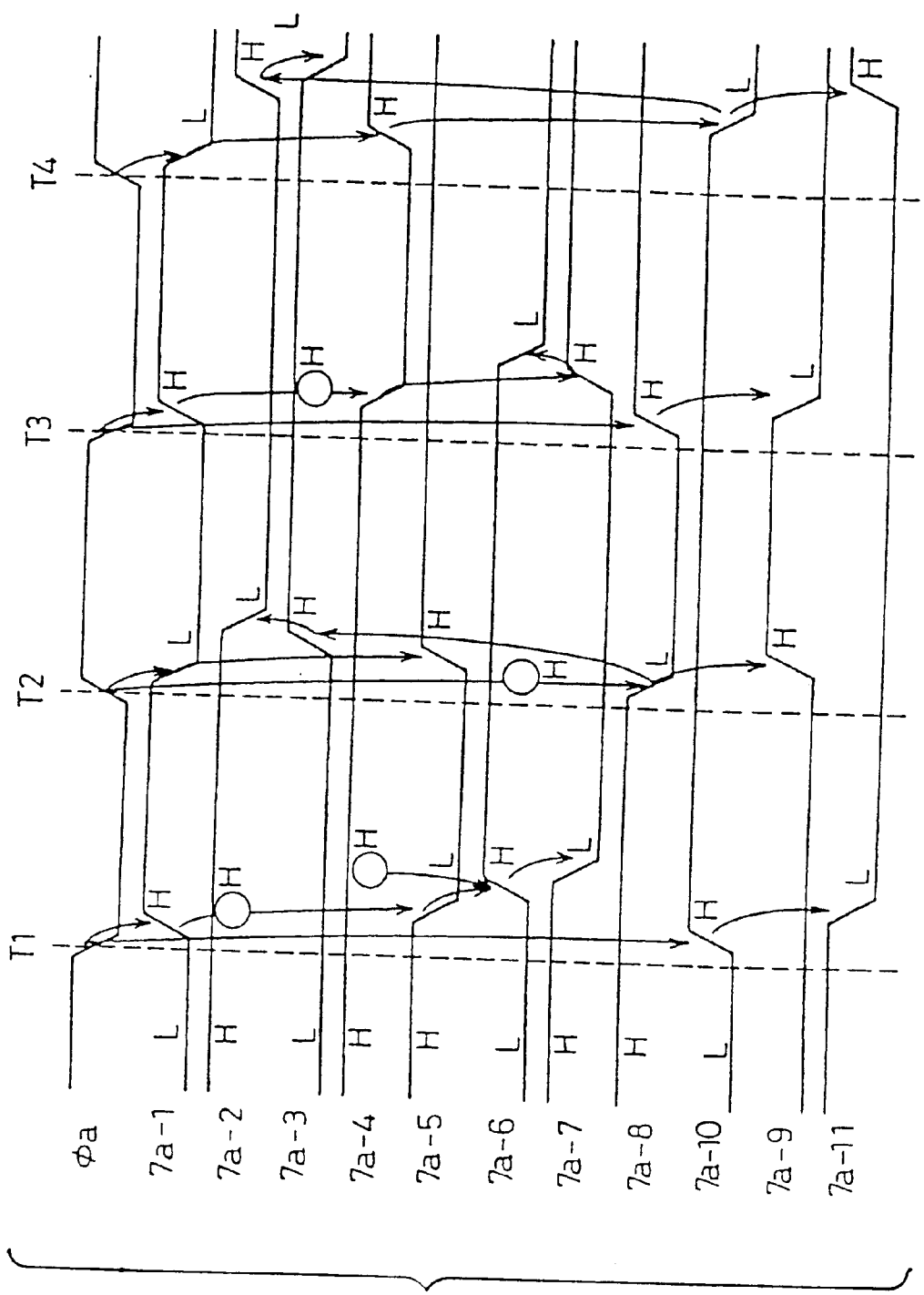
FIG. 19 is a timing chart of an operation of a JK flip-flop used in the amplifier part shown in FIG. 18.

The JK flip-flop 427 operates as shown in FIG. 19. When the signal φa is switched to the low level at time T1, the nodes 7a-1 and 7a-10 are switched to the high level. When the node 7a-1 is switched to the high level, the potentials of the nodes 7a-5, 7a-6 and 7a-7 are changed. However, the signal φa is low, and thus the potential of the node 7a-8 is not changed. Hence, the potential of the node (output) 8a-9 is not changed, only the node 7a-11 is changed from the low level to the high level. When the signal φa is changed from the low level to the high level at time T2, the node 7a-8 is changed from the high level to the low level, and the potential of the node 7a-10 is not changed because the potential of the node 7a-7 is not changed. The output node 7a-9 is changed from the low level to the high level, and the potential of the output node 7a-11 is not changed. In the above manner, the output nodes 7a-9 and 7a-11 the JK flip-flop circuit 427 are alternately switched to the high level and the low level in synchronism with the signal φa.

Figure 20:
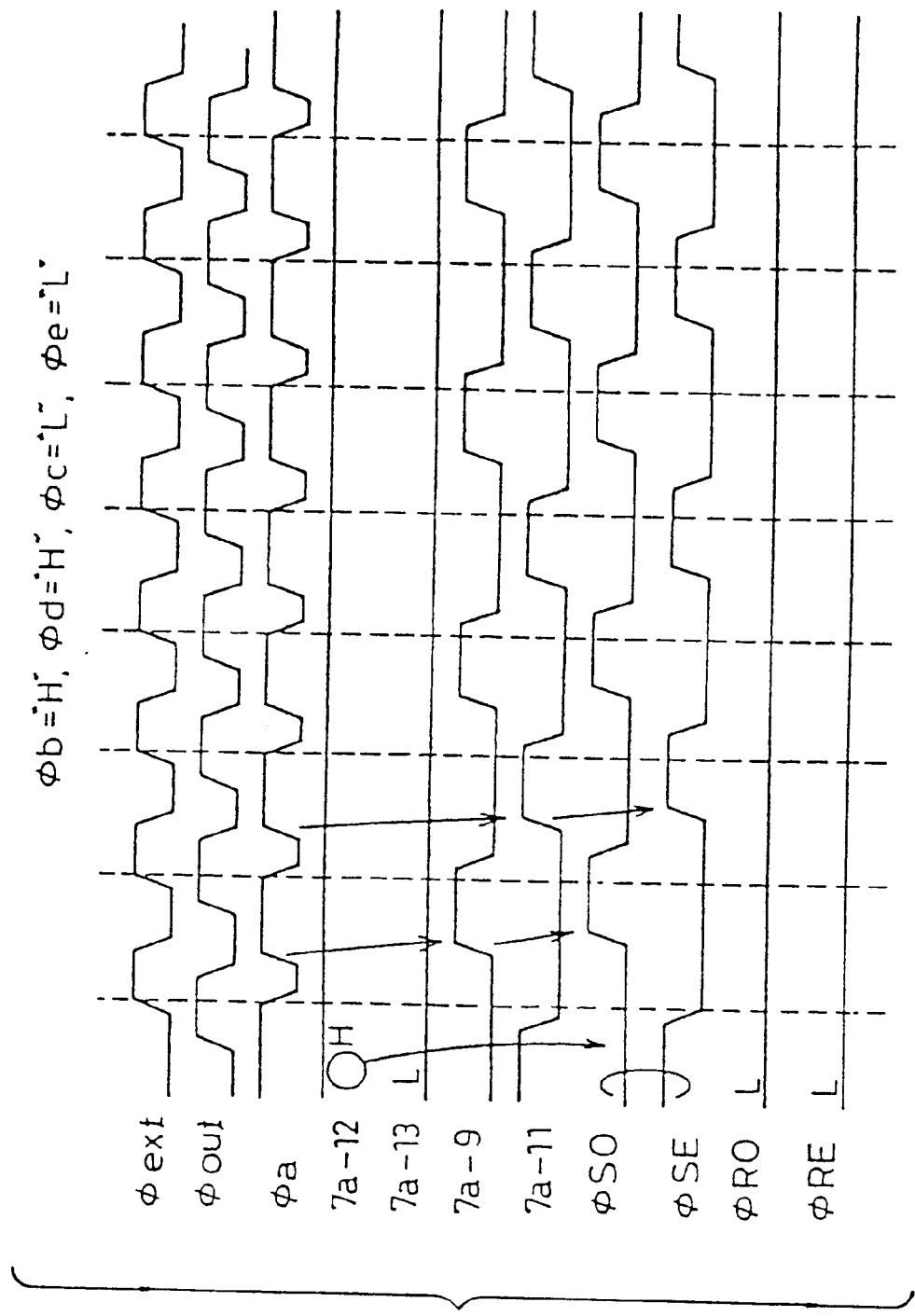
FIG. 20 is a timing chart of an operation of the amplifier part which is carried out when a count-up operation is performed.
Figure 21:
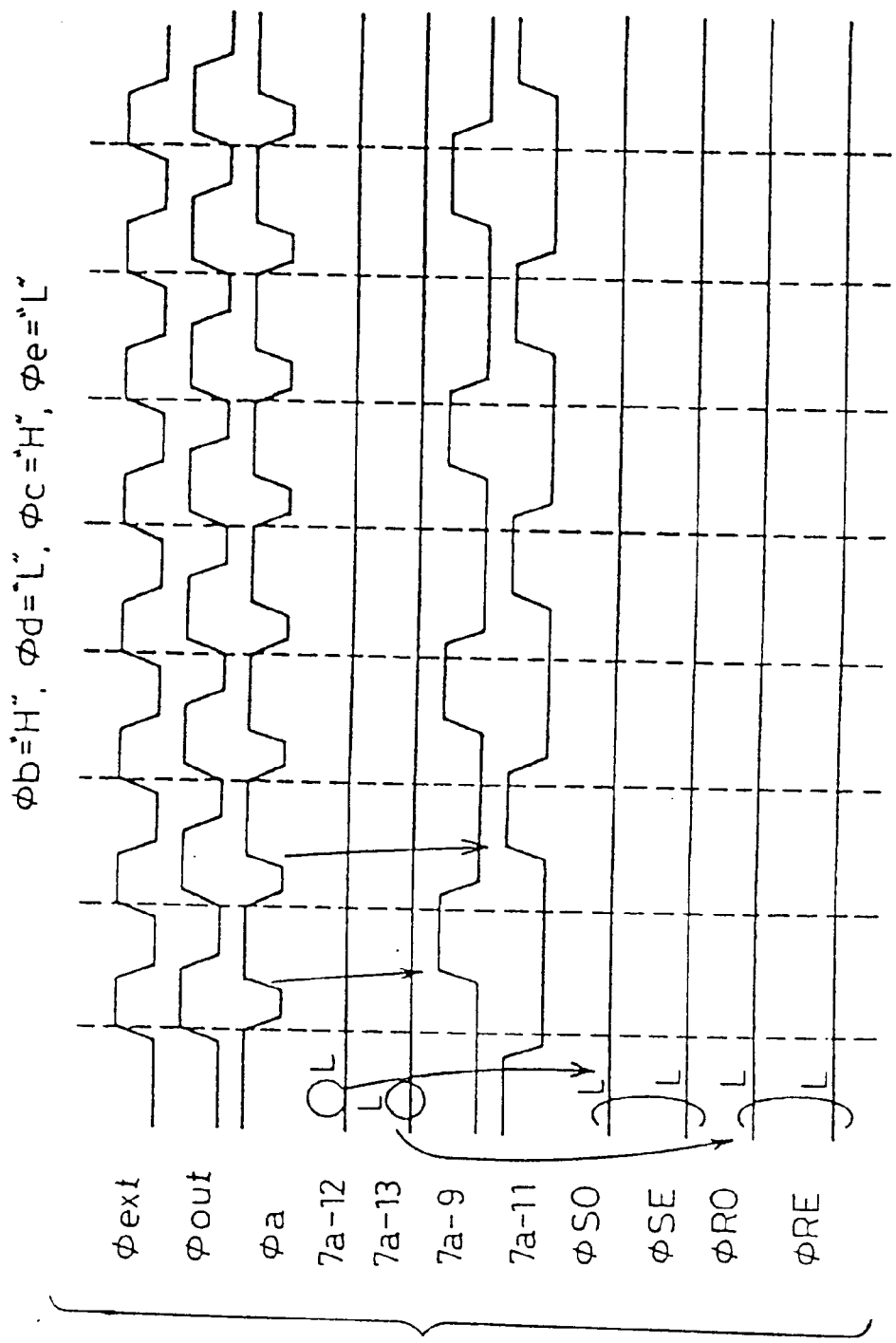
FIG. 21 is a timing chart of an operation of the amplifier part which is carried out when no count operation is carried out.
Figure 22:
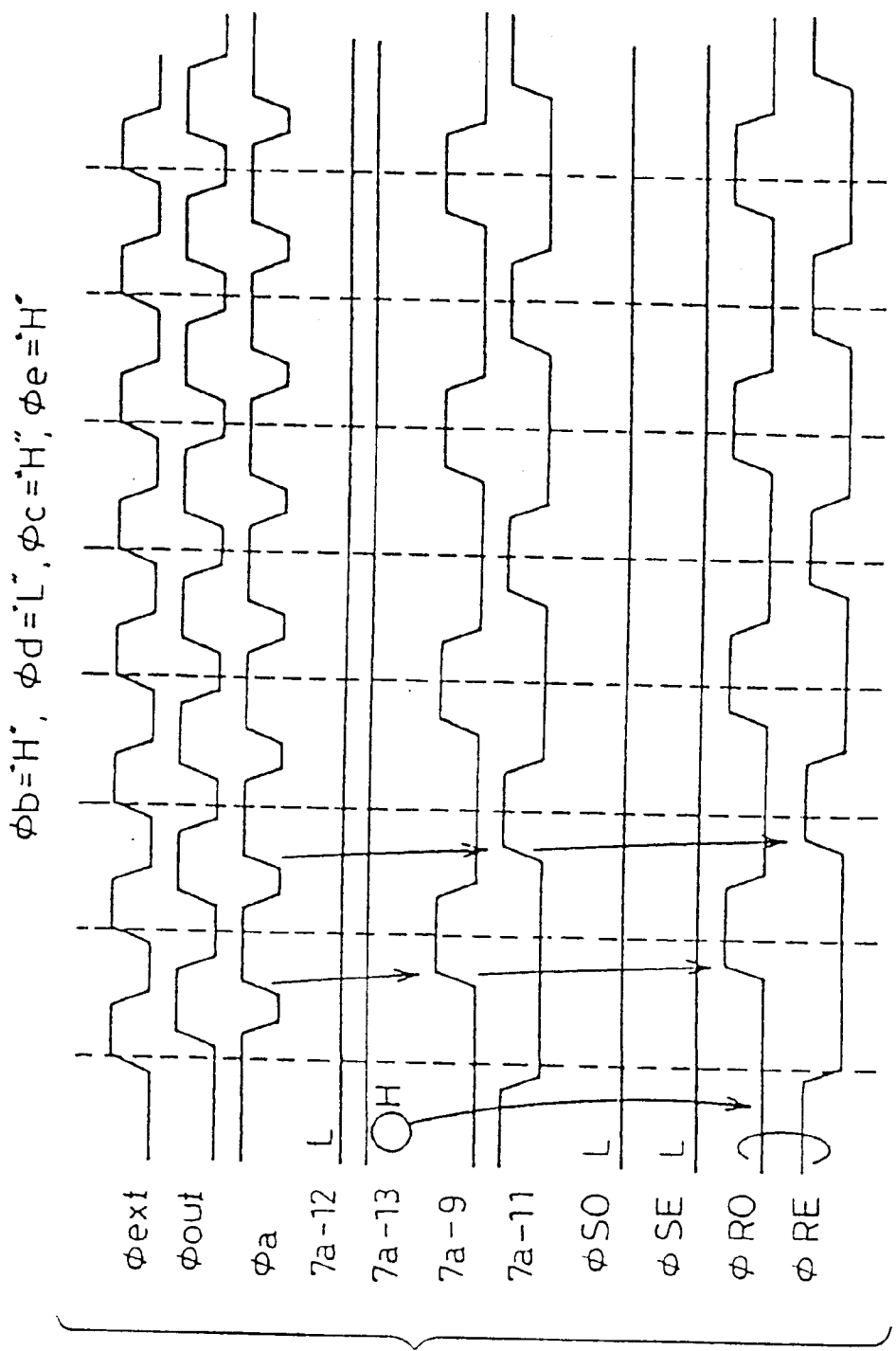
FIG. 22 is a timing chart of an operation of the amplifier part which is carried out when a count-down operation is performed.

FIG. 20 is a timing chart of an operation of the aforementioned amplifier part 428 which should be performed when the count-up operation is required. FIG. 21 is a timing chart of an operation of the amplifier part 428 which should be performed which no count operation is required. FIG. 22 is a timing chart of an operation of the amplifier part 428 which should be performed when the count-down operation is required. A description will now be given, with reference to FIGS. 20 through 22, of the operations of the amplifier part 428.

FIG. 20 shows a case where the signal φout switches to the high level before the signal φext switches to the high level. In this case, the signals φb, φc, φd and φe applied to the amplifier part 428 are high, low, high and low, respectively. The node 7a-12 is switched to the high level and the node 7a-13 is fixed to the low level. The set signals φSO and φSE are changed in accordance with the JK flip-flop 427, while the reset signals φRO and φRE are not changed because the potential of the node 7a-13 is low.

FIG. 21 shows a case where the signals φout and φext are switched to the high level at almost the same time. In this case, the signals φb, φc, φd and φe applied to the amplifier part 428 are low, high, high and low, respectively. The nodes 7a-12 and 7a-13 are fixed to the low level. Hence, the set signals φSE and φSO and the reset signals φRE and φRO are fixed to the low level.

FIG. 22 shows a case where the signal φout switches to the high level after the signal φext switches to the high level. In this case, the signals φb, φc, φd and φe applied to the amplifier part 428 are low, high, low and high, respectively. The node 7a-12 is fixed to the low level, and the node 7a-13 is fixed to the high level. Hence, the reset signals φRE and φRO are changed in accordance with the state of the JK flip-flop 427, while the set signals φSE and φSO are not changed because the node 7a-13 is low.

A description will now be given of the detail of the second DLL circuit 10.

Figure 23:
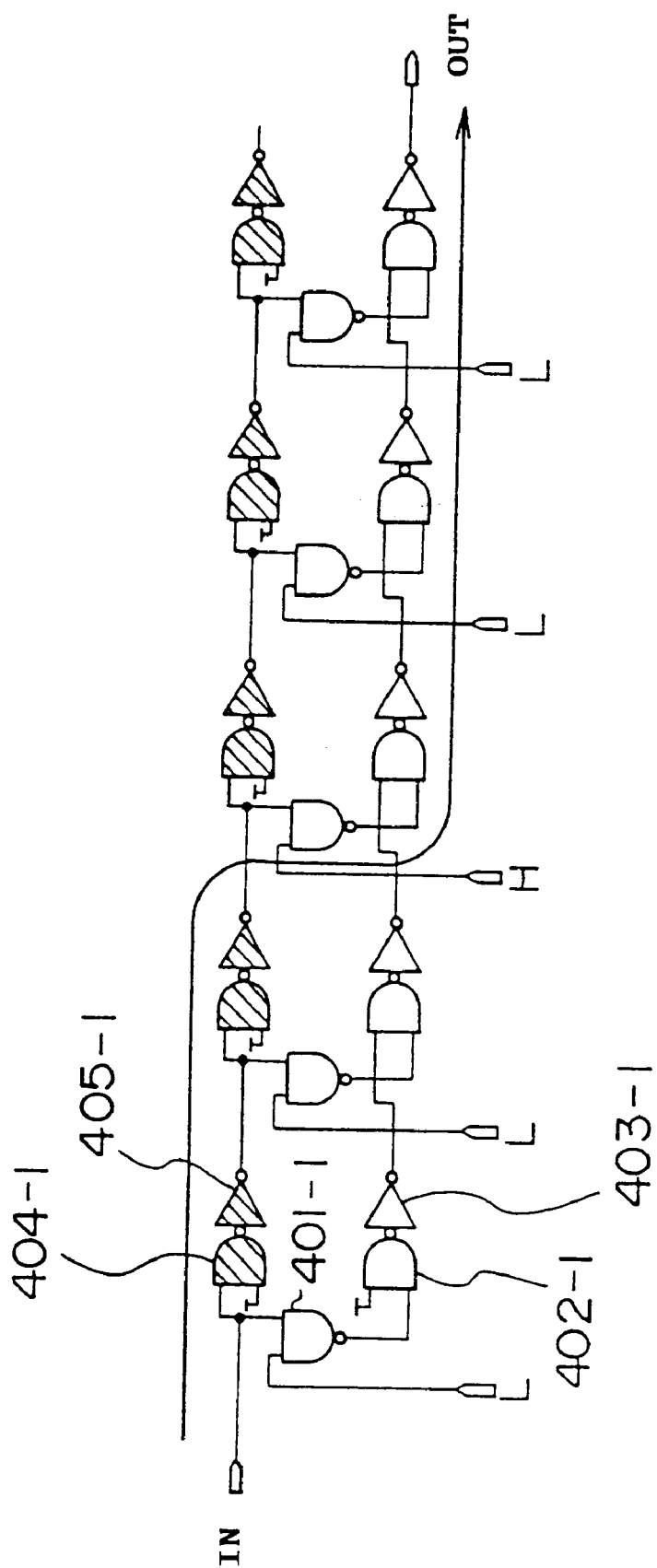
FIG. 23 is a circuit diagram of a configuration of a fine delay circuit used in the device shown in FIG. 6.

FIG. 23 is a circuit diagram of an example of the fine delay circuit 12 built in the second DLL circuit 10. The fine delay circuit 12 includes a plurality of stages, and each of the stages includes, in addition to the aforementioned NAND gates 401-1, 402-1 and the inverter 403-1, a NAND gate 404-1 and an inverter 405-1. Hence, each stage has two delay lines. The logic elements illustrated with hatching, that is, the NAND gate 404-1 and the inverter 405-1 make it possible to realize the delay control with a precision finer than the unit delay amount (for example, 200 ps) of the unit delay element made up of the NAND gate 402-1 and the inverter 403-1. The difference between the delay amounts of the two delay lines is due to the difference between the delay caused by the NAND gate 402-1 and the inverter 403-1 and the delay caused by the NAND gate 404-1 and the inverter 405-1. The above difference corresponds to the precision of the fine delay circuit 12.

In FIG. 23, the input signal IN passes through two unit delay elements illustrated with hatching, the NAND gate 401-1 located at the center and three unit delay elements illustrated without hatching. If only the NAND gate 401-1 located at the right-hand side of the above NAND gate 401-1 is opened, the input signal IN passes through three unit delay elements illustrated with hatching, the NAND gate 401-1 and two unit delay elements illustrated without hatching. The difference between the delay amounts of the above two cases is equal to the difference between the delay of the unit delay element with hatching and the delay of the unit delay element without hatching. If the unit delay element made up of the NAND gate 402-1 and the inverter 403-1 has a delay amount of 200 ps, and the unit delay element made up of the NAND gate 404-1 and the inverter 405-1 has a delay amount of 260 ps, the difference is 60 ps, which is the precision of the fine delay circuit 12. Hence, selecting the NAND gate 401 to be opened, it is possible to obtain delay amounts of 60 ps, 120 ps, 180 ps and 240 ps. Even if the input signal passes through any route, each route includes only one NAND gate 401. Hence, the presence of the NAND gate 401 does not affect the difference between the delay amounts of the two unit delay elements. The operation shown in FIGS. 8 and 9 (−300 ps to 300 ps) can be realized by the fine delay circuit 12 which has 11 stages.

It is possible to realize the unit delay elements having different delay amounts in various manners. For example, NAND gates and inverters having different characteristics are used to form the two unit delay elements. When NAND gates and inverters having identical characteristics are used, different power supply voltages are applied thereto. It is also possible to obtain different delay amounts even if the NAND gates and inverters have the same characteristics and the same power supply voltage is employed. In this case, the different delay amounts result from the difference in the fan-out. It will now be assumed that all the NAND gates shown in FIG. 23 have an identical characteristic and all the inverters shown therein have an identical characteristic. In this case, the fan-out of the inverter 405-1 is 2, while the fan-out of the inverter 403-1 is 1. In this case, a difference equal to 60–70 ps can be obtained.

The fine dummy delay circuit 13 has the same configuration as that of the dummy delay circuit 12.

The fine phase comparator circuit 14 employed in the second DLL circuit 10 is the same as the phase comparator circuit 31 shown in FIGS. 16 and 18 except for the following. The difference between the circuits 10 and 31 is illustrated in FIG. 24.

Figure 24:
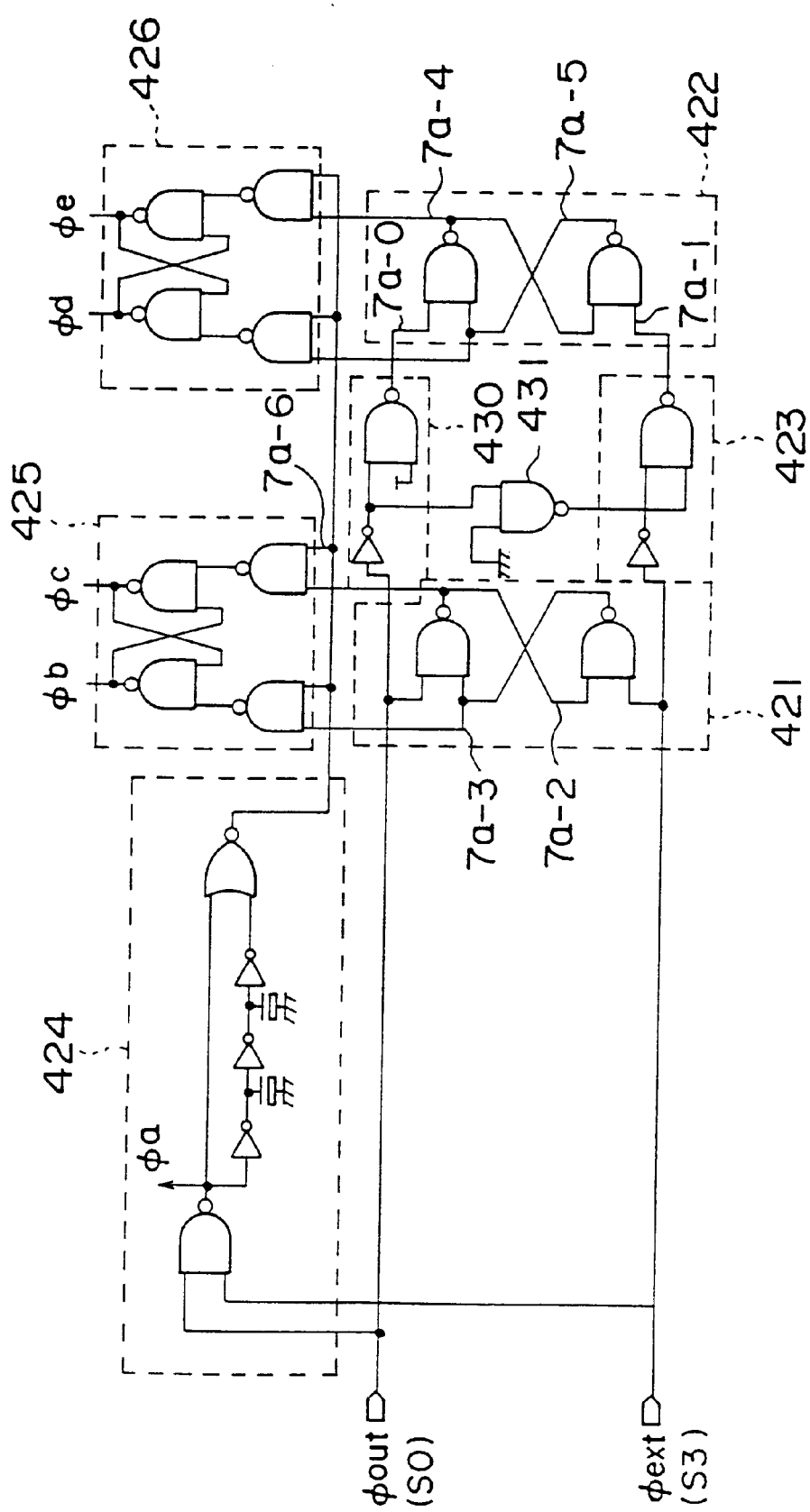
FIG. 24 is a circuit diagram of a phase comparator part of a phase comparator circuit employed in block 10 shown in FIG. 6.

FIG. 24 shows a phase comparing part of the fine phase comparator circuit 14. The delay circuit 430 made up of one NAND gate and one inverter is provided between the flip-flops 421 and 422. A NAND gate 431 is provided between the delay circuits 430 and 423. The output signal of the inverter of the delay circuit 430 is input to the NAND gate of the delay circuit 423 via the NAND gate 431.

The delay circuits 423 and 430 have the same configuration as the unit delay element of the fine delay circuit 12. The fan-out of the inverter of the delay circuit 423 is 1, while the fan-out of the inverter of the delay circuit 430 is 2 due to the presence of the NAND gate 431. That is, the load of the inverter of the delay circuit 430 is greater than that of the inverter of the delay circuit 423. By providing the delay circuits 423 and 430 thus configured between the flip-flops 421 and 422, it is possible to determine whether the signals S0 (φout) and S3 (φext) have a phase difference within the range between 0 and td'.

The other parts of the fine phase comparator circuit 14 are the same as corresponding those of the phase comparator circuit 31 shown in FIGS. 16 and 18.

Figure 25:
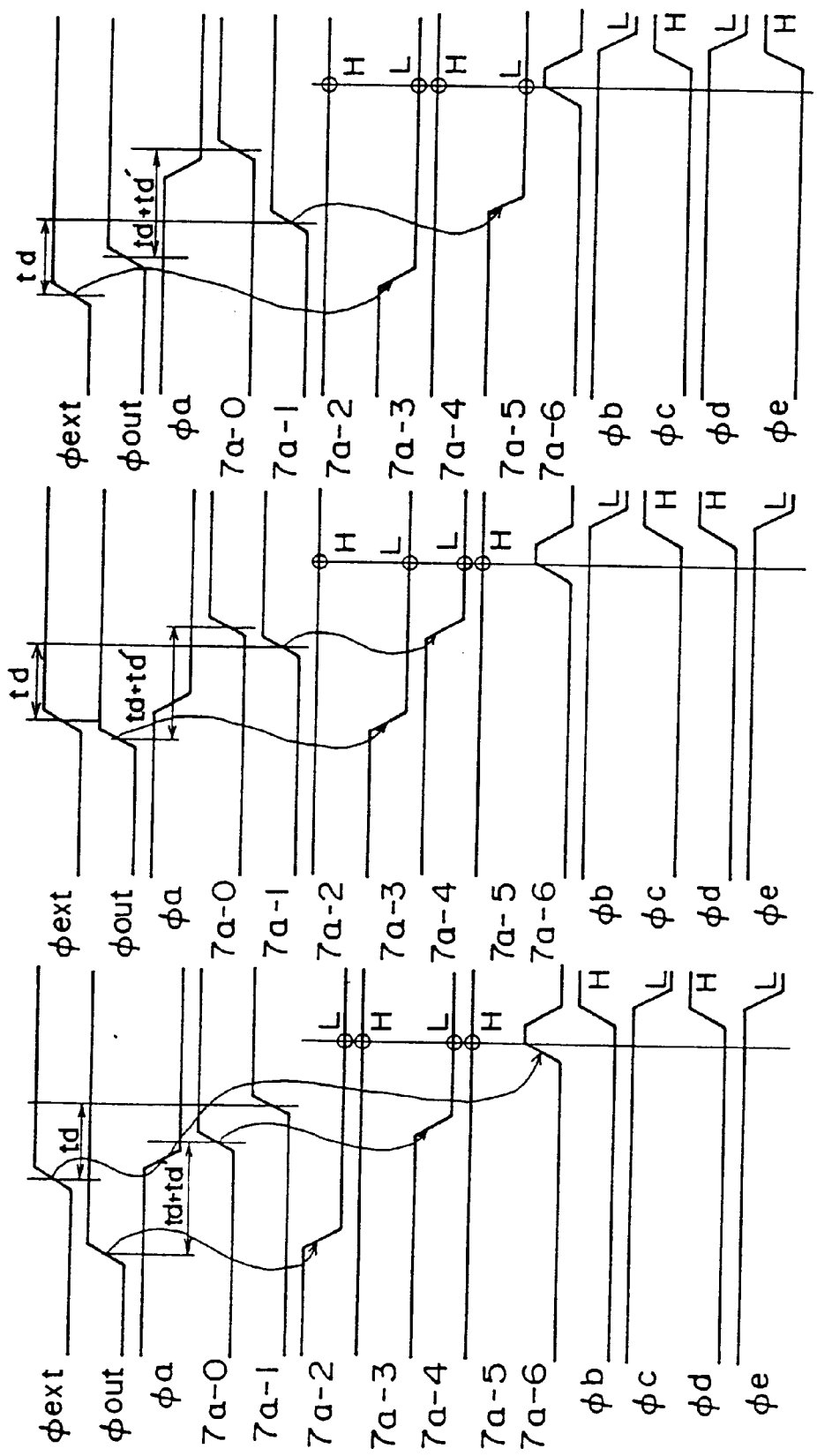
FIGS. 25A, 25B and 25C are timing charts of operations of the phase comparator circuit shown in FIG. 24.

FIGS. 25A, 25B and 25C are timing charts of operations of the fine phase comparator circuit 14.

Referring to FIG. 25A, which shows an operation which is carried out when the count-up operation should be carried out. When the signal φout switches from the low level to the high level, the node 7a-2 is switched to the low level. Due to the function of the delay circuit 430, the node 7a-0 is switched to the high level with a delay equal to td+td' from the time when the signal φout switches to the high level. Then, the signal φext switches to the high level, and the node 7a-1 is switched, due to the function of the delay circuit 423, to the high level with a delay equal to td from the time when the signal φext switches to the high level. The nodes 7a-3 and 7a-5 are maintained at the high level. Hence, in response to the potential change of the node 7a-6, the signals φb, φc, φd and φe are high, low, high and low, respectively.

FIG. 25B shows a case when no count operation is required. In this case, the phase difference between the signals φout and φext falls within the range of 0 to td'. The signals φb, φc, φd and φe are low, high, high and low, respectively, as shown in FIG. 25B.

FIG. 25C shows a case where the count-down operation is required. In this case, the signals φb, φc, φd and φe are low, high, low and high, respectively.

Figure 26:
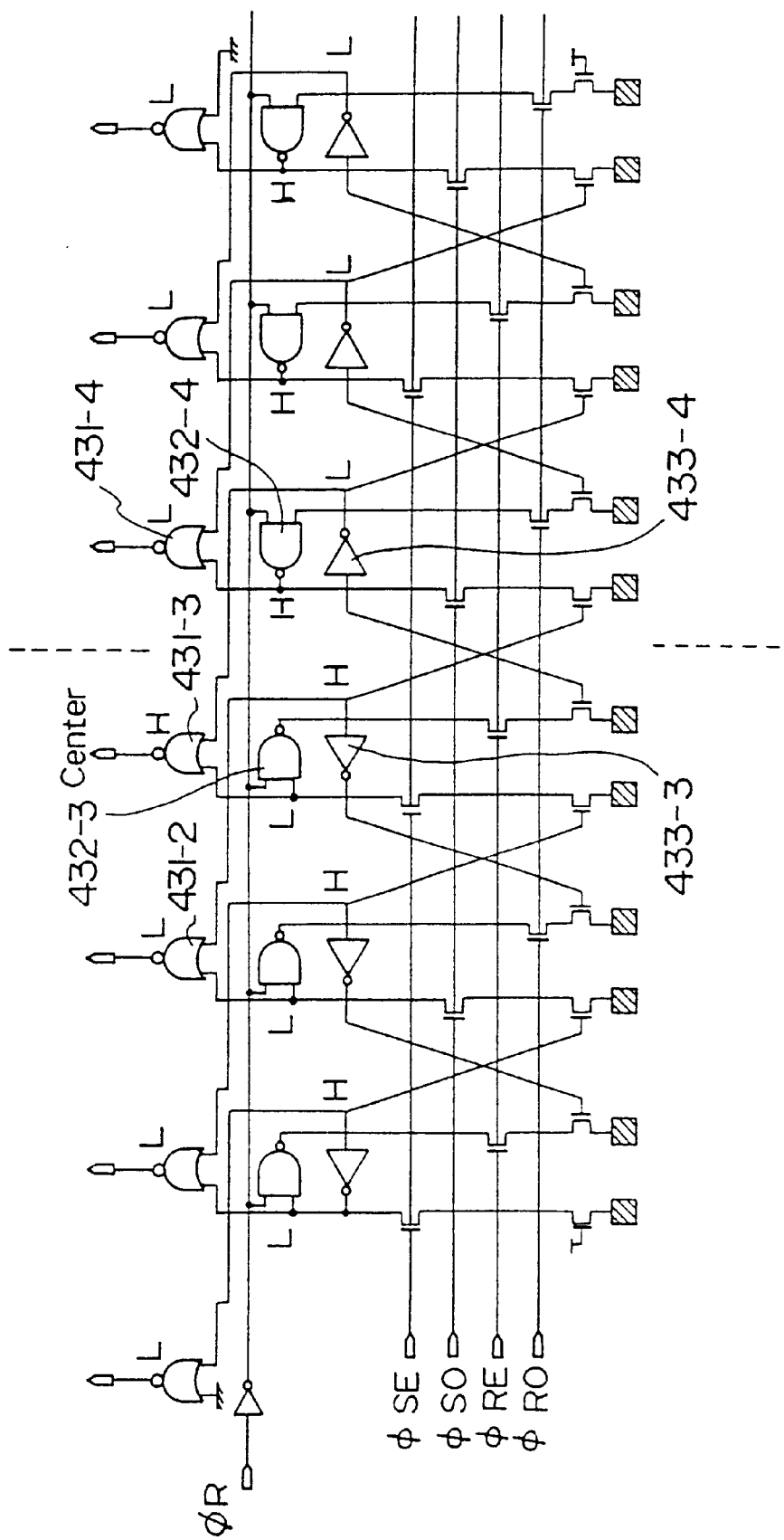
FIG. 26 is a circuit diagram of a delay control circuit employed in block 10 shown in FIG. 6.

FIG. 26 is a circuit diagram of the delay control circuit 15. A left-side part of the circuit with respect to the central broken line is the same as that shown in FIG. 14. A right-side part of the circuit slightly differs from the left-side part. This is directed to resetting the fine delay circuit 12 and the fine dummy delay circuit 13 to the respective center positions when the delay control circuit 15 receives the reset signal φR from the phase comparator circuit 31. In this case, only the corresponding NOR gate outputs the high-level signal. The output signal of the NAND gate 432-3 close to the broken line is input to the NOR gate 431-2 of the previous stage. The output signal of the inverter 433-3 is input to the NOR gate 431-3. The output signal of the NAND gate 432-4 close to the broken line is input to the NOR gate 431-4, and the output signal of the inverter 433-4 is input to the NOR gate 431-3. When the reset signal φR becomes active (switches to the high level), nodes have potentials as shown in FIG. 26. Hence, the high level signal is supplied from only the NOR gate 431-3 corresponding to the center positions of the delay lines of the fine delay circuit 12 and the fine dummy delay line 13. In this case, the other NOR gates output the low-level signals.

The shift operation of the delay control circuit 15 shown in FIG. 26 is the same as that which has been described with reference to FIGS. 14 and 15.

It will be desirable to consider the following matters in the practical circuit configuration. For example, when MOS transistors are used to form the NAND gates of the flip-flops 421 and 422 of the phase comparator circuit 31 and the phase comparator part of the fine phase comparator circuit 14, the following should be considered.

Figure 27:
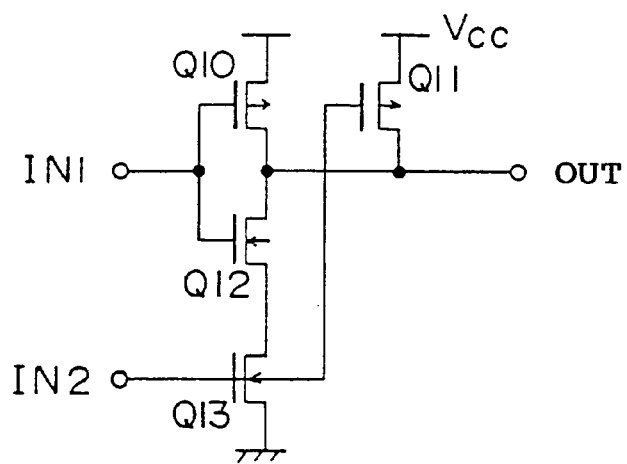
FIG. 27 is a circuit diagram of a NAND gate used to form the flip-flop

FIG. 27 is a circuit diagram of the NAND gate. The NAND gate is made up of two P-channel MOS transistors Q10 and Q11, and two N-channel MOS transistors Q12 and Q13. The source of the transistor Q10 is connected to a first power source Vcc, and the gate thereof is connected to a first input terminal IN1. The drain of the transistor Q10 is connected to an output terminal OUT. The source of the transistor Q11 is connected to the first power source Vcc, and the gate thereof is connected to a second input terminal IN2. The drain of the transistor Q11 is connected to the output terminal OUT. The source of the transistor Q12 is connected to the drain of the transistor Q13, and the gate of the transistor Q12 is connected to the first input terminal IN1. The drain of the transistor Q12 is connected to the output terminal OUT. The source of the transistor Q13 is connected to a second power source (ground), and the gate thereof is connected to the second input terminal IN2. The drain of the transistor Q13 is connected to the source of the transistor Q12.

The response between the input IN1 and the output OUT slightly differs from that between the input IN2 and the output OUT due to the above circuit configuration. When each of the flip-flops 421 and 422 is formed by two NAND gates, the two NAND gates are connected so that two input signals to each of the flip-flops are received under the same circuit condition. For example, if the set terminal of the flip-flop 421 corresponds to the terminal IN1 of the first NAND gate and receives the signal φout, the reset terminal thereof is arranged to correspond to the terminal IN1 of the second NAND gate and receive the signal φext. In this case, the other terminal of the first NAND gate corresponds to the input terminal IN2 and is connected to the output terminal of the second NAND gate to serve as the Q output terminal. The other input terminal of the second NAND gate corresponds to the input terminal IN2 and is connected to the output terminal of the first NAND gate to serve as the /Q output terminal.

If the set terminal of the flip-flop 421 corresponds to the input terminal IN2 of the first NAND gate and receives the signal φout, the reset terminal thereof is arranged to correspond to the input terminal IN2 of the second NAND gate and receive the signal φext. In this case, the other input terminal of the first NAND gate corresponds to the input terminal IN2 and is connected to the output terminal of the second NAND gate to serve as the Q output terminal. The other input terminal of the second NAND gate corresponds to the input terminal IN2 and is connected to the output terminal of the first NAND gate to serve as the /Q output terminal.

Thus, the circuit condition with respect to the signal φout is the same as that with respect to the signal φext, and a high precision can be ensured.

Figure 28:
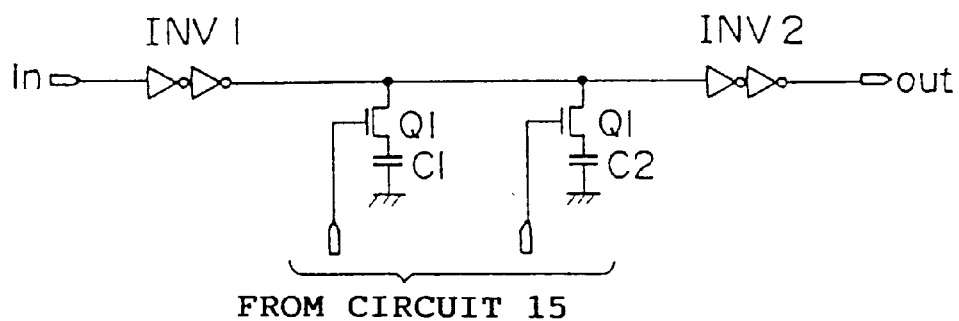
FIG. 28 is a circuit diagram of another configuration of the fine delay circuit used in block 10 shown in FIG. 6.

FIG. 28 is a circuit diagram of another configuration of the fine delay circuit 12 and the fine dummy delay circuit 13. The configuration shown FIG. 28 is made up of two stages, which include respective capacitors C1 and C2. N-channel MOS transistors Q1 and Q2, which are connected to the capacitors C1 and C2, respectively, are controlled by the phase control circuit 15. A capacitance value of 25 fF corresponds to a delay time of 50 ps, and a capacitance value of 50 fF corresponds to a delay time of 100 ps. For example, the capacitor C1 has a capacitance of 50 fF, and the capacitor C2 has a capacitance of 25 fF. Hence, it is possible to configure the fine delay circuit 12 which is finer than the delay circuit 33.

The fine delay circuit 12 can be configured by using a plurality of resistors connected in series and a plurality of switches respectively connected to the resistors in parallel. By changing the number of resistors connected between the input and output terminals of the fine delay circuit 12, the delay amount thereof can be adjusted. It is also possible to combine the resistors and capacitors together to configure the fine delay circuit 12. It will be noted that the total delay amount obtained by the configuration shown in FIG. 28 includes the delays of inverter circuits INV1 and INV2, each being made up of two inverters.

Figure 29:
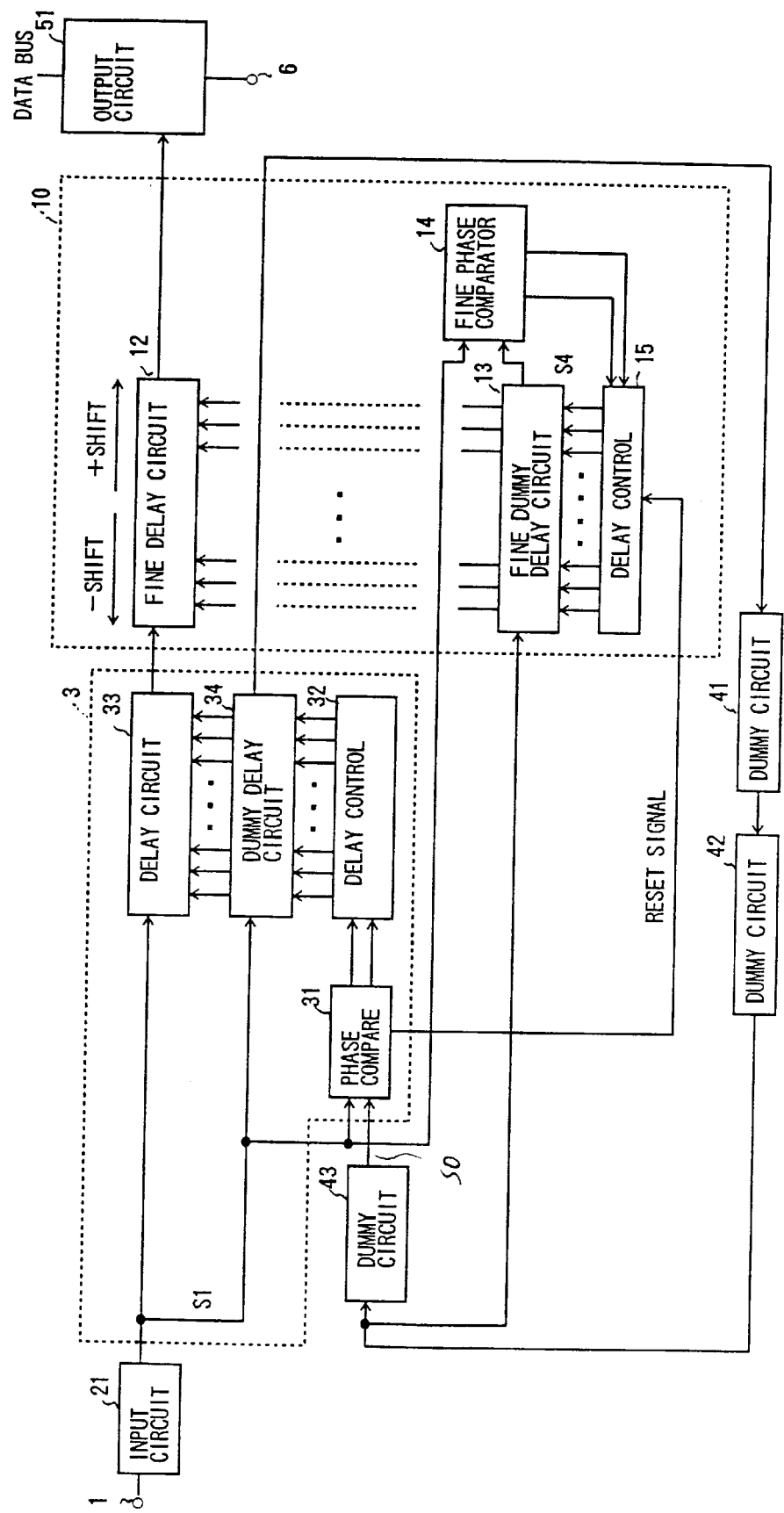
FIG. 29 is a block diagram of a variation of the device shown in FIG. 6.

FIG. 29 shows a variation of the device shown in FIG. 6. The variation shown in FIG. 29 does not have the frequency divider 30. Hence, the output signal S1 of the input circuit 21 is directly applied to the dummy delay circuit 33, the phase comparator circuit 31 and the fine phase comparator circuit 14. As has been described previously, the frequency divider 30 makes it possible to certainly execute the phase comparing operation. However, the frequency divider 30 can be omitted if the following three conditions are satisfied. The first condition is that the clock frequency is very low. The second condition is that the relative positional relationship between the clock signal from the input circuit 21 and the fed-back clock signal does not exceed one cycle. The third condition is that there is a time during which the clock signals to be compared with each other are both high. The configuration shown in FIG. 29 is designed by taking into account the above three conditions. The configuration shown in FIG. 29 operates in almost the same manner as that shown in FIG. 6.

Figure 30:
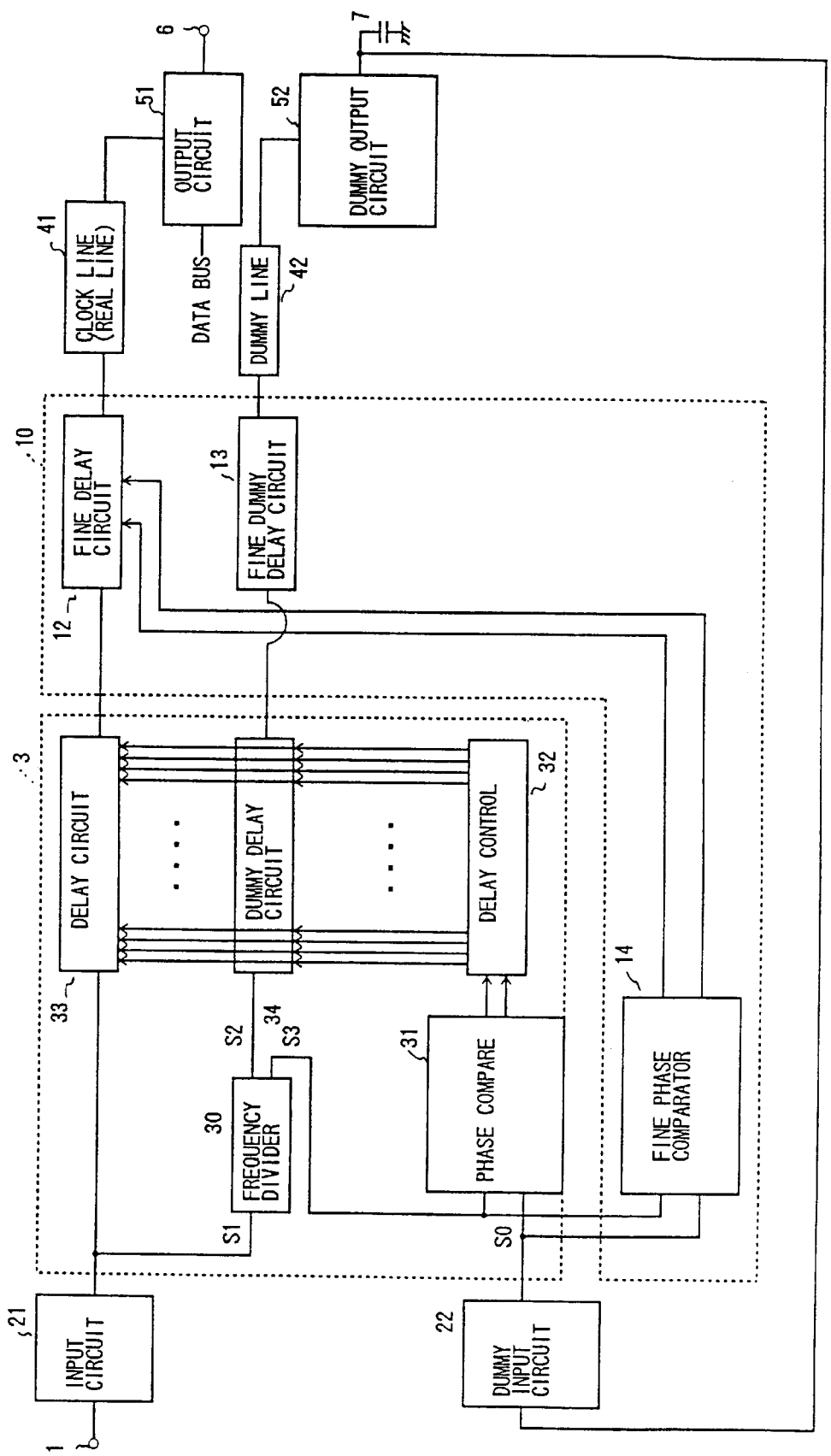
FIG. 30 is a block diagram of a semiconductor integrated circuit device (digital DLL circuit) according to another embodiment of the present invention.

A description will now be given, with reference to FIG. 30, of a digital DLL circuit device according to another embodiment of the present invention. In FIG. 30, parts that are the same as those shown in the previously described figures are given the same reference numbers. The device shown in FIG. 30 includes the first DLL circuit 3 and the second DLL circuit 10, as in the case of FIG. 6. However, there is no hierarchical relationship between the first DLL circuit 3 and the second DLL circuit 10 shown in FIG. 30. That is, the first DLL circuit 3 and the second DLL circuit 10 operate independently, and perform the respective delay controls independently.

The second DLL circuit 10 is provided at the output side of the first DLL circuit 3, and has a precision higher than that of the first DLL circuit 3. The input clock signal externally applied to the clock input pad 1 passes through the input circuit 21, and is delayed by the first DLL circuit 3. The input clock signal delayed by the first DLL circuit 3 is further delayed by the second DLL circuit 10 with the higher precision. Finally, the output (internal) clock signal synchronized with the input clock signal applied to the pad 1 can be produced. The output signal of the second DLL circuit 10 is applied, via the clock line, to the output circuit 51 connected to the data bus. The output circuit 51 buffers data on the data bus in synchronism with the output clock signal from the second DLL circuit 10. The buffered data is then output to a data output pad 6.

The device shown in FIG. 30 includes a dummy input circuit 22, a dummy wiring line 42, a dummy output circuit 52, and a dummy load capacitance 7. The dummy input circuit 22, the dummy wiring line 42 and the dummy output circuit 52 have the same circuit configurations as those of the input circuit 21, the clock line 41 and the output circuit 51, respectively, and have the same delay amounts as those thereof. The dummy load capacitance 7 is equal to the load capacitance coupled to the data output pad 6.

The first DLL circuit 3 and the second DLL circuit 10 operate independently. More particularly, the first DLL circuit 3 and the second DLL circuit 10 independently perform the respective phase comparing operations and the delay control operations. The clock signal obtained from the dummy output circuit 52 via the dummy input circuit 22 is independently compared, by the phase comparator circuit 31 and the fine phase comparator circuit 14, with the input clock signal from the input circuit 21. The delay amount is independently controlled so as to make the phase difference equal to zero in the first DLL circuit 3 and the second DLL circuit 10. In actuality, the output clock signal lags behind the input clock signal by k periods (k is an integer equal to or greater than 1). In this state, there is no substantial phase difference between the input clock signal and the dummy clock signal. That is, the data output from the output circuit 51 is synchronized with the input clock signal externally applied to the clock input pad 1.

The first DLL circuit 3 includes the frequency divider 30, the phase comparator circuit 31 serving as a digital phase comparator, the delay control circuit 32, the delay circuit 33 and the dummy delay circuit 34. The frequency divider 30 frequency-divides the external clock signal S1 from the input circuit 21, and thus produces the signals S2 and S3 having a frequency lower than that of the external clock signal S1. The signal S2 is output to the dummy delay circuit 34, and the signal S3 is applied to the first input of the phase comparator circuit 31. The second input of the phase comparator circuit 31 is supplied with the output signal of the dummy delay circuit 34 via the fine dummy delay circuit 13, the dummy wiring line 42, the dummy output circuit 52 and the dummy input circuit 22. The phase comparator circuit 31 compares the phase of the signal S0 from the dummy input circuit 22 with that of the signal S3, and controls the delay control circuit 32 on the basis of the result of the phase comparing operation. The delay control circuit 32 sets an identical delay amount based on the output signal of the phase comparator circuit 31 to the delay circuit 33 and the dummy delay circuit 34. The output signal of the delay circuit 33 is applied to the fine delay circuit 12 of the second DLL circuit 10.

The second DLL circuit 10 includes the fine delay circuit 12, the fine dummy delay circuit 13 and the fine phase comparator circuit 14. The fine delay circuit 12 is capable of controlling the delay amount more finely than the delay circuit 33. The fine dummy delay circuit 13 is fixed to a given amount. The fine phase comparator circuit 14 compares the phases of the signals S0 and S3, and controls the delay amount of the fine delay circuit 12. Due to the function of the first DLL circuit 3, the output clock signal applied to the output circuit 51 is synchronized with the external clock signal with the precision of the first DLL circuit 3. In this state, the phase control can be carried out more finely by controlling the delay amount of the fine delay circuit 12 on the basis of the result of the comparing operation of the fine phase comparator circuit 14.

It will be noted that the dummy circuit 41 shown in FIG. 6 includes the dummy wiring line 42, the dummy output circuit 52 and the dummy load capacitance 7 shown in FIG. 30. The output circuit 51 shown in FIG. 30 includes the clock line 41.

A description will now be given of the detail of the first DLL circuit 3 shown in FIG. 30. The first DLL circuit 3 shown in FIG. 30 includes the same parts as those of the first DLL circuit shown in FIG. 6. A description of those parts will be omitted.

The phase comparator circuit 31 shown in FIG. 30 will be described. The phase comparator circuit 31 includes a phase comparator part shown in FIG. 31 and the aforementioned amplifier part shown in FIG. 18.

Figure 31:
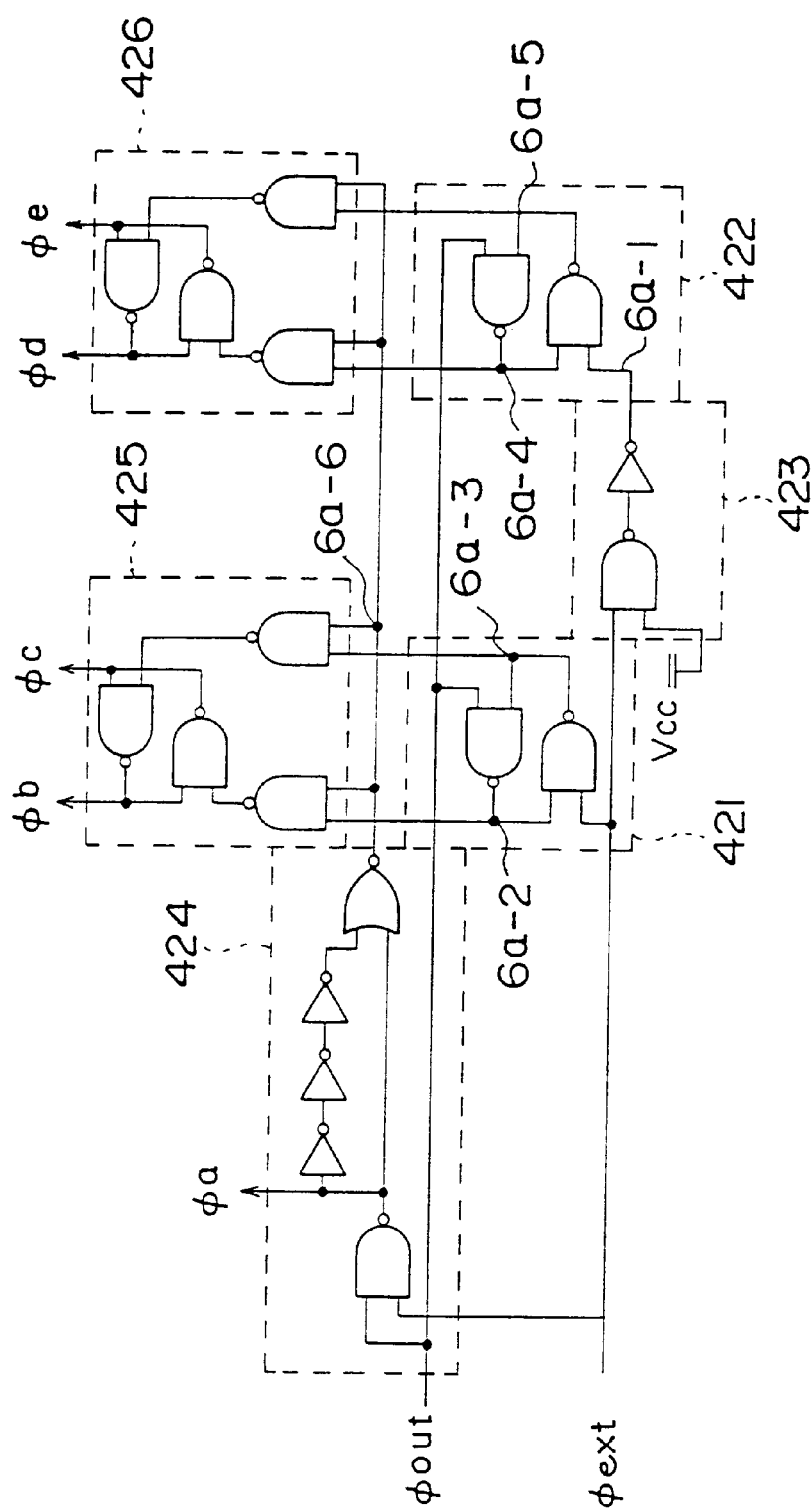
FIG. 31 is a circuit diagram of a phase comparator part of a phase comparator circuit used in block 3 shown in FIG. 30.

Referring to FIG. 31, the clock signals φout and φext respectively correspond to the signals S0 and S1 shown in FIG. 30. The phase of the signal φout is detected with respect to the signal φext. The signals φa–φe are applied to the amplifier part shown in FIG. 18. The phase comparator part of the phase comparator circuit 31 includes the aforementioned flip-flops 421 and 422, the latch circuit 425 and 426, and the circuit 424 which activates the latch circuits 425 and 426, and the delay circuit 423 having the unit delay time which defines the tolerable phase difference.

Figure 32:
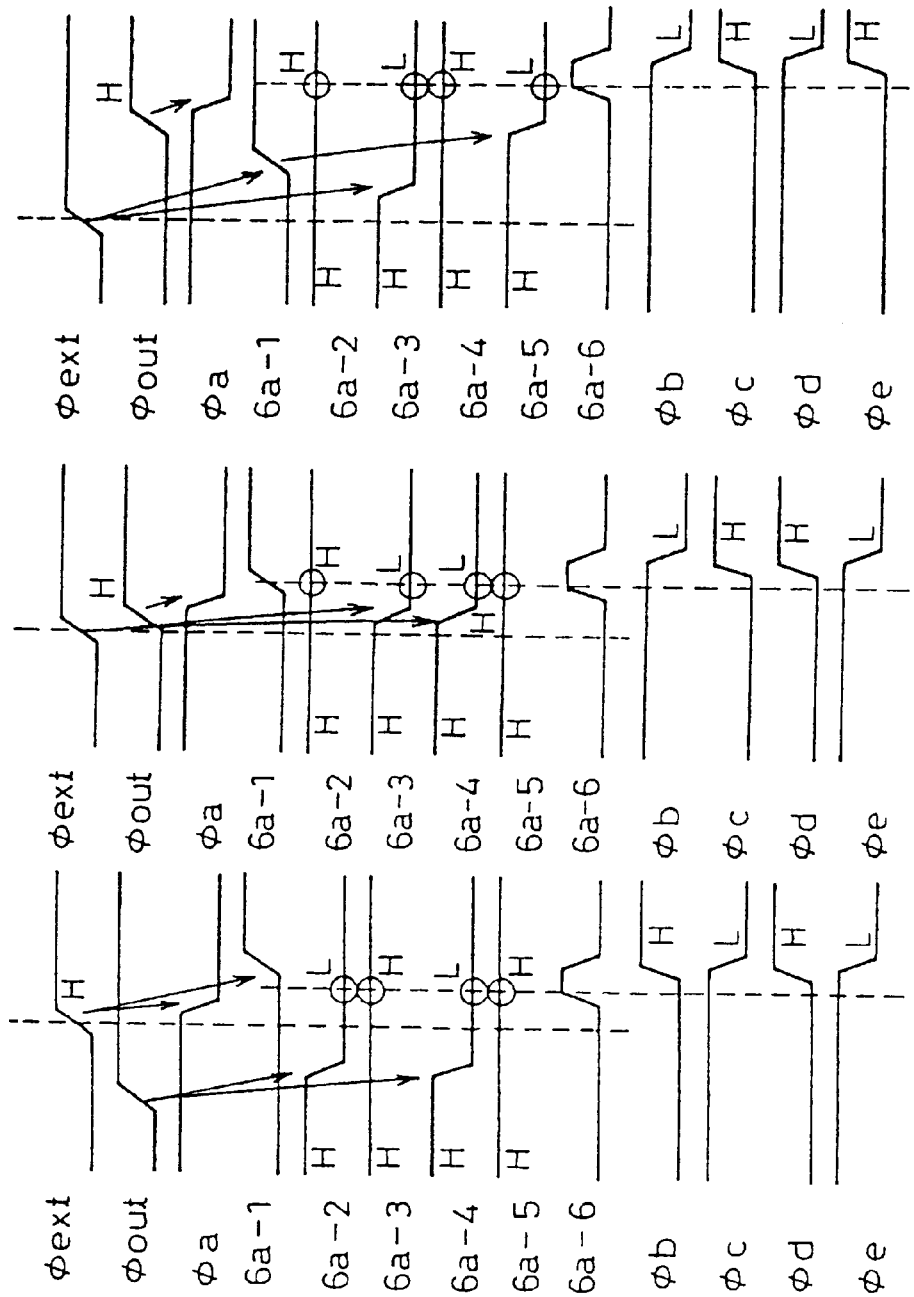
FIGS. 32A, 32B and 32C are timing charts of operations of the phase comparator part shown in FIG. 31.

FIG. 32A shows a case where the clock signal φout leads to the clock signal φext. In this case, the signal φout switches to the high level before the signal φext switches to the high level. When the signals φout and φext are both low, the nodes 6a-2, 6a-3, 6a-4 and 6a-5 are all high.

When the signal φout switches to the high level, the nodes 6a-2 and 6a-4 are switched to the low level from the high level. Then, the signal φext switches to the high level from the low level, and the node 6a-1 is switched to the high level with a delay equal to the unit delay time. However, at this time, the potential of the terminals of the flip-flops 425 and 426 have already been settled. Hence, the potentials of the nodes 6a-2, 6a-3, 6a-4 and 6a-5 are maintained at the low, high, low and high levels, respectively.

When the signal φext switches to the high level, the output signal φa of the circuit 424 is switched to the high level. Hence, a pulse which temporarily switches to the high level is applied to the node 6a-6. The node 6a-6 are the input terminals of the NAND gates of the latch circuits 425 and 426. Hence, the NAND gates are temporarily activated, and the potentials of the output terminals of the flip-flops 421 and 422 are latched in the latch circuits 425 and 426. Finally, the output signals φb, φc, φd and φe are high, low, high and low, respectively.

FIG. 32B shows a case where the signals φout and φext have almost the same phases and switch to the high level at almost the same times. When the signal φout switches to the high level within the time difference between the rising of the signal φout and the rising of the potential at the node 6a-1, the node 6a-3 of the flip-flop 421 is switched to the high level because the signal φext switches to the high level. The node 6a-1 of the flip-flop 422 is continuously low, and thus the node 6a-4 is switched to the low level. Thereafter, the node 6a-1 is switched to the low level. At this time, the state of the flip-flop 422 has been settled, and no change of the state thereof does not occur. Then, the node 6a-6 is temporarily switched to the high level, and thus the latch circuits 425 and 426 latch the states of the flip-flops 421 and 422. Hence, the output signals φb, φc, φd and φe are respectively low, high, high and low.

FIG. 32C shows a case where the signal φout lags, over td, behind the signal φext, and switches to the high level after the signal φext switches to the high level. In this case, the states of the flip-flops 421 and 422 are changed, and the nodes 6a-3 and 6a-5 are switched to the low level. Finally, the signals φb, φc, φd and φe are respectively low, high, low and high.

In the above-mentioned manner, it is possible to detect three cases shown in FIGS. 32A, 32B and 32C. The three cases are indicated by using the signals φb, φc, φd and φe, which are then used to determine which one of the count-up operation, count-down operation and no-count operation should be carried out in the delay control circuit 32.

Figure 33:
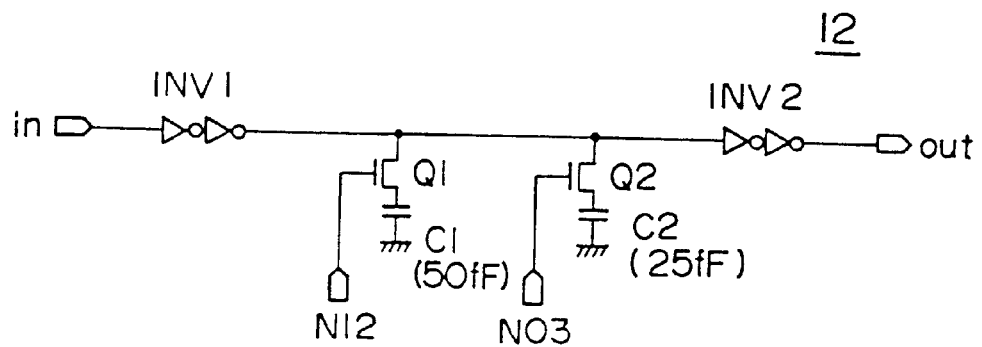
FIG. 33 is a circuit diagram of a fine delay circuit used in block 10 shown in FIG. 30.

FIG. 33 is a circuit diagram of a configuration of the fine delay circuit 12. The circuit 12 shown in FIG. 33 is almost the same as that shown in FIG. 28, and includes inverter circuits INV1 and INV2 connected in series, two N-channel MOS transistors Q1 and Q2, and two capacitors C1 and C2. The gates of the transistors Q1 and Q2 are connected to nodes N12 and N03 shown in FIG. 35, which will be described later.

Figure 34:
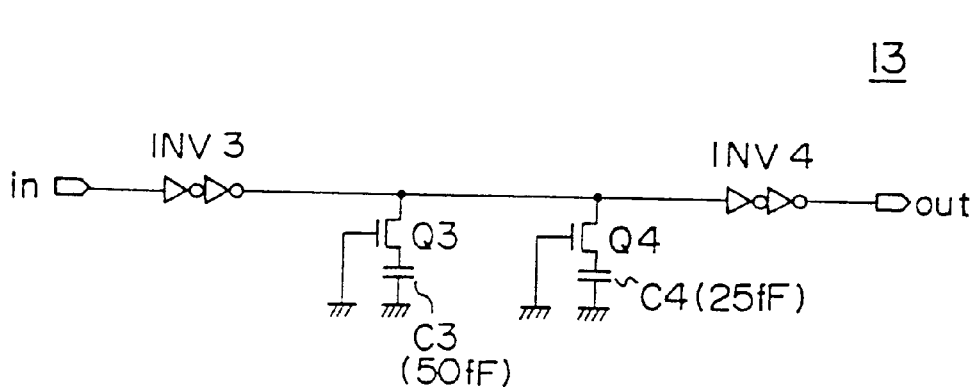
FIG. 34 is a circuit diagram of a fine dummy delay circuit used in block 10 shown in FIG. 30.

FIG. 34 is a circuit diagram of a configuration of the fine dummy delay circuit 13. The circuit 13 includes inverter circuits INV3 and INV4 connected in series, two N-channel MOS transistors Q3 and Q4, and two capacitors C3 (50 fF) and C2 (25 fF). The gates of the transistors Q3 and Q4 are grounded. Hence, the capacitors C3 and C4 are always disconnected from the delay line including the inverter circuits INV3 and INV4. Hence, the fine dummy delay circuit 13 has a fixed delay amount defined by the inverter circuits INV3 and INV4. The capacitors C3 and C4 do not contribute to the delay operation. However, it is preferable the fine delay circuit 12 and the fine dummy delay circuit 13 have the same configuration in order to process the clock signals under the identical circuit condition.

Figure 35:
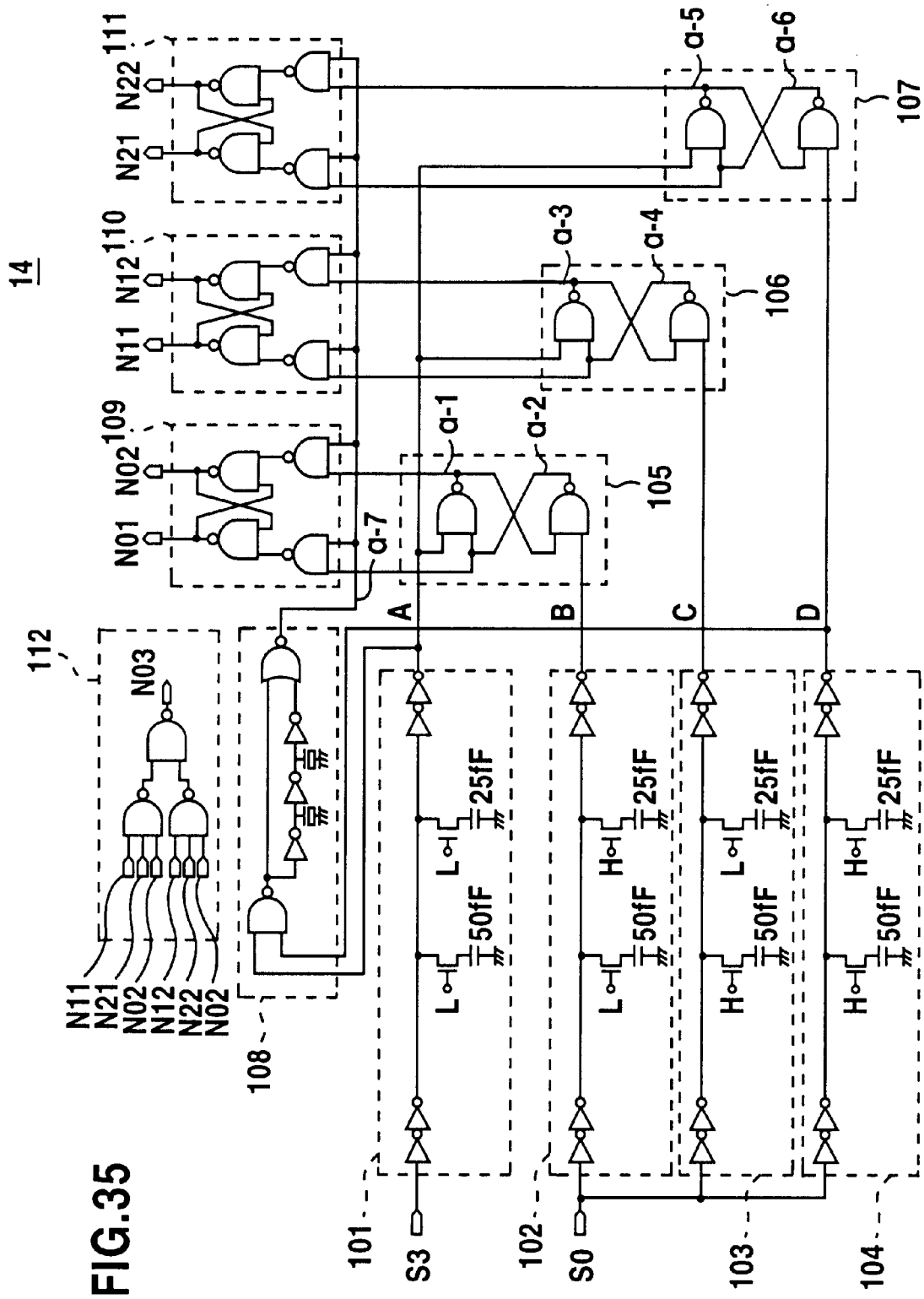
FIG. 35 is a circuit diagram of a fine phase comparator part used in block 10 shown in FIG. 30.

FIG. 35 is a circuit diagram of a configuration of the fine phase comparator circuit 14 shown in FIG. 30. The circuit 14 uses the clock signal S3 produced by the frequency divider 30 as a reference signal, and gives the different delay amounts to the signal S0 from the dummy input circuit 22. Then, the circuit 14 compares the delayed signals given the different delay amounts with the reference signal S4, and determines the delay amount to be set in the fine delay circuit 12.

As shown in FIG. 35, delay circuits 102, 103 and 104 having different delay amounts are provided to the signal S0 from the dummy input circuit 22. Each of the delay circuits 102, 103 and 104 has the same configuration as that of the fine delay circuit 12 shown in FIG. 33. However, in order to define the different delay amounts, the two transistors of each of the delay circuits 102, 103 and 104 are controlled by the different manners. More particularly, in the delay circuit 102, the capacitor having a capacitance of 25 fF is connected to the delay line via the corresponding transistor, the gate of which is supplied with the high level. In the delay circuit 103, the capacitor having a capacitance of 50 fF is connected to the delay line via the corresponding transistor, the gate of which is supplied with the high level. In the delay circuit 104, the two capacitors respectively having capacitances of 25 fF and 50 fF are connected to the delay line via the respective transistors. A delay circuit 101 having the same configuration as those of the delay circuits 102–104 is provided to the reference signal S3 in order to process the signals S0 and S3 under the same circuit condition. The two capacitors of the delay circuit 101 are disconnected from the delay line thereof.

Further, the fine phase comparator circuit 14 includes flip-flops 105, 106 and 107, latch circuits 109, 110 and 111, a circuit 108, and a logic circuit 112, as shown in FIG. 35. Each of the flip-flops 105, 106 and 107 includes two NAND gates. The latch circuits 109, 110 and 111 latch the states of the flip-flops 105, 106 and 107, respectively. The circuit 108 generates a signal which activates the latch circuits 109, 110 and 111. The output signals of the latch circuits 109, 110 and 111 are labeled N0, N02, N11, N12, N21 and N22, as shown in FIG. 35. The logic circuit 112 receives the signals N02, N11, N12, N21 and N22 and produces a signal N03 therefrom. The signal N03 is applied to the gate of the transistor Q2 shown in FIG. 33.

FIGS. 36A, 36B, 36C and 36D are timing charts of operations of the fine phase comparator circuit 14 shown in FIG. 35. The operations shown in these figures are obtained under the condition that the delay circuit 33 and the dummy delay circuit 34 have a unit delay time of 200 ps and a 25 fF increase in the capacitance of the signal delay line causes a delay time of 50 ps. FIGS. 36A, 36B, 36C and 36D show operations observed when the signal S0 leads the signal S3 by 40 ps, 90 ps, 140 ps and 190 ps, respectively. In FIGS. 36A–36D, reference symbols A–D, a-1–a-7, N01–N03, N11–N12 and N21–N22 denote signals obtained at nodes indicated by these symbols in FIG. 35.

Figures 36A, 36B, 36C, 36D:
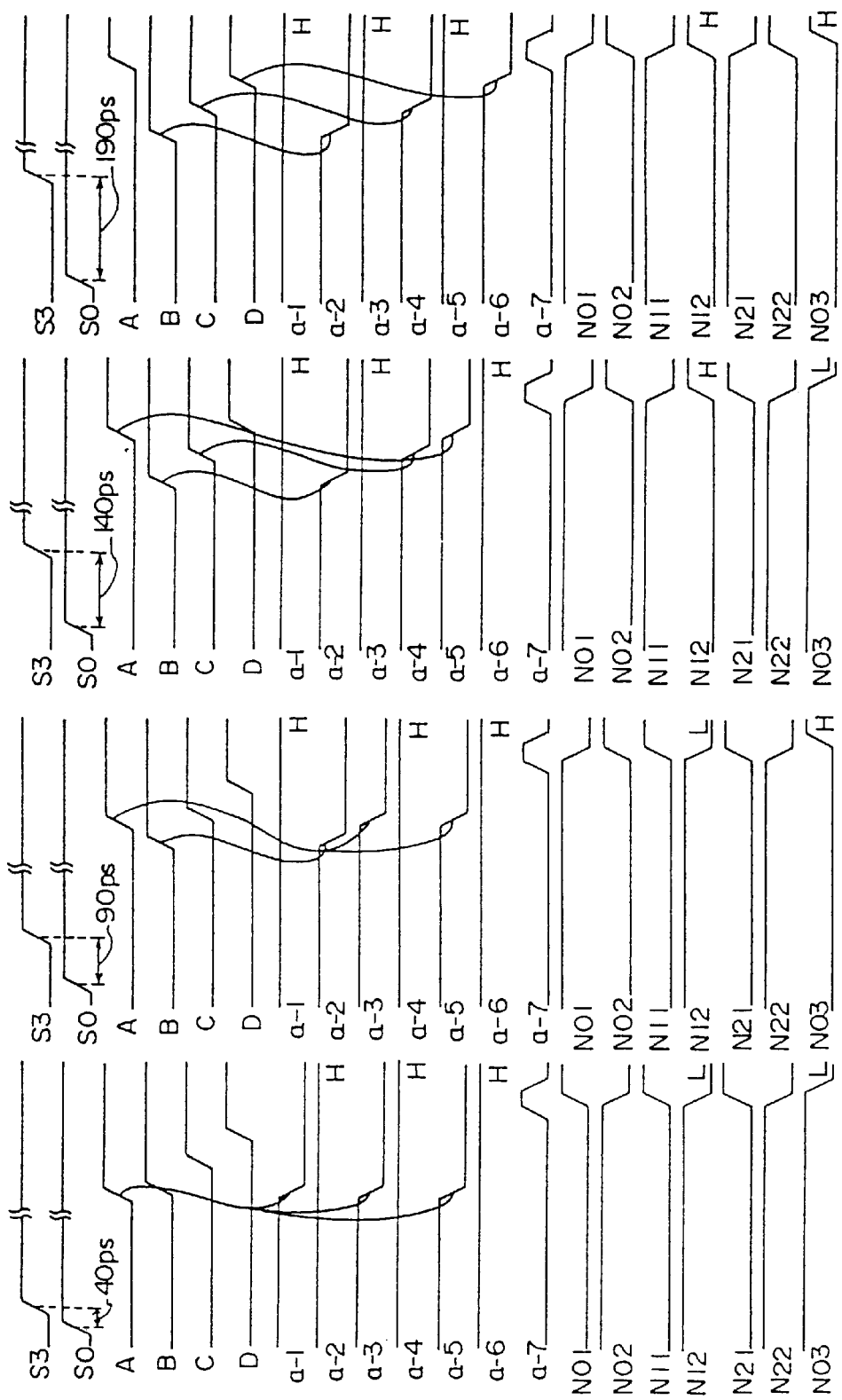
FIGS. 36A, 36B, 36C and 36D are timing charts of operations of the fine phase comparator circuit shown in FIG. 35.

FIG. 36A shows the case where the signal S0 leads to the signal S3 by 40 ps. In this case, it is required to disconnect the capacitors C1 and C2 shown in FIG. 33 from the delay line and thus make the fine delay circuit 12 have the minimum delay amount. The signals at the nodes are changed as shown in FIG. 36A, and the control signals N12 and N03 are both set to the low level.

FIG. 36B shows the case where the signal S0 leads to the signal S3 by 90 ps. In this case, it is required to connect only the capacitor C2 to the delay line and thus increase the delay amount by 50 ps. The signals at the nodes are changed as shown in FIG. 36B, and the control signals N12 and N03 are set to the low and high levels, respectively.

FIG. 36C shows the case where the signal S0 leads to the signal S3 by 140 ps. In this case, it is required to connect only the capacitor C1 to the delay line and thus increase the delay amount by 100 ps. The signals at the nodes are changed as shown in FIG. 36C, and the control signals N12 and N03 are set to the high and low levels, respectively.

FIG. 36D shows the case where the signal S0 leads to the signal S3 by 190 ps. In this case, it is required to connect both the capacitors C1 and C2 to the delay line and thus increase the delay amount by 150 ps. The signals at the nodes are changed as shown in FIG. 36D, and the control signals N12 and N03 are both set to the high level.

In the above manner, the delay amount is controlled with a precision of 200 ps by the first DLL circuit 3, and the delay amount is controlled with a precision of 50 ps by the second DLL circuit 10. Hence, the fine delay control can be carried out, and the internal clock signal synchronized with the external clock signal can be produced.

A description will now be given of another configuration of the second DLL circuit 10.

Figure 37:
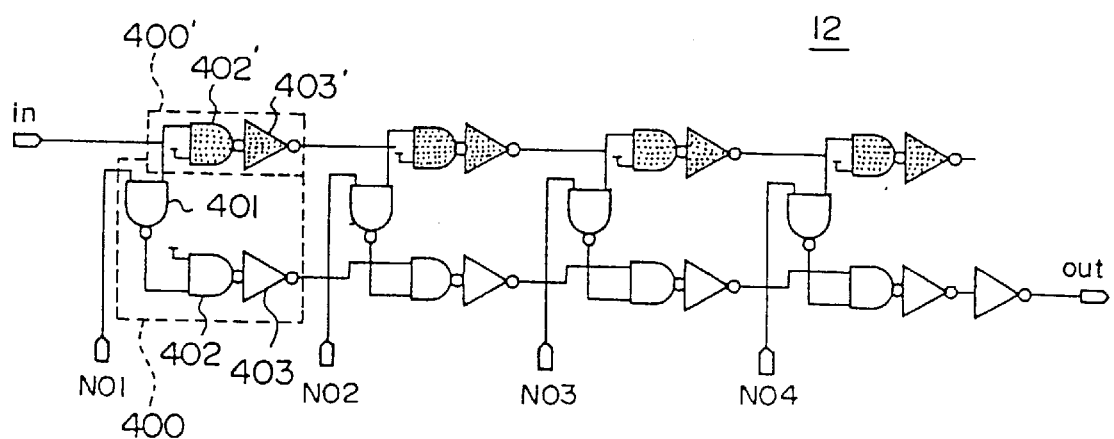
FIG. 37 is a circuit diagram of another configuration of the fine delay circuit used in block 10 shown in FIG. 30.

FIG. 37 shows another configuration of the fine delay circuit 12 of the second DLL circuit 10. The configuration of the fine delay circuit 12 shown in FIG. 37 differs from that shown in FIG. 13C in that logic gates illustrated with hatching are added to the configuration shown in FIG. 13C in order to make it possible to control a delay amount less than the unit delay amount 200 ps. In FIG. 37, the unit delay element having the unit delay amount 200 ps is assigned a reference number 400. The unit delay element is made up of the NAND gates 401 and 402 and the inverter 403, as has been described previously. Another unit delay element 400' having a unit delay amount different from the unit delay amount 200 ps is connected to the unit delay element 400. The unit delay element 400' is made up of a NAND gate 402' and an inverter 403'.

The difference between the unit delay amount of the element 400 and that of the element 400' corresponds to the difference between the total of the delay amounts of the NAND gate 402' and the inverter 403' and that of the delay amounts of the NAND gate 402 and the inverter 403. The above difference defines the precision of the fine delay circuit 12. For example, in a state in which only the NAND gate receiving the control signal N03 is opened, the input signal passes through the two unit delay elements 400' and the two unit delay elements 400. When only the NAND gate receiving the control signal N04 is opened, the input signal passes through the three unit delay elements 400' and one unit delay element 400. The difference between the delay amounts applied to the input signal in the two cases is the difference between the delay amount of the unit delay element 400 and that of the unit delay element 400'. For example, if the unit delay elements 400 and 400' have the unit delay amounts 200 ps and 250 ps, respectively, the difference between the above unit delay amounts is the precision of the fine delay circuit 12. Hence, by controlling the NAND gate 401 to be selected, it is possible to obtain delay amounts of 50 ps, 100 ps and 150 ps.

The input signal passes through only one NAND gate 401 in any routes, the output signal includes the delay caused by the NAND gate 401. In other words, the presence of the NAND gate 401 does not affect the difference in the delay amount between the different routes. The control signals N01–N04 shown in FIG. 37 are produced by the fine phase comparing circuit 14 having a configuration which will be described in detail with reference to FIG. 39.

Figure 38:
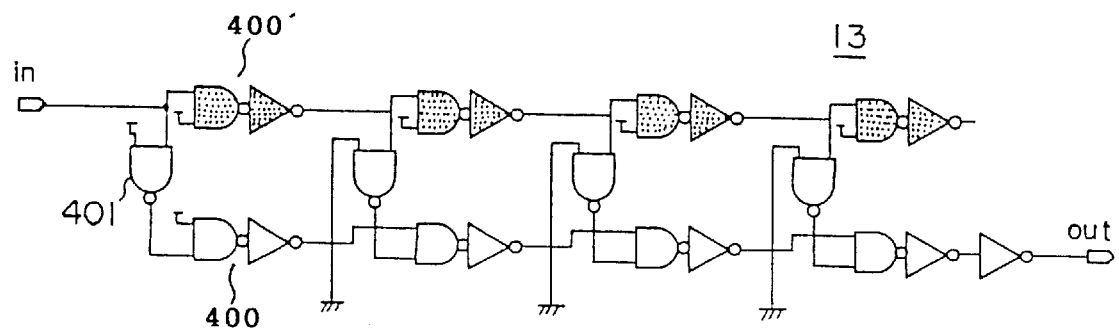
FIG. 38 is a circuit diagram of another configuration of the fine dummy delay circuit used in block 10 shown in FIG. 30.

FIG. 38 is a circuit diagram of anther configuration of the fine dummy delay circuit 13 of the second DLL circuit 10. The fine dummy delay circuit 13 shown in FIG. 38 is the same as the configuration shown in FIG. 37 except that one of the two inputs of the NAND gate 401 located at the first stage is set to the high level and one of the two inputs of each of the other NAND gates 401 is set to the low level. In this case, the input signal passes through all the unit delay elements 400.

Figure 39:
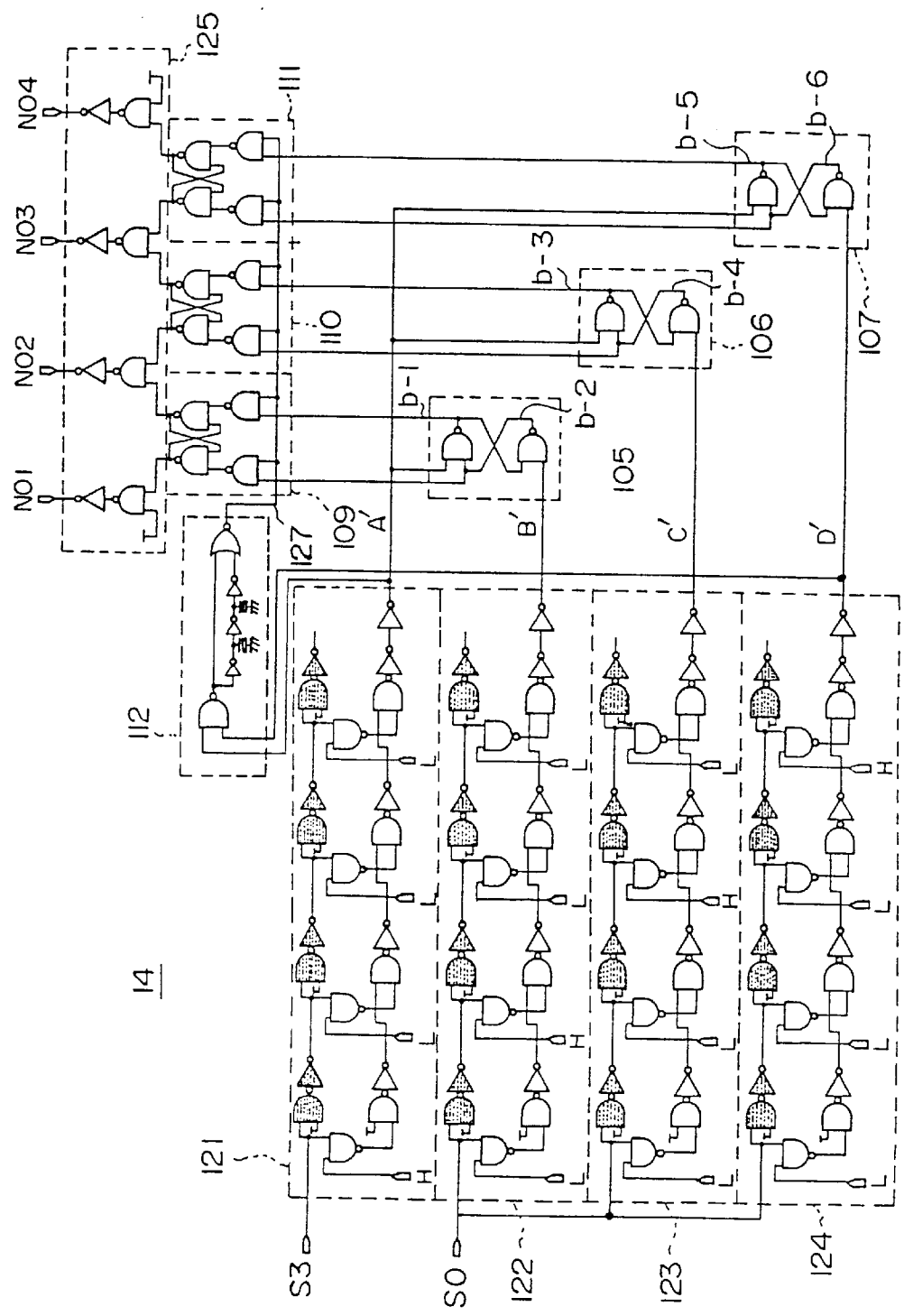
FIG. 39 is a circuit diagram of another configuration of the fine phase comparator circuit used in block 10 shown in FIG. 30.

FIG. 39 is a circuit diagram of a configuration of the fine phase comparing circuit 14 used when the configurations shown in FIGS. 37 and 38 are employed. In FIG. 39, parts that are the same as those shown in the previously described figures are given the same reference numbers. As shown in FIG. 39, three delay circuits 122, 123 and 124 having mutually different delay amounts are provided to the signal S0 from the dummy input circuit 22 shown in FIG. 33. Each of the delay circuits 122, 123 and 124 is configured as shown in FIG. 37. The different level setting of the four NAND gates 401 is required to define the different delay amounts. For example, the four NAND gates 401 of the delay circuit 122 are permanently supplied with the low, high, low and low levels, respectively, as shown in FIG. 39. The level setting for the delay circuits 123 and 124 is as shown in FIG. 39. A delay circuit 121 is provided in order to process the signal S3 under the same circuit configuration as that of each of the delay circuits 122, 123 and 124. The delay circuit 121 has the same configuration as that of each of the delay circuits 122 through 124. In FIG. 39, a logic circuit 125 is employed instead of the logic circuit 112 shown in FIG. 35. The logic circuit 125 is made up of NAND gates and inverters, and produces the control signals N01 through N04.

FIGS. 40A, 40B, 40C and 40D are timing charts of operations of the fine phase comparing circuit 14 having the configuration shown in FIG. 39. The operations shown in these figures are obtained under the condition that the delay circuit 33 and the dummy delay circuit 34 have the unit delay time equal to 200 ps, the unit delay element 400' illustrated with hatching has the unit delay time equal to 50 ps. FIGS. 40A, 40B, 40C and 40D show operations observed when the signal S0 leads the signal S3 by 40 ps, 90 ps, 140 ps and 190 ps, respectively. In FIGS. 40A–40D, reference symbols A'–D', a-1–a-7, N01–N04 denote signals obtained at nodes indicated by these symbols in FIG. 39.

Figure 40:
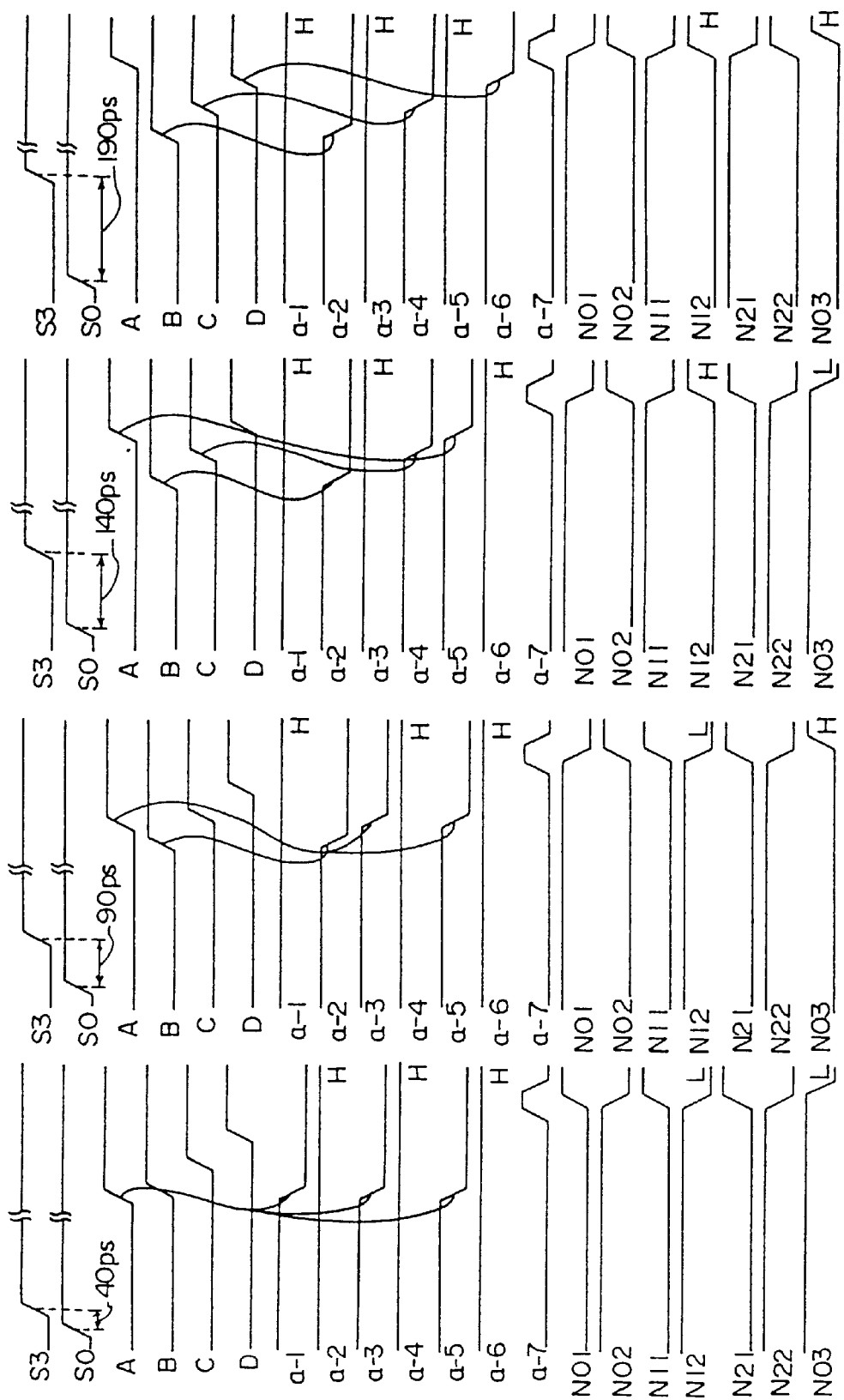
FIGS. 40A, 40B, 40C and 40D are timing charts of operations of the fine phase comparator circuit shown in FIG. 39.

FIG. 40A shows the case where the signal S0 leads to the signal S3 by 40 ps. In this case, it is required to set the delay amount of the fine delay circuit 12 to that (the minimum delay amount) of the delay circuit 121 shown in FIG. 39.

The signals at the nodes are changed as shown in FIG. 40A, and only the control signal N01 is set to the high level.

FIG. 40B shows the case where the signal So leads to the signal S3 by 90 ps. In this case, it is required to set the delay amount of the fine delay circuit 12 to that of the delay circuit 122 shown in FIG. 39. The signals at the nodes are changed as shown in FIG. 40B, and only the control signal N02 is set to the high level.

FIG. 40C shows the case where the signal S0 leads to the signal S3 by 140 ps. In this case, it is required to set the delay amount of the fine delay circuit 12 to that of the delay circuit 123 shown in FIG. 39. The signals at the nodes are changed as shown in FIG. 40C, and only the control signal N03 is set to the high level.

FIG. 40D shows the case where the signal S0 leads to the signal S3 by 190 ps. In this case, it is required to set the delay amount of the fine delay circuit 12 to that of the delay circuit 124 shown in FIG. 39. The signals at the nodes are changed as shown in FIG. 40D, and only the control signal N04 is set to the high level.

In the above manner, the delay amount is controlled with a precision of 200 ps by the first DLL circuit 3, and the delay amount is controlled with a precision of 50 ps by the second DLL circuit 10. Hence, the fine delay control can be carried out, and the internal clock signal synchronized with the external clock signal can be produced.

The fine delay circuits 12 and 13 are not limited to the configurations shown in FIGS. 37 and 38. It is possible to use a plurality of resistors connected in series and a plurality of switches respectively connected to the resistors in parallel. By changing the number of resistors connected between the input and output terminals of the fine delay circuit, the delay amount thereof can be adjusted. It is also possible to combine the resistors and capacitors together to configure the fine delay circuit.

Figure 41:
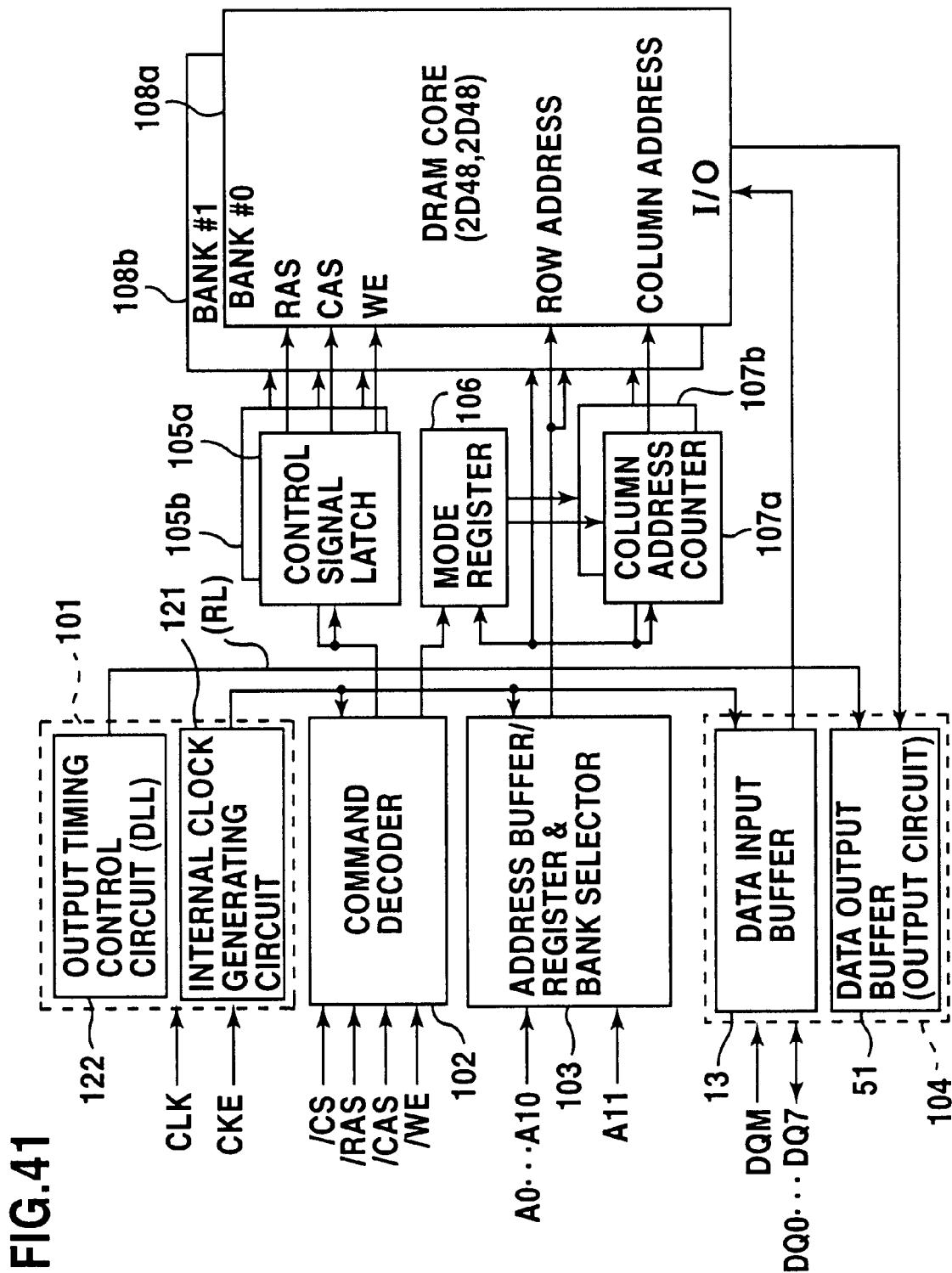
FIG. 41 is a block diagram of an SDRAM device to which the digital DLL circuit of the present invention can be applied.
Figure 42:
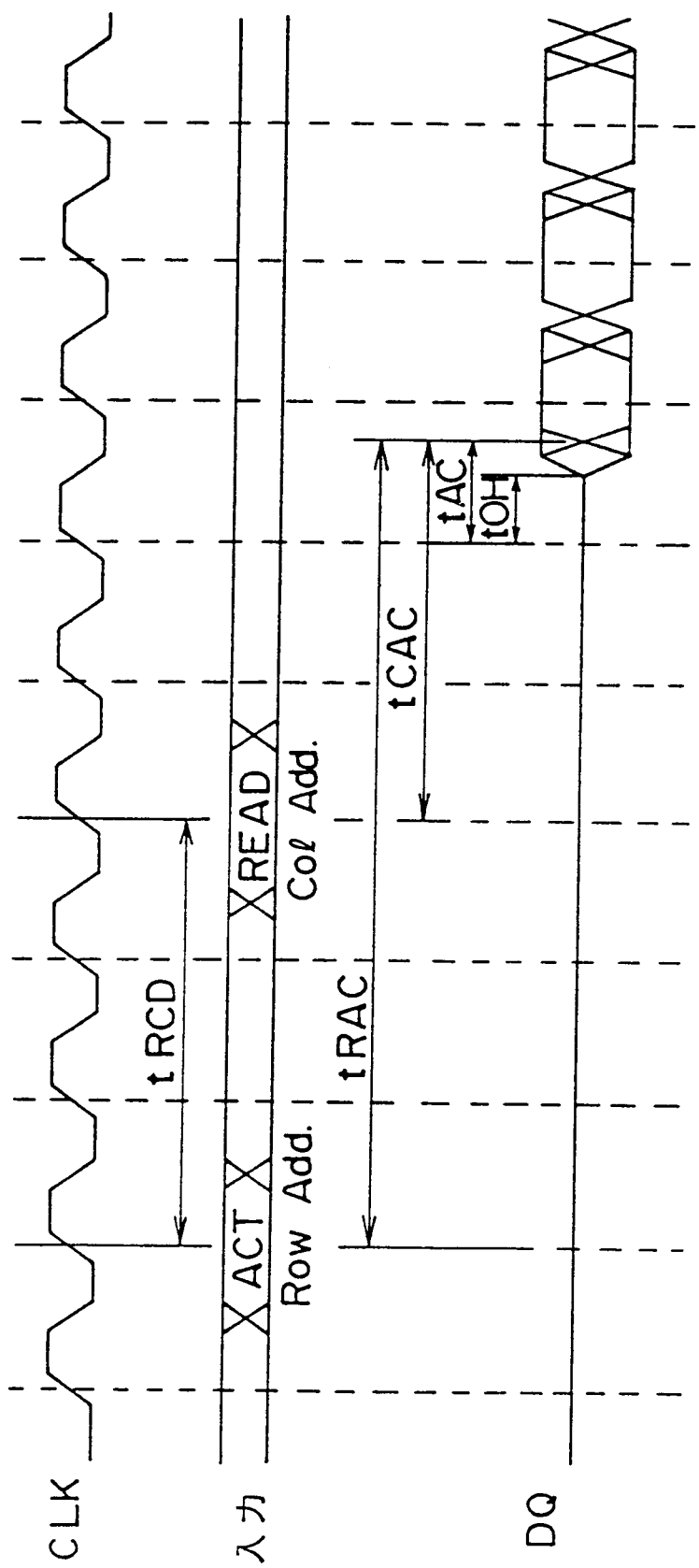
FIG. 42 is a timing chart of an outline of the operation of the SDRAM device shown in FIG. 41.

FIG. 41 is a block diagram of an SDRAM device to which the above-mentioned digital DLL circuit device is applied. FIG. 42 is a timing chart of an operation of the SDRAM device shown in FIG. 41. A pipeline system is applied to the SDRAM device, which includes two banks #0 and #1 each having 16 Mbits and an eight-bit width.

As shown in FIG. 41, the SDRAM device includes DRAM cores 108a and 108b, a clock buffer 101, a command decoder 102, an address buffer/register and band address selector (address buffer) 103, an I/O data buffer/register 104, control signal latch circuits 105a and 105b, a mode register 106, and column address counters 107a and 107b. Various commands which define operation modes are defined by a chip select signal /CS, a row address strobe signal /RAS, a column address strobe signal /CAS and a write enable signal /WE. The commands are decoded by the command decoder 102, which controls the corresponding circuits on the basis of the decoded command. The signals /CS, /RAS, /CAS and /WE are applied to the control signal latch circuits 105a and 105b, which hold the states of these signals until the next command is applied.

The address signal is amplified by the address buffer 103, which outputs a row address signal applied to the banks #0 and #1. The row address signal is used as an initial value for the column address counters 107a and 107b.

The clock buffer 101 is equipped with an internal clock generating circuit 121 and an output timing control circuit 122. The internal clock generating circuit 121 generates an internal clock signal from an external clock signal CLK. The output timing control circuit 122 includes the aforementioned digital DLL circuit device and performs the fine delay control (phase control) so that the phase-controlled clock signal can be generated.

The I/O data buffer/register 104 is equipped with a data input buffer 13 and a data output buffer (output circuit) 51. Data read from either the DRAM core 108a or 108b is amplified to a given level by the data output buffer 51, and is output via data pads DQ0–DQ7 at the timing of the clock signal output by the output timing control circuit 122. Data externally applied to the data pads DQ0–DQ7 is applied to the DRAM cores 108a and 108b via the data input buffer 13. The clock line 41 corresponds to a line extending from the output timing control circuit 122 to the data output buffer 51.

The read operation of the above SDRAM device will be described with reference to FIG. 42.

The external clock signal CLK is supplied from a system in which the present SDRAM device is used. In synchronism with the rising edges of the external clock signal CLK, various commands, address signal and input data are latched and data is output.

When data is read from the DRAM device, an active command (ACT) defined by the signals /CS, /RAS, /CAS and /WE is applied, and a row address (Row add.) is applied. Hence, the SDRAM device is activated, and the word line corresponding to the row address is selected. Data stored in the cells connected to the selected word line is output to bit lines and is amplified by a sense amplifier.

After the operation time (tRCD) relating to the row address, a read command (READ) and the column address (Col Add.) are input. The data sensed by the sense amplifiers selected by the column address is output to a data bus line and is amplified by a data bus amplifier. Further, the data amplified by the data bus amplifier is amplified by the output buffer 51 and is then output to the data pads DQ. The above operation is the same as that of the general-purpose DRAM device. However, in the SDRAM device, the circuits relating to the column address are designed to perform the pipeline operation, in which read data can be obtained every cycle. Hence, the data output operation has the cycle of the external clock signal CLK.

Generally, there are three different access times, all of which are defined with respect to the rising edges of the external clock signal CLK. In FIG. 42, tRAC denotes a row address access time, tCAC is a column address access time, and tAC denotes a clock access time.

Figure 43:
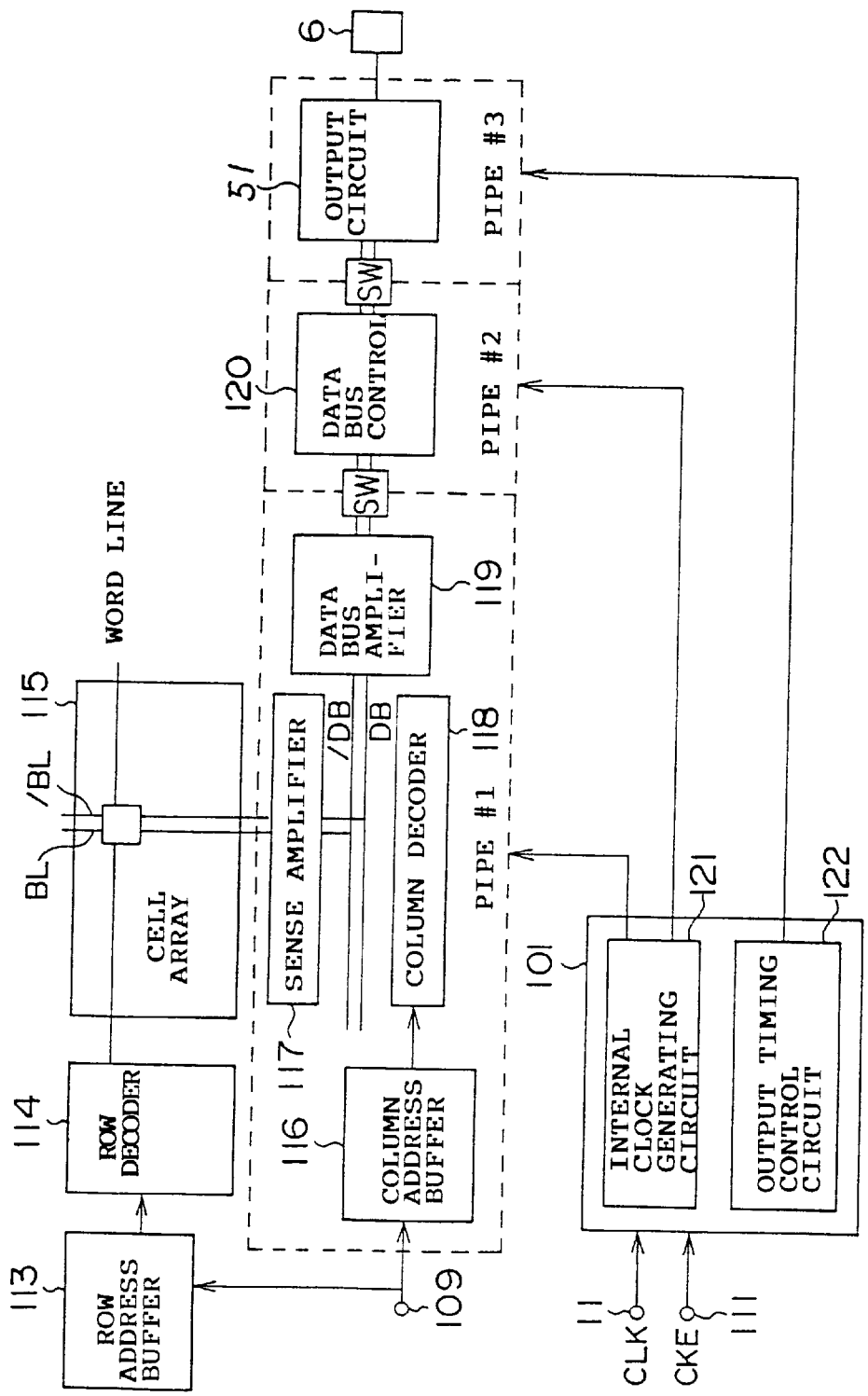
FIG. 43 is a block diagram of parts of the SDRAM device shown in FIG. 41.

FIG. 43 is a block diagram of a part of the SDRAM device shown in FIG. 41, which part relates to the pipeline operation. The configuration shown in FIG. 43 has three stages of the pipeline.

The circuit part relating to the column address is segmented into parts in accordance with the flow of the pipeline process. The segmented parts are called pipes.

As has been described with respect to FIG. 41, the clock buffer 101 is equipped with the internal clock generating circuit 121 and the output timing control circuit 122. The output signal of the internal clock generating circuit 121 is supplied to pipes #1 and #2. The output signal (the phase controlled internal clock signal) of the output timing control circuit 122 is supplied to the output circuit 51 (data output buffer) of pipe #3.

The pipes #1, #2 and #3 are controlled in accordance with the respective clock signals supplied thereto. Switches SW are provided between the adjacent pipes, and control the signal transfer timings. The switches SW are controlled by the clock signal generated by the internal clock generating circuit 121 of the clock buffer 101.

In the pipe #1, the address signal is mplified by the column address buffer 116 and is then applied to the column decoder 118. Then, the column decoder 118 selects sense amplifiers in a sense amplifier circuit 117 in accordance with the decoded column address. In FIG. 43, only one pair of bit lines BL and /BL extending in a cell array 115 and only one pair of data bus lines DB and /DB are illustrated for the sake of simplicity. Data sensed by the selected sense amplifier is transferred to the data bus lines DB and /DB, and is then amplified by a data bus amplifier 119.

The pipe #2 includes a data bus control circuit 120, and the pipe #3 includes the output buffer 51 of the I/O buffer 104. In FIG. 43, the data input buffer 13 of the I/O buffer 104 is omitted for the sake of simplicity.

When the pipes #1, #2 and #3 complete the respective operations within the respective clock cycles, data can be transferred in a relay formation by opening and closing the switches SW in synchronism with the clock signal applied thereto. Hence, the processes in the pipes #1, #2 and #3 can be carried out in parallel, and data can be continuously output to the data output terminal 6 in synchronism with the phase-controlled clock signal.

Figure 44:
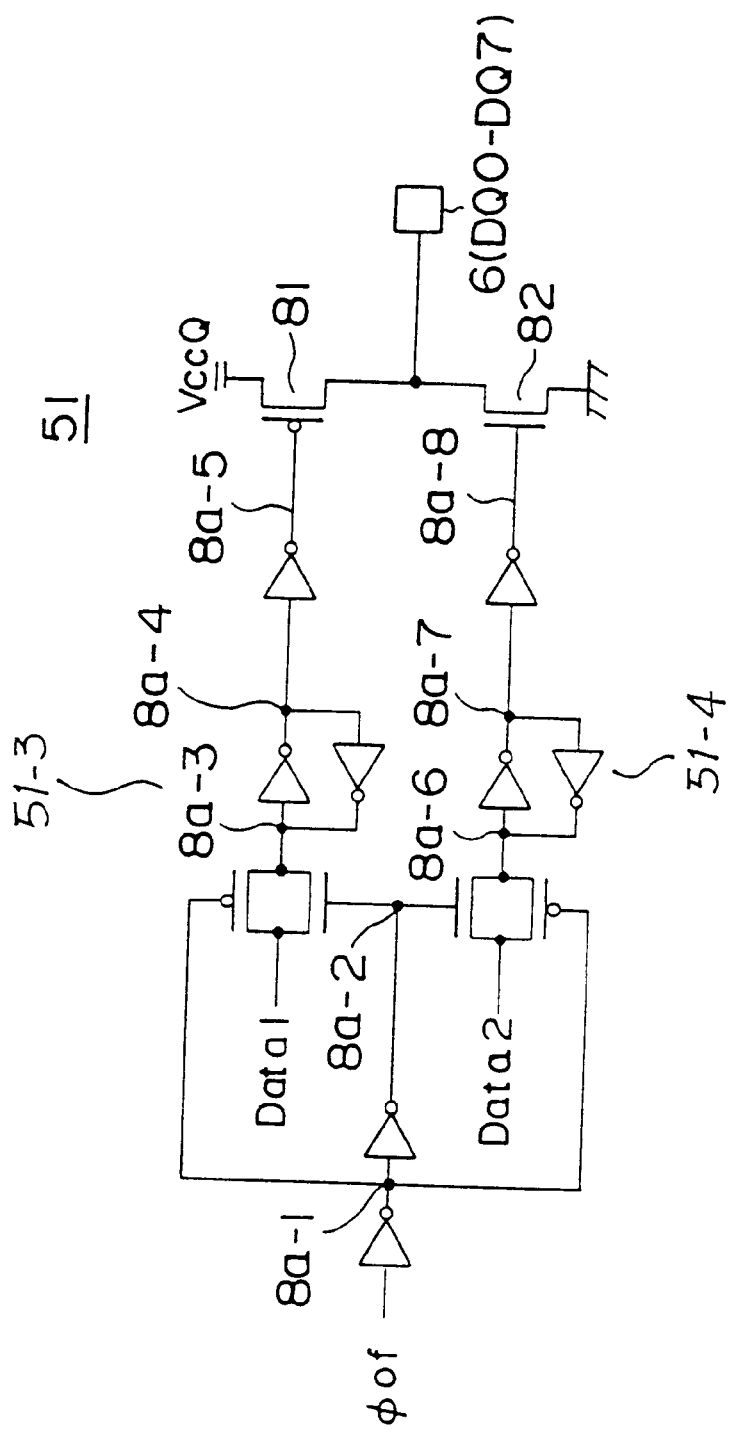
FIG. 44 is a circuit diagram of an output circuit of the device shown in FIG. 41.

FIG. 44 is a circuit diagram of a configuration of the data output buffer 51. "Data 1" and "Data 2" are read from the cell array 115 and are output via the sense amplifier circuit 117, the data bus amplifier 119 and the data bus control circuit 120. Data output to the data output terminal 6 is high when "Data 1" and "Data 2" are both low, and is low when "Data 1" and "Data 2" are both high. The data output terminal 6 can be maintained in the high-impedance state when "Data 1" is high and "Data 2" is low. The setting of the levels of "Data 1" and "Data 2" is carried out by the data bus control circuit 120. A signal φof denotes the clock signal output by the output timing control circuit 122 (the fine delay circuit 12 in FIG. 30), and serves as an enable signal of the output circuit 51. A latch circuit 51-3 is made up of two inverters, and a latch circuit 51-4 is made up of two inverters.

When the clock signal φof becomes high, data based on "Data 1" and "Data 2" appears on the data output terminal 6. For example, when high-level data is output to the terminal 6, the clock signal φof switches to the high level. Hence, a node 8a-1 is switched to the low level, and a node 8a-2 is switched to the high level. Thus, two transfer gates, each being made up of a P-channel MOS transistor an N-channel MOS transistor, are turned ON. Hence, "Data 1" and "Data 2" are transferred to nodes 8a-3 and 8a-6 via the transfer gates, respectively. Thus, a node 8a-5 is switched to the low level, and a node 8a-8 is switched to the high level. As a result, a P-channel MOS transistor 81 is turned ON, and an N-channel MOS transistor 82 is turned OFF. Hence, the high-level data is output to the data output terminal 6. When the clock signal φof switches to the low level, the transfer gates are turned OFF, and the state of the data output terminal 6 is maintained.

Figure 45:
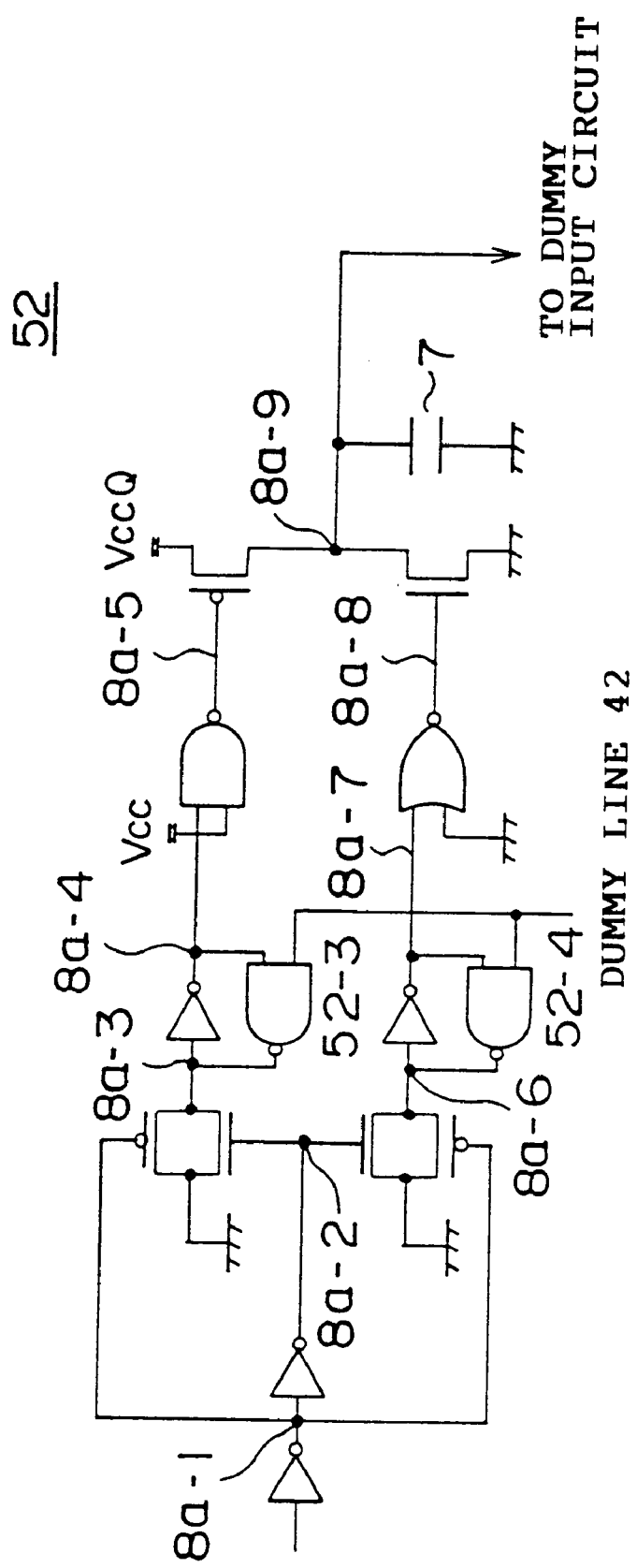
FIG. 45 is a circuit diagram of a dummy output circuit shown in FIG. 29.

FIG. 45 is a circuit diagram of the dummy output circuit shown in FIG. 30. The dummy output circuit 52 has almost the same configuration as that of the output circuit 51 in order to obtain almost the same delay time as that of the output circuit 51. The dummy output circuit 52 differs from the output circuit 51 as follows. The latch circuits 51-3 and 51-4 shown in FIG. 44 are replaced by latch circuits 52-3 and 52-4. Each of the latch circuits 52-3 and 52-4 is made up of an inverter and a NAND gate. One of the two input terminals of the NAND gates 52-3 and 52-4 is connected to the dummy line 42 via which the clock signal from the fine delay circuit 12 is applied thereto. The latch circuits 52-3 and 52-4 output the inverted version of the internal clock signal. An output node 8a-9 is alternately switched to the high and low levels in accordance with the clock signal applied to the latch circuits 52-3 and 52-4. The dummy load capacitance 7 is connected to the output node 8a-9. The dummy load capacitance 7 has a capacitance equal to the average external load connected to the data output terminal 6 of the output circuit 51.

The present invention is not limited to the specifically disclosed embodiments, and variations and modifications may be made without departing from the scope of the present invention. For example, the logic gates used to form the delay circuits are not limited to NAND gates and inverters but can be formed by NOR gates or EOR gates. The present invention is not limited to the SDRAM device but includes any device which outputs an output signal in synchronism with the external signal.

What is claimed is:

1. A variable delay circuit comprising:

a first gate line which has first gates cascaded via intermediate nodes and receives an input signal;

a second gate line which has second gates cascaded via intermediate nodes, the second gates having a delay amount different from that of the first gates; and switches respectively connecting the intermediate nodes of the first gate line and those of the second gate line, one of the switches being closed to connect the first gate line and the second gate line together so that the input signal applied to the first gate line passes through a part of the first gate line, said one of the switches, and a part of the second gate line.

2. The variable delay circuit as claimed in claim 1, wherein:

the first gate line includes n first gates; and each of the second gates has the following delay amount:

$$[(n+1)/n]td$$

where td denotes the delay time of each of the first gates.

3. A variable delay circuit comprising:

a first gate line which has first gates cascaded via intermediate nodes and receives an input signal;

a second gate line which has second gates cascaded via intermediate nodes; and switches respectively connecting the intermediate nodes of the first gate line and those of the second gate line, one of the switches being closed to connect the first gate line and the second gate line together so that the input signal applied to the first gate line passes through a part of the first gate line, said one of the switches, and a part of the second gate line, the intermediate nodes of the first gate line having a wiring load different from that of the intermediate nodes of the second gate line such that the delay of said first gate line is different from that of said second gate line.

4. A variable delay circuit comprising:

a first gate line which has first gates cascaded via intermediate nodes and receives an input signal;

a second gate line which has second gates cascaded via intermediate nodes, the second gates having a delay amount different from that of the first gates;

switches respectively connecting the intermediate nodes of the first gate line and those of the second gate line; and a control circuit which turns ON one of the switches being closed to connect the first gate line and the second gate line together so that an output signal obtained by causing the input signal applied to the first gate line to pass through a part of the first gate line, said one of the switches, and a part of the second gate line and the input signal have a given phase difference.

5. The variable delay circuit as claimed in claim 4, wherein said control circuit comprises:
   a third gate line which has third gates cascaded and receives the input signal;
   a fourth gate line which has fourth gates cascaded and receives the output signal;
   phase comparators which are provided between the intermediate nodes of the third gate line and those of the fourth gate line and compare the phases of the respective signals at the intermediate nodes; and
   logic gates each receiving output signals of two adjacent phase comparators among the phase comparators,
   the switches being controlled by respective output signals of the logic gates.

6. The variable delay circuit as claimed in claim 5, wherein each of the phase comparators comprises:
   a first flip-flop connected to one of the intermediate nodes of the third gate line and one of the intermediate nodes of the fourth gate line;
   a second flip-flop which outputs the output signal of the phase comparator to the corresponding one of the logic gates; and
   a gate circuit which is provided between the first and second flip-flops and supplies output signals of the first flip-flop to the second flip-flop with a delay.

7. A variable delay circuit comprising:
   a first gate line which has first gates cascaded via intermediate nodes and receives an input signal;
   a second gate line which has second gates cascaded via intermediate nodes, the intermediate nodes of the first gate line having a wiring load different from that of the intermediate nodes of the second gate line such that the delay of said first gate line is different from that of said second gate line;
   switches respectively connecting the intermediate nodes of the first gate line and those of the second gate line; and
   a control circuit which turns ON one of the switches being closed to connect the first gate line and the second gate line together so that an output signal obtained by causing the input signal applied to the first gate line, said one of the switches, and a part of the second gate line and the input signal have a given phase difference.

8. The variable delay circuit as claimed in claim 7, wherein said control circuit comprises:
   a third gate line which has third gates cascaded and receives the input signal;
   a fourth gate line which has fourth gates cascaded and receives the output signal;
   phase comparators which are provided between the intermediate nodes of the third gate line and those of the fourth gate line and compare the phases of the respective signals with each other at the intermediate nodes; and
   logic gates each receiving output signals of two adjacent phase comparators among the phase comparators,
   the switching being controlled by respective output signals of the logic gates.

9. The variable delay circuit as claimed in claim 8, wherein each of the phase comparators comprises:
   a first flip-flop connected to one of the intermediate nodes of the third gate line and one of the intermediate nodes of the fourth gate line;
   a second flip-flop which outputs the output signal of the phase comparator to the corresponding one of the logic gates; and
   a gate circuit which is provided between the first and second flip-flops and supplies output signals of the first flip-flop to the second flip-flop with a delay.

* * * * *